(12) United States Patent
Asaoka et al.

(10) Patent No.: US 12,501,764 B2
(45) Date of Patent: Dec. 16, 2025

(54) METHOD OF MANUFACTURING DISPLAY DEVICE AND DISPLAY DEVICE

(71) Applicant: SHARP KABUSHIKI KAISHA, Sakai (JP)

(72) Inventors: Yasushi Asaoka, Sakai (JP); Jun Sakuma, Sakai (JP); Takahiro Adachi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 376 days.

(21) Appl. No.: 18/265,978

(22) PCT Filed: Dec. 22, 2020

(86) PCT No.: PCT/JP2020/047788
§ 371 (c)(1),
(2) Date: Jun. 8, 2023

(87) PCT Pub. No.: WO2022/137309
PCT Pub. Date: Jun. 30, 2022

(65) Prior Publication Data
US 2024/0032320 A1  Jan. 25, 2024

(51) Int. Cl.
*H10K 50/115*   (2023.01)
*H10K 59/12*    (2023.01)
*H10K 59/122*   (2023.01)
*H10K 71/20*    (2023.01)
*H10K 71/60*    (2023.01)

(52) U.S. Cl.
CPC ......... *H10K 50/115* (2023.02); *H10K 71/221* (2023.02); *H10K 71/60* (2023.02)

(58) Field of Classification Search
CPC .... H10K 50/115; H10K 71/221; H10K 71/60; H10K 59/122
See application file for complete search history.

(56) References Cited

U.S. PATENT DOCUMENTS

2018/0315806 A1  11/2018  Lee et al.
2018/0358584 A1  12/2018  Jeong et al.
(Continued)

FOREIGN PATENT DOCUMENTS

| CN | 106653807 A | 5/2017 |
| CN | 108807465 A | 11/2018 |
| JP | 4531324 B2 | 8/2010 |

*Primary Examiner* — Joseph L Williams
(74) *Attorney, Agent, or Firm* — ScienBiziP, P.C.

(57) ABSTRACT

A method of manufacturing a display device includes: a) forming a first pixel electrode and a second pixel electrode; b) forming a first light-emitting layer on the first pixel electrode; c) forming a photosensitive resin layer on the second pixel electrode and on the first light-emitting layer; d) forming a photosensitive resin pattern having an opening on the second pixel electrode and including a structural member e) forming a light-emitting material layer on the photosensitive resin pattern and on an opening bottom portion that is at least a part of the second pixel electrode and that is provided below the opening; and f) forming a second light-emitting layer on the second pixel electrode by lifting off a first lift-off portion that is a part of the photosensitive resin pattern and a second lift-off portion that is a part of the light-emitting material layer, with the structural member being left intact.

20 Claims, 49 Drawing Sheets

(56) References Cited

U.S. PATENT DOCUMENTS

| | | | |
|---|---|---|---|
| 2022/0123271 A1* | 4/2022 | Kubo | H05B 33/10 |
| 2022/0149338 A1* | 5/2022 | Kubo | H05B 33/14 |
| 2023/0122669 A1* | 4/2023 | Akimoto | H10H 20/856 |
| | | | 257/89 |

* cited by examiner

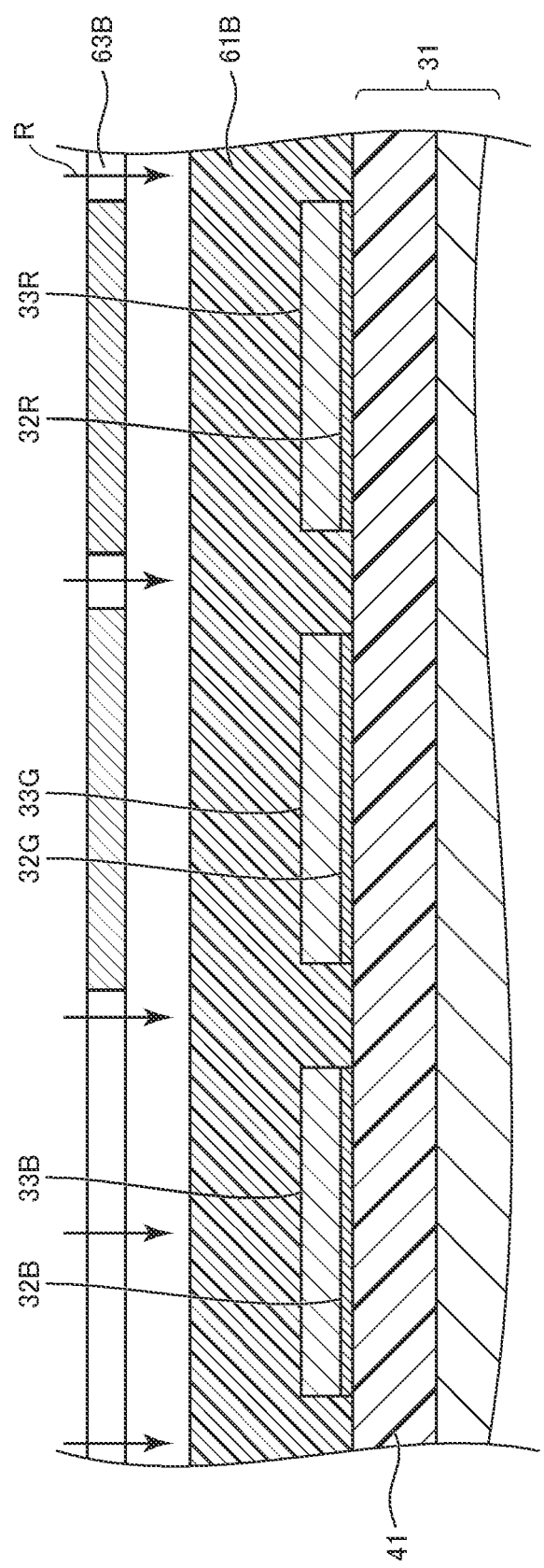

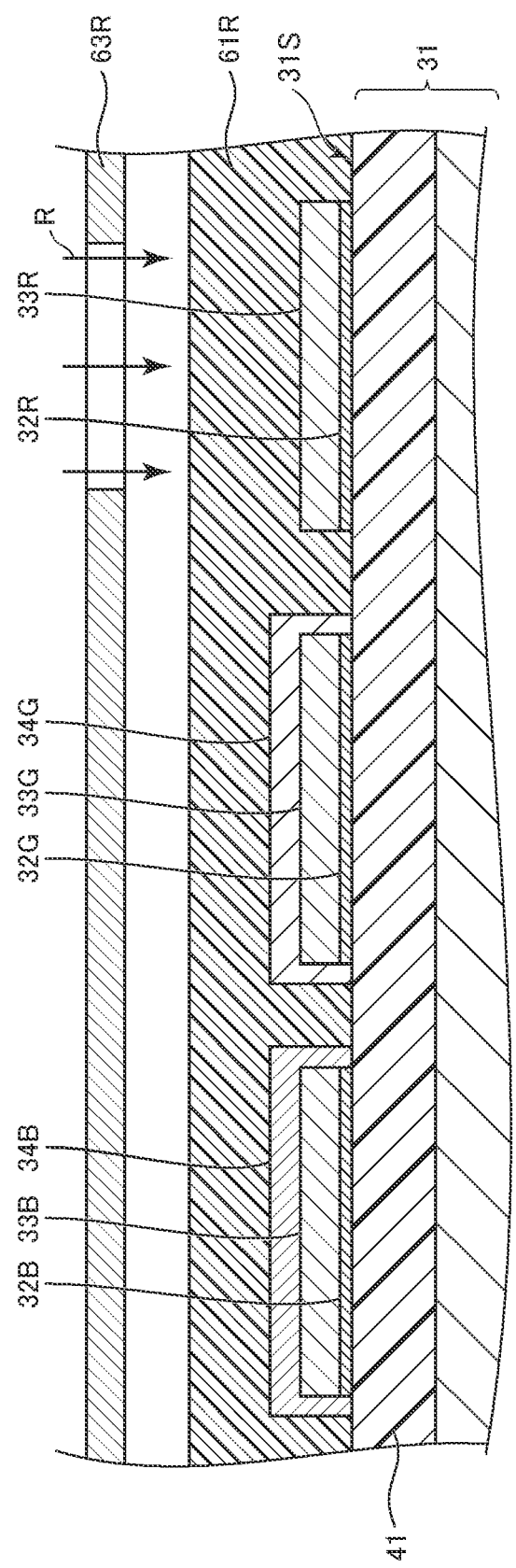

METHOD OF MANUFACTURING DISPLAY DEVICE AND DISPLAY DEVICE

TECHNICAL FIELD

The present disclosure relates to methods of manufacturing display devices and also to display devices.

BACKGROUND ART

Patent Literature 1 describes technology related to a method of manufacturing an organic EL element (paragraph 0028). In the manufacture of the organic EL element, a stack of a first electrode layer, a light-emitting layer, and a second electrode layer is formed (paragraphs 0029 to 0033). In addition, an insulating layer is formed by injection between stacks (paragraph 0033). The insulating layer covers the perimeter of the light-emitting layer (FIG. 1 of Patent Literature 1).

Citation List

PATENT LITERATURE

Patent Literature 1: Japanese Patent No. 4531324 Summary of Invention

SUMMARY

Technical Problem

The technology described in Patent Literature 1 requires a step of forming the insulating layer separately from a step of forming the first electrode layer, the light-emitting layer, and the second electrode layer, which increases the number of steps needed in the method of manufacturing an organic EL element.

The same problem occurs with display devices other than organic EL elements.

The present disclosure has been made in view of the problem. The present disclosure has an object to reduce the number of steps in a method of manufacturing a display device that includes a structural member including a pixel boundary segment and/or an edge cover segment.

Solution to Problem

The present disclosure, in an aspect thereof, is directed to a method of manufacturing a display device, the method including: a) a step of forming a first pixel electrode and a second pixel electrode; b) a step of forming a first light-emitting layer on the first pixel electrode; c) a step of forming a photosensitive resin layer on the second pixel electrode and on the first light-emitting layer; d) a step of forming a photosensitive resin pattern by patterning the photosensitive resin layer, the photosensitive resin pattern having an opening on the second pixel electrode and including a structural member portion that is to be a structural member including either one or both of an edge cover segment on a perimeter of the first light-emitting layer and a pixel boundary segment between the first pixel electrode and the second pixel electrode; e) a step of forming a light-emitting material layer on the photosensitive resin pattern and on an opening bottom portion that is at least a part of the second pixel electrode and that is provided below the opening; and f) a step of forming a second light-emitting layer on the second pixel electrode from the light-emitting material layer by dissolving, in a detaching solution, a first lift-off portion that is a part of the photosensitive resin pattern and that is provided on the first light-emitting layer, and lifting off a second lift-off portion that is a part of the light-emitting material layer and that is provided on the first lift-off portion, with the structural member being left intact.

The present disclosure, in an aspect thereof, is directed to a display device including: a substrate having a main face; a first pixel electrode on the main face; a second pixel electrode adjacent to the first pixel electrode on the main face; a first light-emitting layer on an opposite side of the first pixel electrode from a side on which the main face is disposed; a second light-emitting layer on an opposite side of the second pixel electrode from a side on which the main face is disposed; and a structural member provided across on a perimeter of the first light-emitting layer and outside the perimeter of the first light-emitting layer, the structural member including a first edge cover segment on a side of a perimeter of the second light-emitting layer on which the main face is disposed.

BRIEF DESCRIPTION OF DRAWINGS

FIG. 20A is a schematic cross-sectional view of an intermediate article for the display device in accordance with Embodiment 4.

FIG. 25A is a schematic cross-sectional view of an intermediate article for the display device in accordance with Embodiment 5.

DESCRIPTION OF EMBODIMENTS

Figure 1:
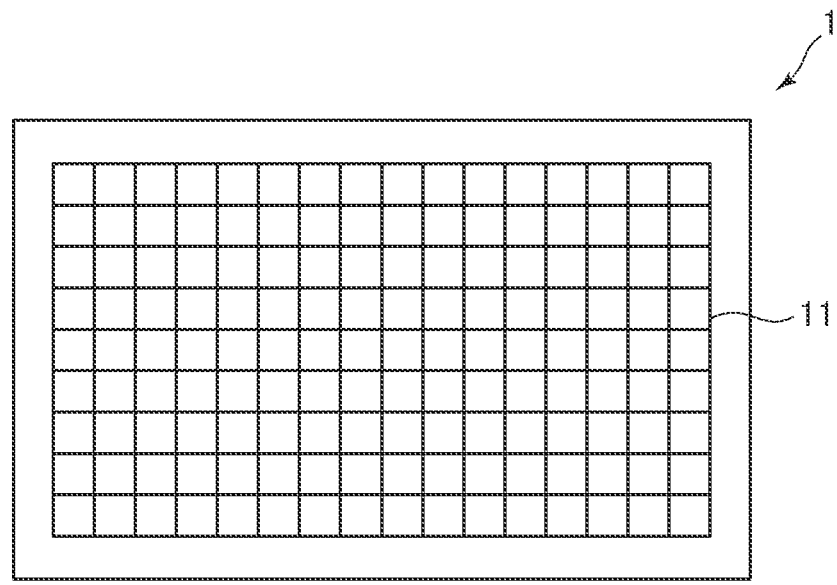
FIG. 1 is a schematic plan view of a display device in accordance with Embodiment 1.

The following will describe embodiments of the present disclosure with reference to drawings. Note that identical and equivalent elements in the drawings are denoted by the same reference numerals, and description thereof is not repeated.

1 Embodiment 1

1.1 Plan-View Structure of Display Device

FIG. 1 is a schematic plan view of a display device 1 in accordance with Embodiment 1.

The display device 1 may be, for example, an organic light-emitting diode (OLED) display device or a quantum-dot light-emitting diode (QLED) display device. The following description assumes that the display device 1 is a QLED display device.

Referring to FIG. 1, the display device 1 includes a plurality of pixels 11.

The plurality of pixels 11 are arranged in a matrix. The plurality of pixels 11 may be arranged in a non-matrix pattern.

1.2 Plan-View Structure of Pixel

Figure 2:
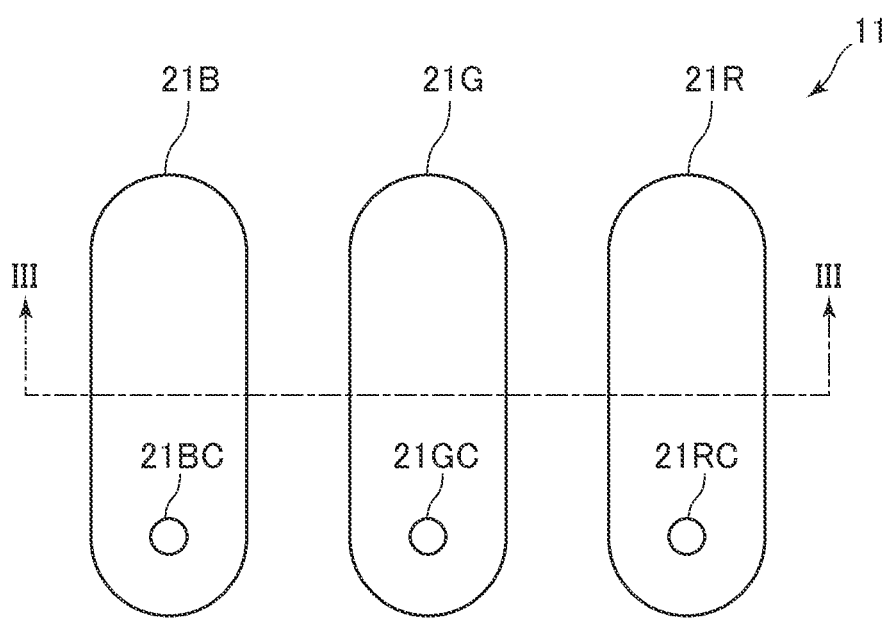
FIG. 2 is a schematic plan view of each pixel in the display device in accordance with Embodiment 1.

FIG. 2 is a schematic plan view of each pixel 11 in the display device 1 in accordance with Embodiment 1.

Referring to FIG. 2, each pixel 11 includes subpixels 21B, 21G, and 21R.

The subpixels 21B, 21G, and 21R are arranged along a straight line. The subpixels 21B, 21G, and 21R may be arranged along a non-straight line. The subpixels 21B and 21G in each pixel 11 are disposed adjacent to each other. The subpixels 21G and 21R in each pixel 11 are disposed adjacent to each other. The subpixel 21R in each pixel 11 and the subpixel 21B in the pixel 11 adjacent to that pixel 11 on a side thereof are disposed adjacent to each other. The subpixels 21B, 21G, and 21R in each pixel 11 have light-emission areas that may be either equal to each other or different from each other. The subpixels 21B, 21G, and 21R in each pixel 11 have light-emission regions that may have either the same shape or different shapes from each other.

The subpixels 21B, 21G, and 21R emit blue, green, and red light respectively. The subpixels 21B, 21G, and 21R may emit light of respective colors other than blue, green, and red. Each pixel 11 may include a plurality of subpixels that emit light of the same color.

The subpixels 21B, 21G, and 21R are provided respectively with contact holes 21BC, 21GC, and 21RC.

1.3 Cross-Sectional Structure of Pixel

Figure 3:
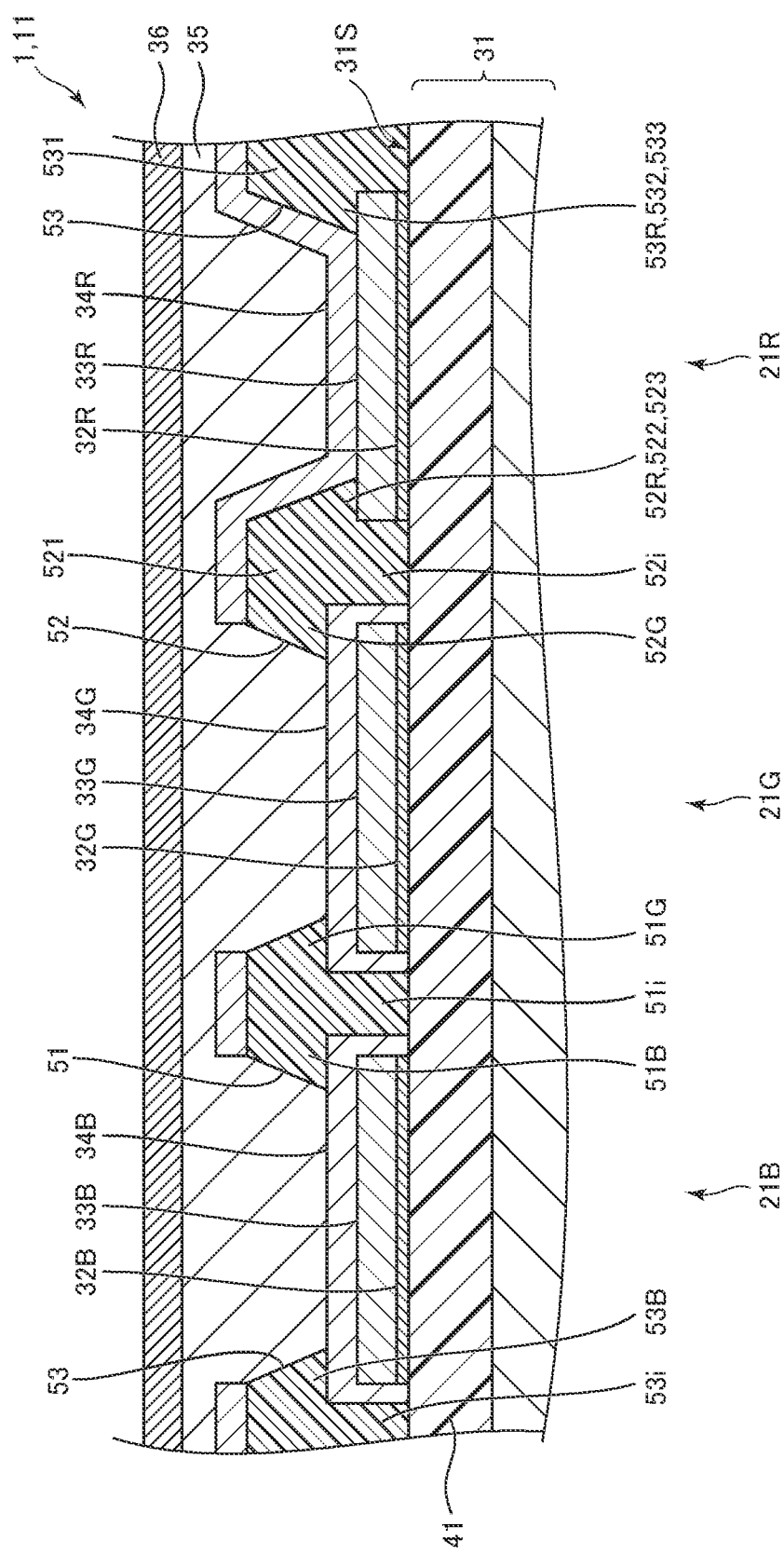
FIG. 3 is a schematic cross-sectional view of each pixel in the display device in accordance with Embodiment 1.

FIG. 3 is a schematic cross-sectional view of each pixel 11 in the display device 1 in accordance with Embodiment 1. FIG. 3 shows a cross-section taken along line indicated in FIG. 2.

Referring to FIG. 3, the display device 1 includes a substrate 31, pixel electrodes 32B, 32G, and 32R, charge transport layers 33B, 33G, and 33R, light-emitting layers 34B, 34G, and 34R, a charge transport layer 35, and a common electrode 36.

The pixel electrode 32B, the charge transport layer 33B, and the light-emitting layer 34B are disposed in the subpixel 21B. The pixel electrode 32G, the charge transport layer 33G, and the light-emitting layer 34G are disposed in the subpixel 21G. The pixel electrode 32R, the charge transport layer 33R, and the light-emitting layer 34R are disposed in the subpixel 21R. The charge transport layer 35 and the common electrode 36 are disposed across the subpixels 21B, 21G, and 21R.

The pixel electrodes 32B, 32G, and 32R, the charge transport layers 33B, 33G, and 33R, the light-emitting layers 34B, 34G, and 34R, the charge transport layer 35, and the common electrode 36 are disposed on a main face 31S of the substrate 31. The substrate 31 includes an interlayer insulating film 41. The pixel electrodes 32B, 32G, and 32R, the charge transport layers 33B, 33G, and 33R, the light-emitting layers 34B, 34G, and 34R, the charge transport layer 35, and the common electrode 36 are disposed on the interlayer insulating film 41. The interlayer insulating film 41 segregates those elements disposed on the interlayer insulating film 41 from those elements disposed below the interlayer insulating film 41. Accordingly, the interlayer insulating film 41 electrically insulates those elements disposed on the interlayer insulating film 41 from those elements disposed below the interlayer insulating film 41. The elements disposed below the interlayer insulating film 41 include, for example, wiring and switching elements. The switching elements are, for example, thin film transistors (TFTs).

The pixel electrodes 32B, 32G, and 32R are electrically connected to the above-described switching elements via connecting conductor disposed inside the contact holes 21BC, 21GC, and 21RC.

The charge transport layers 33B, 33G, and 33R are disposed respectively on the pixel electrodes 32B, 32G, and 32R. The light-emitting layers 34B, 34G, and 34R are disposed respectively on the charge transport layers 33B, 33G, and 33R. Therefore, the light-emitting layers 34B, 34G, and 34R are disposed respectively on the opposite sides of the pixel electrodes 32B, 32G, and 32R from a side thereof on which the main face 31S of the substrate 31 is disposed. The charge transport layer 35 is disposed on the light-emitting layers 34B, 34G, and 34R. The common electrode 36 is disposed on the charge transport layer 35.

The pixel electrodes 32B and 32G in each pixel 11 are disposed adjacent to each other. The pixel electrodes 32G and 32R in each pixel 11 are disposed adjacent to each other. The pixel electrode 32R in each pixel 11 and the pixel electrode 32B in the pixel 11 adjacent to that pixel 11 on a side thereof are disposed adjacent to each other.

The display device 1 may include a charge injection layer between the pixel electrode 32B and the charge transport layer 33B, may include a charge injection layer between the pixel electrode 32G and the charge transport layer 33G, and may include a charge injection layer between the pixel electrode 32B and the charge transport layer 33R. The display device 1 may include a charge blocking layer between the charge transport layer 33B and the light-emitting layer 34B, may include a charge blocking layer between the charge transport layer 33G and the light-emitting layer 34G, and may include a charge blocking layer between the charge transport layer 33R and the light-emitting layer 34R. The display device 1 may include a charge blocking layer between the light-emitting layer 34B and the charge transport layer 35, may include a charge blocking layer between the light-emitting layer 34G and the charge transport layer 35, and may include a charge blocking layer between the light-emitting layer 34R and the charge transport layer 35. The display device 1 may include a charge injection layer between the charge transport layer 35 and the common electrode 36.

1.4 Emission of Light by Subpixel

The pixel electrodes 32B, 32G, and 32R are in contact respectively with the light-emitting layers 34B, 34G, and 34R via the charge transport layers 33B, 33G, and 33R. The charge transport layers 33B, 33G, and 33R transport first electric charges. For these reasons, the first electric charges can be injected from the pixel electrodes 32B, 32G, and 32R to the light-emitting layers 34B, 34G, and 34R via the charge transport layers 33B, 33G, and 33R respectively.

The common electrode 36 are in contact with the light-emitting layers 34B, 34G, and 34R via the charge transport layer 35. The charge transport layer 35 transports second electric charges. For these reasons, the second electric charges can be injected from the common electrode 36 to the light-emitting layers 34B, 34G, and 34R via the charge transport layer 35.

When there is an electrical potential difference between the pixel electrode 32B and the common electrode 36, the first electric charges are injected from the pixel electrode 32B to the light-emitting layer 34B via the charge transport layer 33B. In addition, the second electric charges are injected from the common electrode 36 to the light-emitting layer 34B via the charge transport layer 35. As a result, the first electric charges and the second electric charges recombine in the light-emitting layer 34B so that the light-emitting layer 34B emits blue light.

When there is an electrical potential difference between the pixel electrode 32G and the common electrode 36, the first electric charges are injected from the pixel electrode 32G to the light-emitting layer 34G via the charge transport layer 33G. In addition, the second electric charges are injected from the common electrode 36 to the light-emitting layer 34G via the charge transport layer 35. As a result, the first electric charges and the second electric charges recombine in the light-emitting layer 34G so that the light-emitting layer 34G emits green light.

When there is an electrical potential difference between the pixel electrode 32R and the common electrode 36, the first electric charges are injected from the pixel electrode 32R to the light-emitting layer 34R via the charge transport layer 33R. In addition, the second electric charges are injected from the common electrode 36 to the light-emitting layer 34R via the charge transport layer 35. As a result, the first electric charges and the second electric charges recombine in the light-emitting layer 34R so that the light-emitting layer 34R emits red light.

1.5 Inverted Structure and Conventional Structure

The display device 1 has an inverted structure or a conventional structure.

When the display device 1 has an inverted structure, the first electric charges are electrons. In addition, the second electric charges are holes. In addition, the pixel electrodes 32B, 32G, and 32R are cathodes. In addition, the common electrode 36 is an anode. In addition, the charge transport layers 33B, 33G, and 33R are electron transport layers. In addition, the charge transport layer 35 is a hole transport layer.

When the display device 1 has a conventional structure, the first electric charges are holes. In addition, the second electric charges are electrons. In addition, the pixel electrodes 32B, 32G, and 32R are anodes. In addition, the common electrode 36 is a cathode. In addition, the charge transport layers 33B, 33G, and 33R are hole transport layers. In addition, the charge transport layer 35 is an electron transport layer.

Throughout the following description, the pixel electrodes 32B and 32G may be referred to as the first pixel electrodes. In addition, the pixel electrode 32R may be referred to as the second pixel electrode. In addition, the charge transport layers 33B, 33G, and 33R may be referred to as the second charge transport layers. In addition, the light-emitting layers, such as the light-emitting layers 34B and 34, other than those light-emitting layers which are formed last may be referred to as the first light-emitting layers. In addition, the light-emitting layers, such as the light-emitting layer 34R, that are formed last may be referred to as the second light-emitting layers. In addition, the charge transport layer 35 may be referred to as the first charge transport layer. In addition, the common electrode 36 may be referred to as the opposite electrode.

1.6 Structural Member

Referring to FIG. 3, each pixel 11 includes structural members 51, 52, and 53 that function as banks and edge covers.

The structural member 51 is provided across: on the perimeters of the first pixel electrode 32B and the first light-emitting layer 34B; between a combination of the first pixel electrode 32B and the first light-emitting layer 34B and a combination of the first pixel electrode 32G and the first light-emitting layer 34G; and on the perimeters of the first pixel electrode 32G and the first light-emitting layer 34G. Therefore, the structural member 51 includes: an edge cover segment 51B on the perimeters of the first pixel electrode 32B and the first light-emitting layer 34B; a pixel boundary segment 51*i* between a combination of the first pixel electrode 32B and the first light-emitting layer 34B and a combination of the first pixel electrode 32G and the first light-emitting layer 34G; and an edge cover segment 51G on the perimeters of the first pixel electrode 32G and the first light-emitting layer 34G. Hence, the perimeter of the first light-emitting layer 34B is covered with the edge cover segment 51B and an edge cover segment 53B. In addition, the perimeter of the first light-emitting layer 34G is covered with the edge cover segments 51G and 52G. Therefore, the perimeters of the first light-emitting layers 34B and 34G become less likely to detach, for example, due to the flow of a charge transport layer solution in the spin-coating formation of the charge transport layer 35 and/or due to the detachment for the sake of the formation of the second light-emitting layer 34R. Hence, the subpixels 21B and 21G can uniformly emit light. In addition, the first light-emitting layers 34B and 34G have a thickness that is uniform all the way to the perimeters of the first light-emitting layers 34B and 34G. Hence, the subpixels 21B and 21G can uniformly emit light. For these reasons, the subpixels 21B and 21G can have increased light-emission areas.

The structural member 51 may include only the edge cover segments 51B and 51G and may include only the pixel boundary segment 51*i*.

The structural member 52 is provided across: on the perimeters of the first pixel electrode 32G and the first light-emitting layer 34G; between a combination of the first pixel electrode 32G and the first light-emitting layer 34G and a combination of the second pixel electrode 32R and the charge transport layer 33R; and on the perimeters of the second pixel electrode 32R and the charge transport layer 33R. Therefore, the structural member 52 includes: the edge cover segment 52G on the perimeters of the first pixel electrode 32G and the first light-emitting layer 34G; a pixel boundary segment 52i between a combination of the first pixel electrode 32G and the first light-emitting layer 34G and a combination of the second pixel electrode 32R and the charge transport layer 33R; and an edge cover segment 52R on the perimeters of the second pixel electrode 32R and the charge transport layer 33R. Hence, the perimeter of the first light-emitting layer 34G is covered with the edge cover segment 52G. Therefore, the perimeter of the first light-emitting layer 34G becomes less likely to detach, for example, due to the flow of a charge transport layer solution in the spin-coating formation of the charge transport layer 35 and/or due to the detachment for the sake of the formation of the second light-emitting layer 34R. Hence, the subpixel 21G can uniformly emit light. In addition, the first light-emitting layer 34G has a thickness that is uniform all the way to the perimeter of the first light-emitting layer 34G. Hence, the subpixel 21G can uniformly emit light. For these reasons, the subpixel 21G can have an increased light-emission area.

The structural member 52 may include only the edge cover segments 52G and 52R and may include only the pixel boundary segment 52i.

The second light-emitting layer 34R has a perimeter that extends onto the structural members 52 and 53. The structural member 52 is provided across on the perimeter of the first light-emitting layer 34G and outside the perimeter of the first light-emitting layer 34G and extends to below the perimeter of the second light-emitting layer 34R. Therefore, the structural member 52 includes a first edge cover segment 521 below the perimeter of the second light-emitting layer 34R, in other words, on a side of the perimeter of the second light-emitting layer 34R where the main face 31S of the substrate 31 is disposed. In other words, the first edge cover segment 521 is a region sandwiched between the second light-emitting layer 34R and the substrate 31 both of the structural member 52.

The perimeter of the second pixel electrode 32R and the perimeter of the charge transport layer 33R are disposed in the same location in a plan view. Therefore, the edge cover segment 52R provides a second edge cover segment 522 on the perimeter of the second pixel electrode 32R and a third edge cover segment 523 on the perimeter of the charge transport layer 33R.

The structural member 53 is provided across: on the perimeters of the first pixel electrode 32B and the first light-emitting layer 34B; between a combination of the first pixel electrode 32B and the first light-emitting layer 34B and a combination of the second pixel electrode 32R and the charge transport layer 33R; and on the perimeters of the second pixel electrode 32R and the charge transport layer 33R. Therefore, the structural member 53 includes: the edge cover segment 53B on the perimeters of the first pixel electrode 32B and the first light-emitting layer 34B; a pixel boundary segment 53i between a combination of the first pixel electrode 32B and the first light-emitting layer 34B and a combination of the second pixel electrode 32R and the charge transport layer 33R; and an edge cover segment 53R on the perimeters of the second pixel electrode 32R and the charge transport layer 33R. Hence, the perimeter of the first light-emitting layer 34B is covered with the edge cover segment 51B. Therefore, the perimeter of the first light-emitting layer 34B becomes less likely to detach, for example, due to the flow of a charge transport layer solution in the spin-coating formation of the charge transport layer 35 and/or due to the detachment for the sake of the formation of the second light-emitting layer 34R. Hence, the subpixel 21B can uniformly emit light. In addition, the first light-emitting layer 34B has a thickness that is uniform all the way to the perimeter of the first light-emitting layer 34B. Hence, the subpixel 21B can uniformly emit light. For these reasons, the subpixel 21B can have an increased light-emission area.

The structural member 53 may include only the edge cover segments 53B and 53R and may include only the pixel boundary segment 53i.

The structural member 53 is provided across on the perimeter of the first light-emitting layer 34B and outside the perimeter of the first light-emitting layer 34B and extends to below the perimeter of the second light-emitting layer 34R. Therefore, the structural member 53 includes a first edge cover segment 531 below the perimeter of the second light-emitting layer 34R, in other words, on a side of the perimeter of the second light-emitting layer 34R where the main face 31S of the substrate 31 is disposed.

The perimeter of the second pixel electrode 32R and the perimeter of the charge transport layer 33R are disposed in the same location in a plan view. Therefore, the edge cover segment 53R provides a second edge cover segment 532 on the perimeter of the second pixel electrode 32R and a third edge cover segment 533 on the perimeter of the charge transport layer 33R.

The perimeter of the first light-emitting layer 34B is disposed below the structural members 51 and 53. The perimeter of the first light-emitting layer 34G is disposed below the structural members 51 and 52. In contrast, the perimeter of the second light-emitting layer 34R is disposed on the structural members 52 and 53.

The perimeter of the first light-emitting layer 34B is disposed between the structural member 51 or 53 and the interlayer insulating film 41. The perimeter of the first light-emitting layer 34G is disposed between the structural member 51 or 52 and the interlayer insulating film 41.

In addition, in the above-described display device 1, the perimeter of the first light-emitting layer 34B is covered with the edge cover segment 51B, the perimeter of the first light-emitting layer 34G is covered with the edge cover segment 51G, and the pixel boundary segment 51i is disposed between the first light-emitting layer 34B and the first light-emitting layer 34G. Therefore, leak current can be restrained from flowing between the subpixel 21B and the subpixel 21G. In addition, the perimeter of the first light-emitting layer 34G is covered with the edge cover segment 52G, and the pixel boundary segment 52i is disposed between the first light-emitting layer 34G and the second light-emitting layer 34R. Therefore, leak current can be restrained from flowing between the subpixel 21G and the subpixel 21R. In addition, the perimeter of the first light-emitting layer 34B is covered with the edge cover segment 53B, and the pixel boundary segment 53i is disposed between the first light-emitting layer 34B and the second light-emitting layer 34R. Therefore, leak current can be restrained from flowing between the subpixel 21B and the subpixel 21R. In addition, in the above-described display device 1, the structural members 51, 52, and 53 are formed between the common electrode 36 and the perimeters of the first pixel electrode 32B, the first pixel electrode 32G, and the second pixel electrode 32R. Therefore, current concentration can be restrained in these perimeters, which enables uniform emission of light in the subpixels 21B, 21G, and 21R. In addition, in a cross-sectional view of the display device 1, the structural members 51, 52, and 53 are separated from each other as shown in FIG. 3. In a plan view of the display device 1, the structural members 51, 52, and 53 may be continuous and connected with each other. When the structural members 51, 52, and 53 are continuous, the structural members 51, 52, and 53 can be restrained from detaching. In a plan view of the display device 1, the structural members 51, 52, and 53 may have such a shape as to appear like stripes. When this is the case, the aperture ratio can be increased.

1.7 Layer Materials

The pixel electrodes 32B, 32G, and 32R and the common electrode 36 are made of a conductive material. Conductive materials include, for example, at least one species selected from the group consisting of metals and transparent conductive oxides. The metals include, for example, at least one species selected from the group consisting of Al, Cu, Au, and Ag. The transparent conductive oxides include, for example, at least one species selected from the group consisting of indium tin oxide (ITO), indium zinc oxide (IZO), zinc oxide (ZnO), aluminum zinc oxide (AZO), and boron zinc oxide (BZO). The pixel electrodes 32B, 32G, and 32R and the common electrode 36 may be a single layer made of a single conductive material and may be a stack of two or more layers made of two or more different conductive materials. The two or more layers may include both a layer made of a metal and a layer made of a transparent conductive oxide.

The electron transport layer is made of an electron transporting material. The electron transporting material includes, for example, at least one species selected from the group consisting of zinc oxide, magnesium zinc oxide, titanium oxide, and strontium titanium oxide. The zinc oxide is, for example, ZnO. The titanium oxide is, for example, $TiO_2$. The strontium titanium oxide is, for example, $SrTiO_3$. The electron transporting material may be made of a single substance and may be made of a mixture of two or more substances.

The hole transport layer is made of a hole transport material. The hole transport material includes, for example, at least one species selected from the group consisting of hole-transport inorganic materials and hole-transport organic materials. The hole-transport inorganic material includes, for example, at least one species selected from the group consisting of oxides, nitrides, and carbides of metals. The metals include at least one species selected from the group consisting of Zn, Cr, Ni, Ti, Nb, Al, Si, Mg, Ta, Hf, Zr, Y, La, Sr, and Mo. The hole-transport organic materials include at least one species selected from the group consisting of 4,4',4"-tris(9-carbazoyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbasol-9-yl)biphenyl (CBP), 2,3,6,7,10,11-hexacyano-1,4,5,8,9,12-hexaazatriphenyl ene (HATCN), poly(N-vinylcarbazole) (PVK), poly(2,7-(9,9-di-n-octylfluorene)-(1,4-phenylene-((4-sec-butylphenyl)imino)-1,4-phenylene (TFB), poly(triphenylamine) derivative (Poly-TPD), and poly (3,4-ethylenedioxythiophene)/poly(-styrenesulfonate) (PEDOT-PSS). The hole transport material may be made of a single substance and may be made of a mixture of two or more substances.

The light-emitting layer 34B is made of a blue light-emitting material. The light-emitting layer 34G is made of a green light-emitting material. The light-emitting layer 34R is made of a red light-emitting material. The blue light-emitting material, the green light-emitting material, and the red light-emitting material include quantum dots. These quantum dots are, for example, semiconductor fine particles with a particle diameter of 100 nm or smaller. The semiconductor fine particles contain, for example, at least one species selected from the group consisting of Group II-VI compounds, Group III-V compounds, Group IV compounds, and compounds with a perovskite structure. The Group II-VI compounds include, for example, at least one species selected from the group consisting of MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. The Group III-V compounds include, for example, at least one species selected from the group consisting of GaAs, GaP, InN, InAs, InP, and InSb. The Group IV compounds include, for example, at least one species selected from the group consisting of Si and Ge. When the semiconductor fine particles contain a compound with a perovskite structure, the compound with a perovskite structure is, for example, a hybrid halide perovskite. The hybrid halide perovskites include, for example, at least one species selected from the group consisting of Cl, Br, and I. The semiconductor fine particles may be made of a crystal and may have a core/shell structure including: a core made of a crystal and a shell made of a shell material with a wide band gap and overcoating this core.

1.8 Manufacturing Display Device

Figure 4:
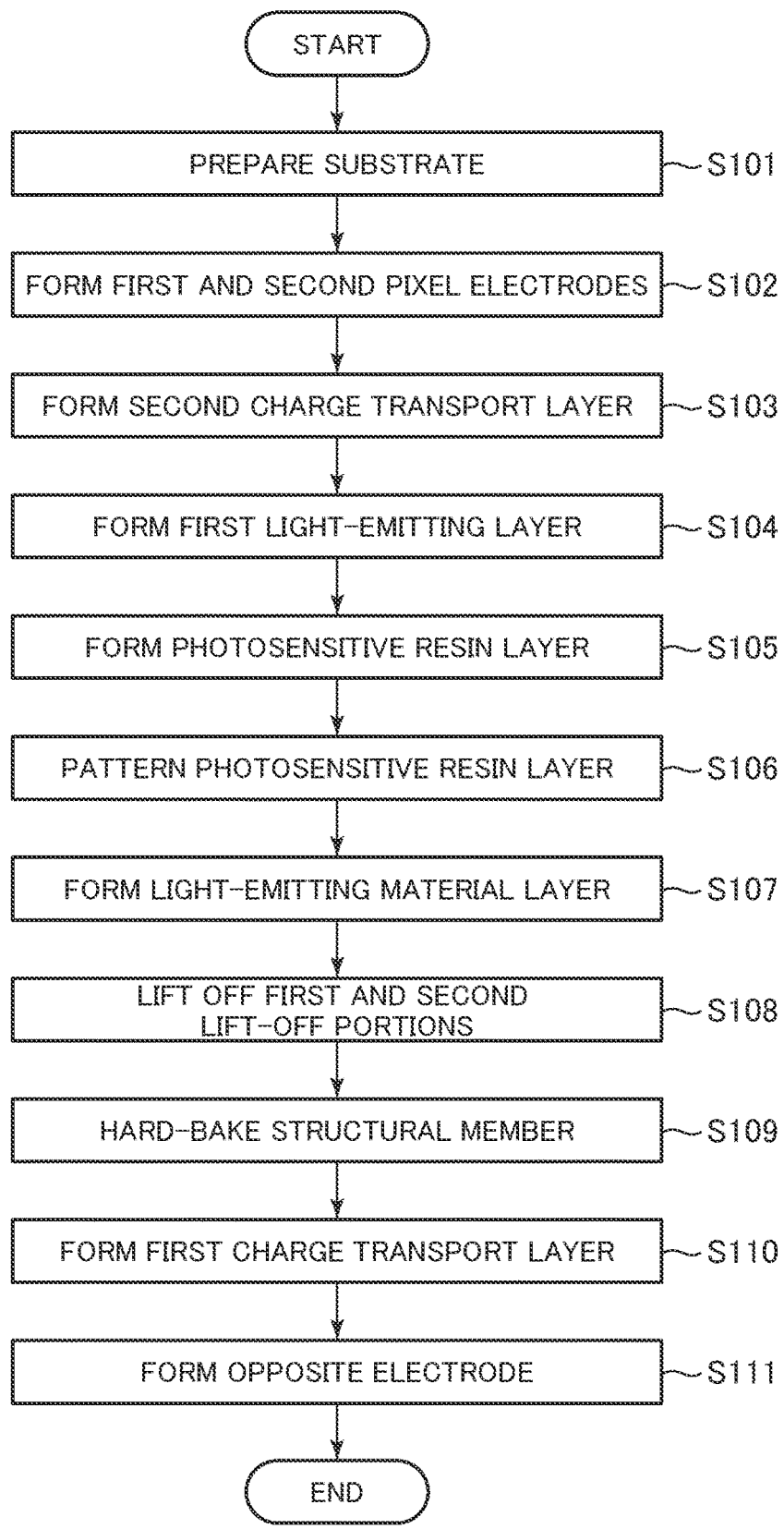
FIG. 4 is a flow chart representing a flow of the manufacture of the display device in accordance with Embodiments 1, 4, and 5.

FIG. 4 is a flow chart representing a flow of the manufacture of the display device 1 in accordance with Embodiment 1. FIGS. 5A to 5D are schematic cross-sectional views of an intermediate article for the display device 1 in accordance with Embodiment 1.

A method of manufacturing the display device 1 includes steps S101 to S111 as shown in FIG. 4.

Figure 5A:
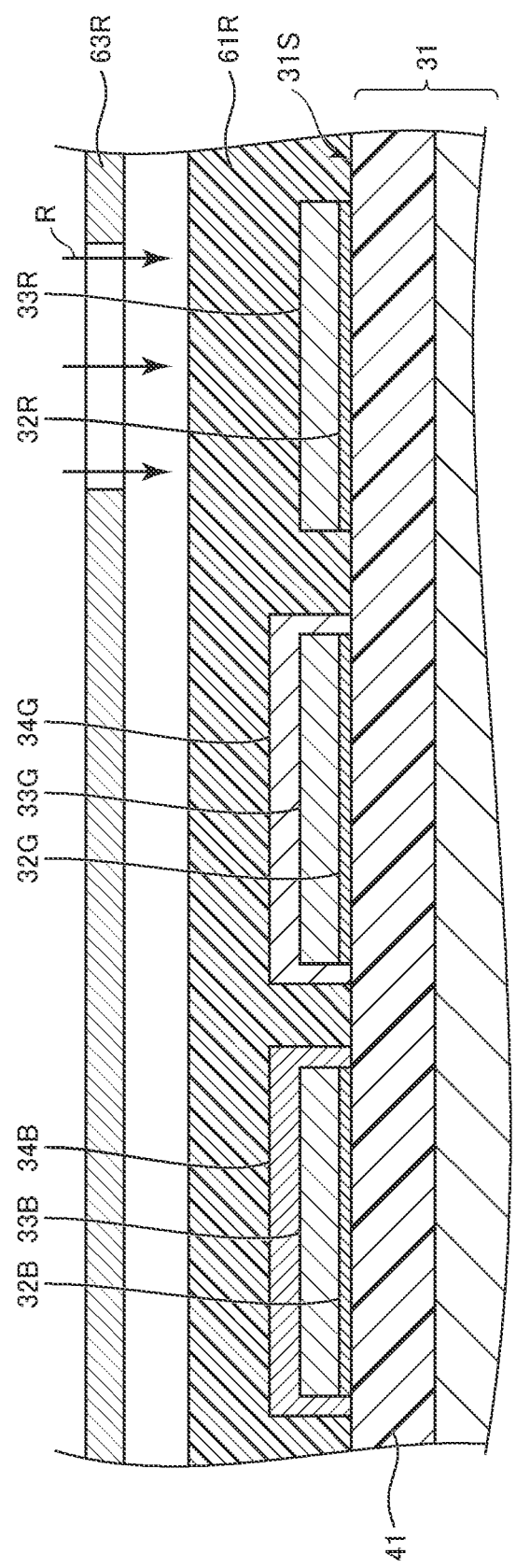
FIG. 5A is a schematic cross-sectional view of an intermediate article for the display device in accordance with Embodiment 1.

In step S101, the substrate 31 shown in FIG. 5A is prepared.

In subsequent step S102, the first pixel electrodes 32B and 32G and the second pixel electrode 32R shown in FIG. 5A are formed on the main face 31S of the substrate 31. The first pixel electrodes 32B and 32G and the second pixel electrode 32R are formed by forming a conductive material layer on the main face 31S of the substrate 31 by, for example, sputtering, vapor deposition, or coating and then patterning the formed conductive material layer by, for example, etching.

In subsequent step S103, the second charge transport layers 33B, 33G, and 33R shown in FIG. 5A are formed respectively on the first pixel electrode 32B, the first pixel electrode 32G, and the second pixel electrode 32R. The second charge transport layers 33B, 33G, and 33R are formed by, for example, sputtering, vapor deposition, or coating. The second charge transport layers 33B, 33G, and 33R are formed so as to have the same shape in a plan view respectively as the first pixel electrode 32B, the first pixel electrode 32G, and the second pixel electrode 32R in a plan view.

In subsequent step S104, the first light-emitting layers 34B and 34G shown in FIG. 5A is formed respectively on the first pixel electrodes 32B and 32G. The first light-emitting layers 34B and 34G are formed so as to respectively cover the entire, first pixel electrodes 32B and 32G. Hence, the entire regions where the first pixel electrodes 32B and 32G are formed can emit light. The first light-emitting layers 34B and 34G are formed by a lift-off process. The formation of the first light-emitting layers 34B and 34G by a lift-off process will be described in detail later.

In subsequent step S105, a photosensitive resin layer 61R shown in FIG. 5A is formed on the first pixel electrodes 32B and 32G, the second pixel electrode 32R, the second charge transport layers 33B, 33G, and 33R, and the first light-emitting layers 34B and 34G. The photosensitive resin layer 61R contains a positive photosensitive resin. The positive photosensitive resin is a photosensitive resin the solubility of which to a development solution increases when irradiated with exposure light. The exposure light is, for example, an electromagnetic wave or an electron beam. The electromagnetic wave is, for example, ultraviolet light. The development solution is, for example, an alkaline solution. The development solution may contain a surfactant. The positive photosensitive resin is, for example, JAS100 made by JSR Corporation. It should be noted however that the positive photosensitive resin is a resin that does not dissolve in the light-emitting material solution described below. The photosensitive resin layer 61R is formed by, for example, coating. When the photosensitive resin layer 61R is formed by coating, the photosensitive resin layer 61R is formed using, for example, a die coater, an inkjet coater, or a spin coater.

Figure 5B:
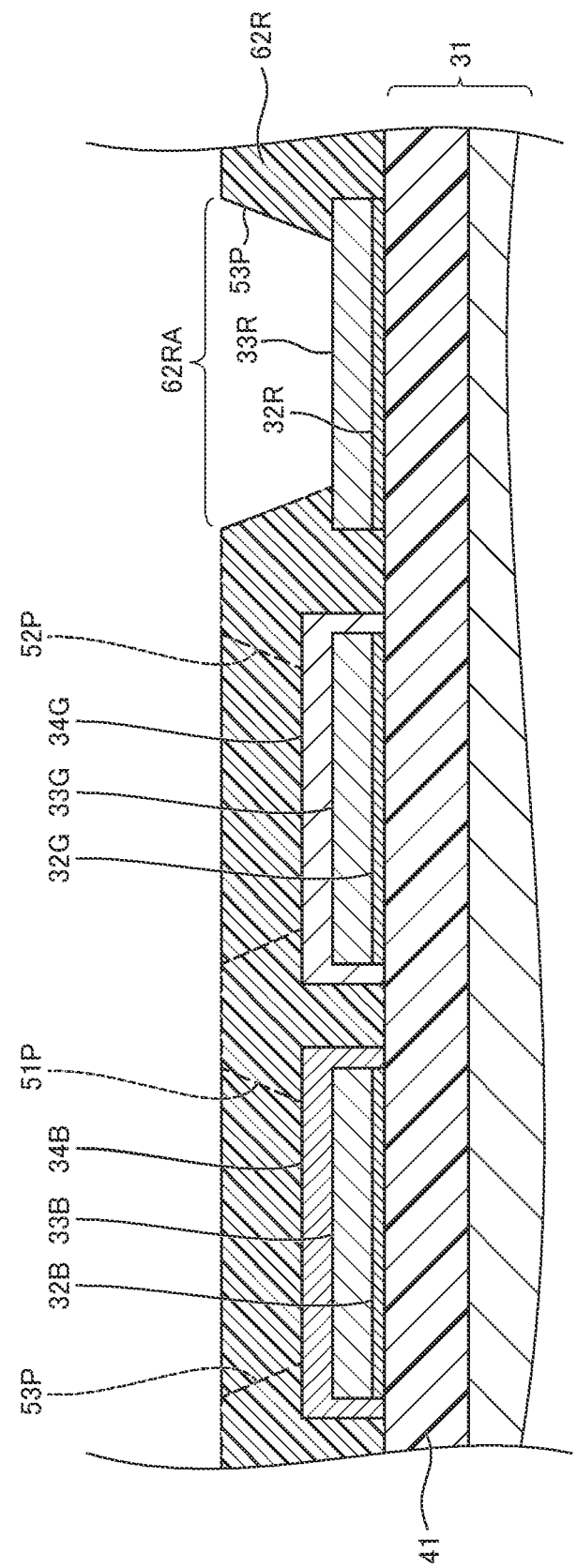
FIG. 5B is a schematic cross-sectional view of an intermediate article for the display device in accordance with Embodiment 1.

In subsequent step S106, the photosensitive resin layer 61R is patterned by development to form a photosensitive resin pattern 62R shown in FIG. 5B. The photosensitive resin pattern 62R includes structural member portions 51P, 52P, and 53P. The structural member portions 51P, 52P and 53P will respectively provide structural members 51Q, 52Q, and 53Q (described later) and eventually respectively provide the structural members 51, 52, and 53. Openings 62RA are formed in the photosensitive resin pattern 62R. Each opening 62RA is positioned over the second pixel electrode 32R. In a plan view, the opening 62RA is smaller than the second pixel electrode 32R and the charge transport layer 33R. Therefore, the photosensitive resin pattern 62R is formed on the perimeters of the second pixel electrode 32R and the charge transport layer 33R. The photosensitive resin layer 61R is patterned by photolithography. The photosensitive resin layer 61R is patterned by projecting exposure light R to parts of the photosensitive resin layer 61R via a patterning mask 63R shown in FIG. 5A and dissolving the parts irradiated with the exposure light R in a development solution.

Figure 5C:
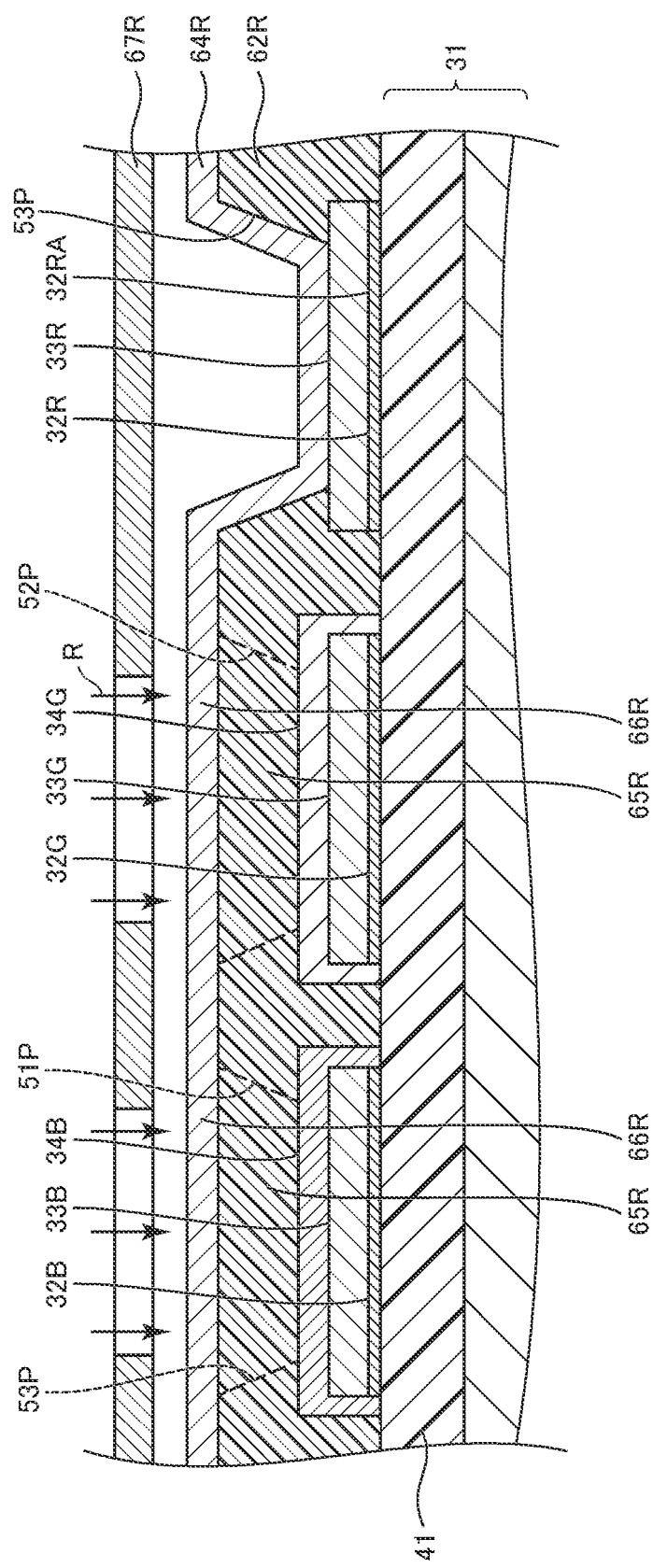
FIG. 5C is a schematic cross-sectional view of an intermediate article for the display device in accordance with Embodiment 1.

In subsequent step S107, a light-emitting material layer 64R shown in FIG. 5C is formed on an opening bottom portion 32RA and the photosensitive resin pattern 62R. The opening bottom portion 32RA is at least a part of the second pixel electrode 32R and formed below the opening 62RA. The light-emitting material layer 64R is formed covering the entire opening bottom portion 32RA and the entire photosensitive resin pattern 62R. The light-emitting material layer 64R is formed by applying a light-emitting material solution containing quantum dots and a dispersion medium in which the quantum dots are dispersed to form a coating film and then heating the coating film to evaporate the dispersion medium from the coating film. The dispersion medium is, for example, octane. The light-emitting material solution may contain, for example, an electron transporting material, a hole transport layer material, a resist material, a silane coupling agent, and/or a thermosetting resin.

Figure 5D:
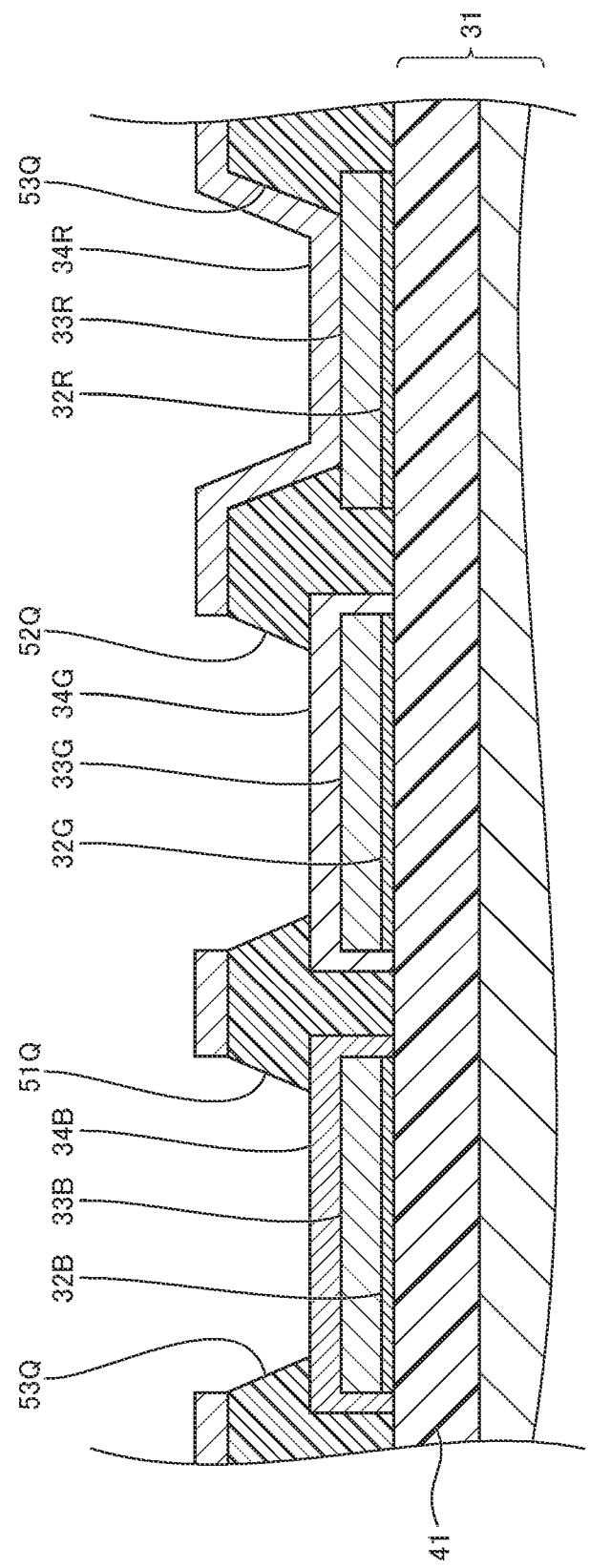
FIG. 5D is a schematic cross-sectional view of an intermediate article for the display device in accordance with Embodiment 1.

In subsequent step S108, a first lift-off portion 65R shown in FIG. 5C that is a part of the photosensitive resin pattern 62R is dissolved in a development solution, and a second lift-off portion 66R shown in FIG. 5C that is a part of the light-emitting material layer 64R is lifted off, with the structural members 51Q, 52Q, and 53Q shown in FIG. 5D being left intact, to form the second light-emitting layer 34R shown in FIG. 5D from the light-emitting material layer 64R. The first lift-off portion 65R is formed on the first light-emitting layers 34B and 34G. The second lift-off portion 66R is formed on the first lift-off portion 65R. Hence, the second light-emitting layer 34R is disposed on the second pixel electrode 32R.

The first lift-off portion 65R and the second lift-off portion 66R are lifted off in such a manner that the structural member 51Q can remain as an edge cover on the perimeters of the first pixel electrode 32B, the charge transport layer 33B, the first light-emitting layer 34B, the first pixel electrode 32G, the charge transport layer 33G, and the first light-emitting layer 34G. In addition, the first lift-off portion 65R and the second lift-off portion 66R are lifted off in such a manner that the structural member 52Q can remain as an edge cover on the perimeters of the first pixel electrode 32G, the charge transport layer 33G, the first light-emitting layer 34G, the second pixel electrode 32R, the charge transport layer 33R, and the second light-emitting layer 34R. In addition, the first lift-off portion 65R and the second lift-off portion 66R are lifted off in such a manner that the structural member 53Q can remain as an edge cover on the perimeters of the first pixel electrode 32B, the charge transport layer 33B, the first light-emitting layer 34B, the second pixel electrode 32R, the charge transport layer 33R, and the second light-emitting layer 34R.

The first lift-off portion 65R and the second lift-off portion 66R are lifted off by projecting the exposure light R to parts of the photosensitive resin pattern 62R via a lift-off mask 67R and dissolving the parts irradiated with the exposure light R in a development solution. In the irradiation of parts of the photosensitive resin pattern 62R with the exposure light R, the exposure light R is projected to the first lift-off portion 65R, but not to the structural member portions 51P, 52P, and 53P. The exposure light R is projected to regions other than the region where the second pixel electrode 32R is disposed, the region between the first pixel electrode 32B and the first pixel electrode 32G, the region between the first pixel electrode 32G and the second pixel electrode 32R, and the region between the first pixel electrode 32B and the second pixel electrode 32R.

The first lift-off portion 65R can be dissolved in a detaching solution in step S108 after the photosensitive resin layer 61R is patterned in step S106, because the photosensitive resin layer 61R is made of a positive photosensitive resin. Note that in step S108, the second lift-off portion 66R that is a part of the light-emitting material layer 64R is provided on the first lift-off portion 65R. However, since the light-emitting material layer 64R can transmit the exposure light R such as ultraviolet light, it is possible to expose the first lift-off portion 65R to the exposure light R such as ultraviolet light. In addition, the light-emitting material layer 64R can pass the development solution, and it is therefore possible to dissolve the first lift-off portion 65R in a development solution.

In subsequent step S109, the structural members 51Q, 52Q, and 53Q are hard-baked. As a result, the structural members 51Q, 52Q, and 53Q change respectively into the structural members 51, 52, and 53 made of the cured positive photosensitive resin shown in FIG. 3. Step S108 and S109 are performed continuously. Therefore, no other step is performed between step S108 and step S109.

In subsequent step S110, the first charge transport layer 35 shown in FIG. 3 is formed. The first charge transport layer 35 is opposite the first pixel electrode 32B across the first light-emitting layer 34B, opposite the first pixel electrode 32G across the first light-emitting layer 34G, and opposite the second pixel electrode 32R across the second light-emitting layer 34R. The first charge transport layer 35 is formed by, for example, sputtering, vapor deposition, or coating.

In subsequent step S111, an opposite electrode 36 shown in FIG. 3 is formed. The opposite electrode 36 is opposite the first pixel electrode 32B across the first charge transport layer 35, the first light-emitting layer 34B, and the second charge transport layer 33B, opposite the first pixel electrode 32G across the first charge transport layer 35, the first light-emitting layer 34G, and the second charge transport layer 33G, and opposite the second pixel electrode 32R across the first charge transport layer 35, the second light-emitting layer 34R, and the second charge transport layer 33R.

The above-described method of manufacturing the display device 1 is capable of forming the structural members 51Q, 52Q, and 53Q in forming the second light-emitting layer 34R from the light-emitting material layer 64R. Therefore, no dedicated step needs to be performed to form the structural members 51Q, 52Q, and 53Q, which enables reducing the number of steps in the method of manufacturing the display device 1. For example, the typical step of forming a bank prior to the formation of the light-emitting layers 34B, 34G, and 34R through a lift-off process may be eliminated.

In addition, in the above-described method of manufacturing the display device 1, the perimeters of the first light-emitting layers 34B and 34G are covered with the photosensitive resin layer 61R, the photosensitive resin pattern 62R, the structural members 51Q, 52Q, and 53Q, or the structural members 51, 52, and 53 in step S105 or in a subsequent step. Therefore, the first light-emitting layers 34B and 34G can be restrained from detaching at the perimeters thereof in step S105 or in a subsequent step.

Generally, the blue-light-emitting, first quantum dots in the first light-emitting layer 34B and the green-light-emitting, first quantum dots in the first light-emitting layer 34G have shorter fluorescence life than the red-light-emitting, second quantum dots in the second light-emitting layer 34R. In addition, the blue-light-emitting, first quantum dots in the first light-emitting layer 34B and the green-light-emitting, first quantum dots in the first light-emitting layer 34G have a lower photoluminescence quantum efficiency than the red-light-emitting, second quantum dots in the second light-emitting layer 34R. Therefore, the blue-light-emitting, first quantum dots in the first light-emitting layer 34B and the green-light-emitting, first quantum dots in the first light-emitting layer 34G have a lower luminous efficiency than the red-light-emitting, second quantum dots in the second light-emitting layer 34R. In addition, when the light-emitting layers are formed in the order of the light-emitting layer 34B, the light-emitting layer 34G, and the light-emitting layer 34R, the light-emitting layer 34B and the light-emitting layer 34G can be formed across the entire pixel electrodes 32B and 32G. Therefore, when the light-emitting layers are formed in the order of the light-emitting layer 34B, the light-emitting layer 34G, and the light-emitting layer 34R, the light-emitting layer 34B and the light-emitting layer 34G, containing only those first quantum dots that exhibit a low luminous efficiency, can be formed respectively on the entire pixel electrodes 32B and 32G. Therefore, the light-emitting layer 34B and the light-emitting layer 34G can emit light respectively across the entire pixel electrodes 32B and 32G. Therefore, the display device 1 can produce bright displays.

It should be understood however that the light-emitting layers may be formed in the order of the light-emitting layer 34R, the light-emitting layer 34G, and the light-emitting layer 34B.

Figure 6:
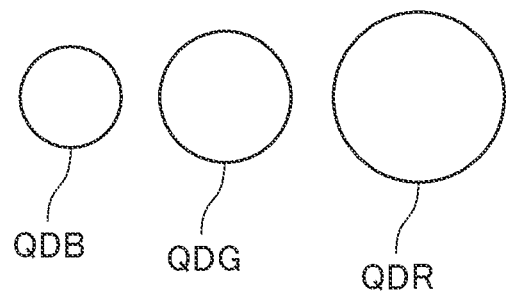
FIG. 6 is a schematic diagram of quantum dots in a first light-emitting layer and a second light-emitting layer in the display device in accordance with Embodiment 1.

FIG. 6 is a schematic diagram of a relationship between the particle diameters of quantum dots contained in the first light-emitting layers 34B and 34G and the second light-emitting layer 34R in the display device 1 in accordance with Embodiment 1.

Referring to FIG. 6, when the light-emitting layers are formed in the order of the light-emitting layer 34R, the light-emitting layer 34G, and the light-emitting layer 34B, first quantum dots QDB contained in the first light-emitting layer 34B and first quantum dots QDG contained in the first light-emitting layer 34G have larger particle diameters than second quantum dots QDR contained in the second light-emitting layer 34R. Generally, as the particle diameters of the quantum dots contained in the light-emitting layer grows larger, the light-emitting layer is less likely to be damaged in the steps that involve, for example, development and exposure to light. Therefore, when the light-emitting layers are formed in the order of the light-emitting layer 34R, the light-emitting layer 34G, and the light-emitting layer 34B, the first light-emitting layers 34B and 34G and the second light-emitting layer 34R can be restrained from being damaged in the steps that involve, for example, development and exposure to light, by rendering the particle diameters of the first quantum dots QDB contained in the first light-emitting layer 34B and the particle diameters of the first quantum dots QDG contained in the first light-emitting layer 34G larger than the particle diameters of the second quantum dots QDR contained in the second light-emitting layer 34R.

1.9 Forming First Light-Emitting Layer by Lift-Off

Figure 7:
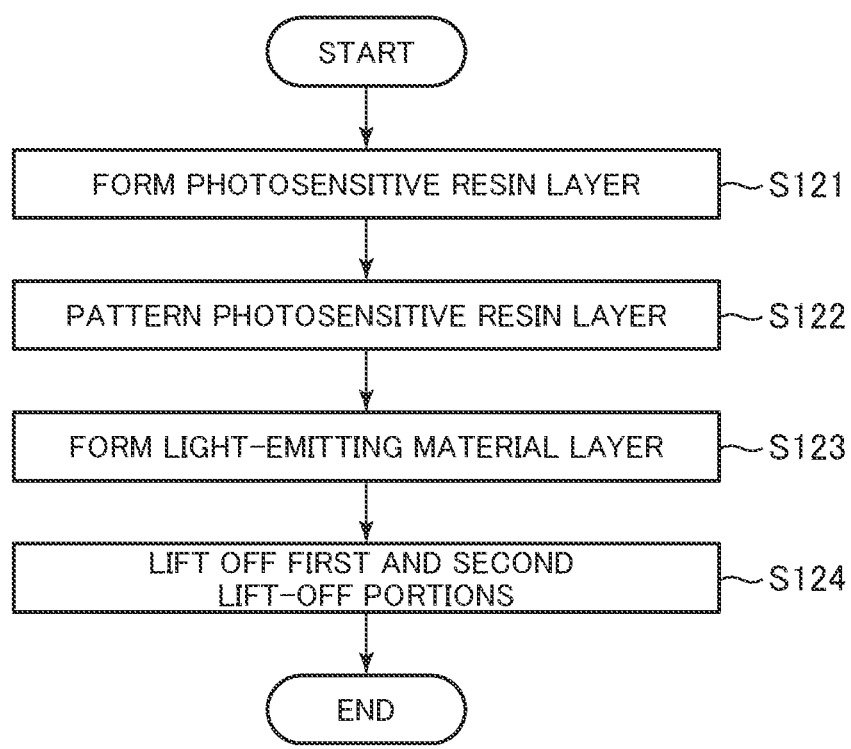
FIG. 7 is a flow chart representing a flow of the lift-off formation of the first light-emitting layer in the display device in accordance with Embodiments 1 and 4.

FIG. 7 is a flow chart representing a flow of the lift-off formation of the first light-emitting layer 34B in the display device 1 in accordance with Embodiment 1. FIGS. 8A to 8D are schematic cross-sectional views of an intermediate article for the display device 1 in accordance with Embodiment 1.

A method of forming the first light-emitting layer 34B includes steps S121 to S124 shown in FIG. 7.

Figure 8A:
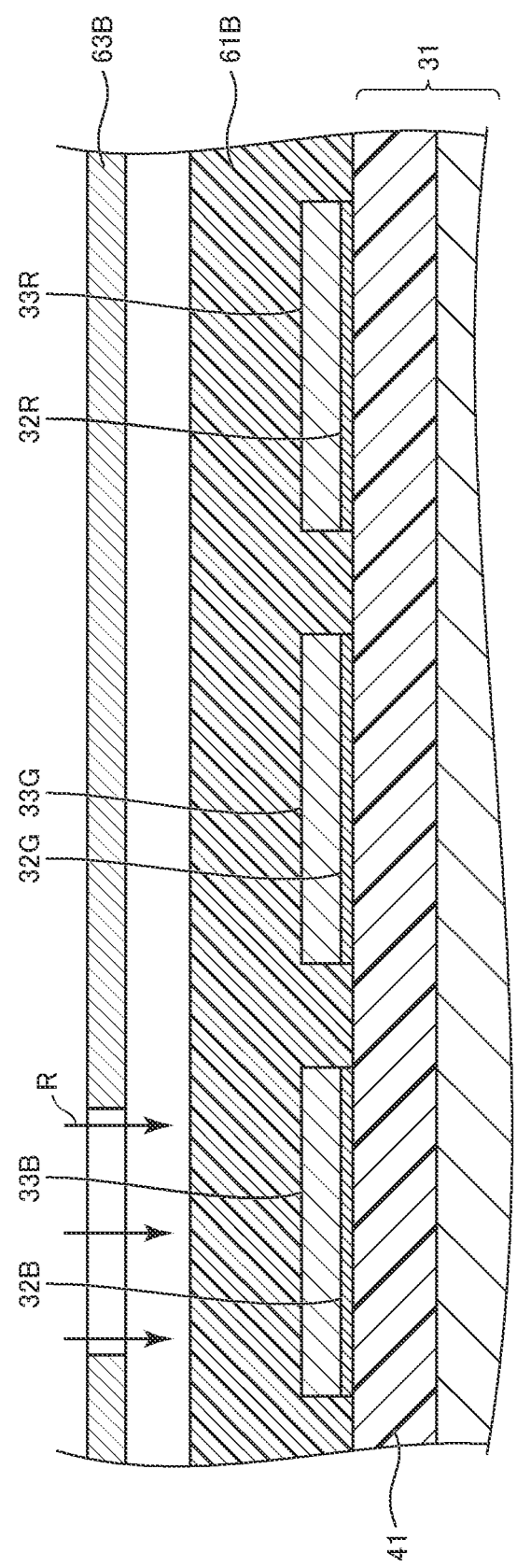
FIG. 8A is a schematic cross-sectional view of an intermediate article for the display device in accordance with Embodiment 1.

In step S121, a photosensitive resin layer 61B shown in FIG. 8A is formed on the first pixel electrodes 32B and 32G, the second pixel electrode 32R, and the second charge transport layers 33B, 33G, and 33R. The photosensitive resin layer 61B contains a positive photosensitive resin that is similar to the positive photosensitive resin contained in the photosensitive resin layer 61R. The photosensitive resin layer 61B is formed by a method that is similar to the method of forming the photosensitive resin layer 61R.

Figure 8B:
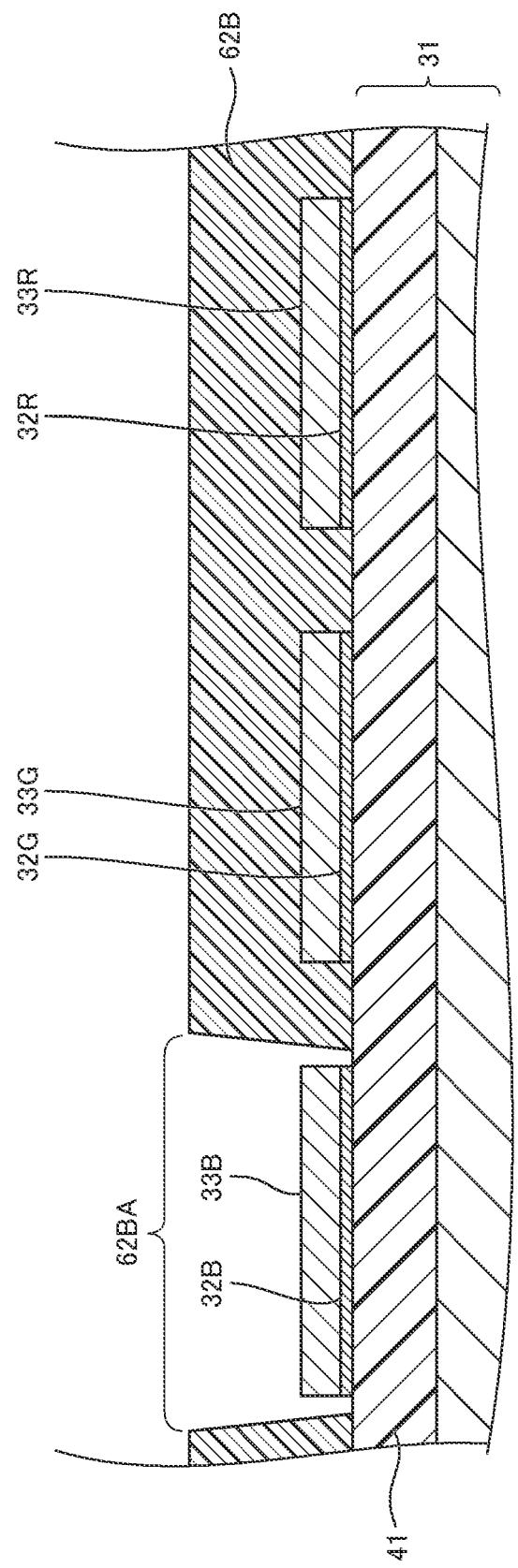
FIG. 8B is a schematic cross-sectional view of an intermediate article for the display device in accordance with Embodiment 1.

In subsequent step S122, the photosensitive resin layer 61B is patterned to form a photosensitive resin pattern 62B shown in FIG. 8B. Openings 62BA are formed in the photosensitive resin pattern 62B. Each opening 62BA is positioned over the pixel electrode 32B. In a plan view, the opening 62BA is larger than the pixel electrode 32B. Therefore, no photosensitive resin pattern 62B is formed on the perimeter of the pixel electrode 32B. The photosensitive resin layer 61B is patterned by photolithography. The photosensitive resin layer 61B is patterned by projecting the exposure light R to parts of the photosensitive resin layer 61B via a patterning mask 63B shown in FIG. 8A and dissolving the parts irradiated with the exposure light R in a development solution.

Figure 8C:
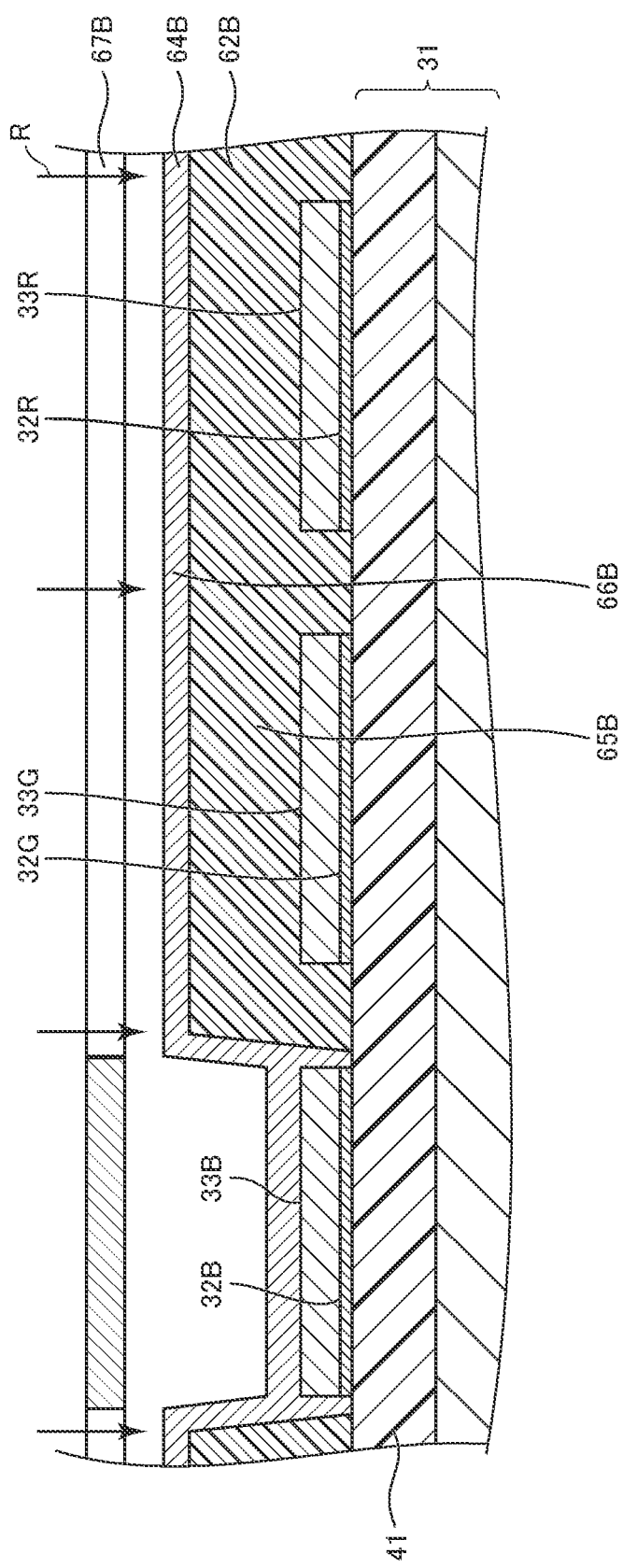
FIG. 8C is a schematic cross-sectional view of an intermediate article for the display device in accordance with Embodiment 1.

In subsequent step S123, a light-emitting material layer 64B shown in FIG. 8C is formed on the first pixel electrode 32B and the photosensitive resin pattern 62B. The light-emitting material layer 64B is formed covering the entire first pixel electrode 32B and the entire photosensitive resin pattern 62B. The light-emitting material layer 64B is formed by a method that is similar to the method of forming the light-emitting material layer 64R.

Figure 8D:
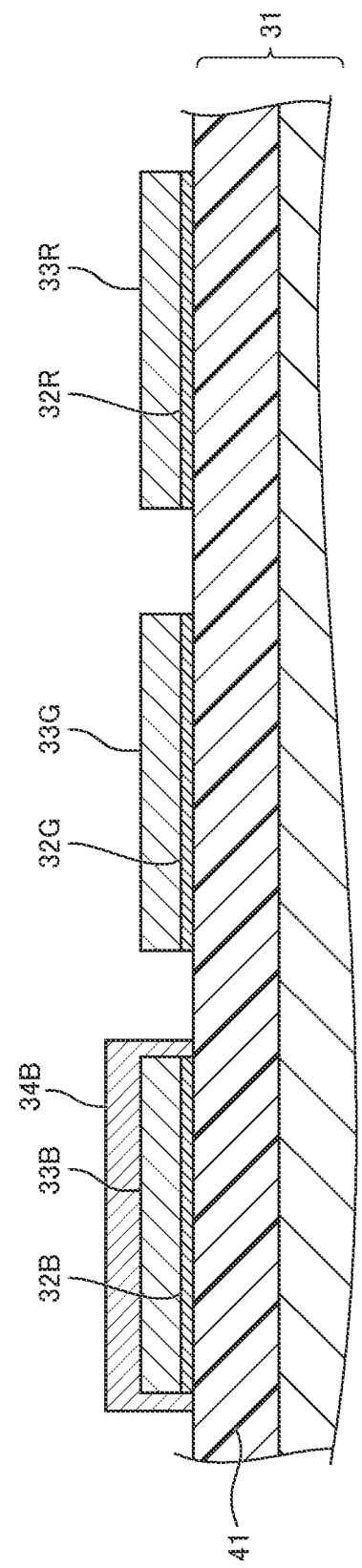
FIG. 8D is a schematic cross-sectional view of an intermediate article for the display device in accordance with Embodiment 1.

In subsequent step S124, a first lift-off portion 65B shown in FIG. 8C that is a part of the photosensitive resin pattern 62B is dissolved in a development solution, and a second lift-off portion 66B shown in FIG. 8C that is a part of the light-emitting material layer 64B is lifted off, to form the first light-emitting layer 34B shown in FIG. 8D from the light-emitting material layer 64B. The first lift-off portion 65B and the second lift-off portion 66B are lifted off by projecting the exposure light R to parts of the photosensitive resin pattern 62B via a lift-off mask 67B shown in FIG. 8C and dissolving the parts irradiated with the exposure light R in a development solution. The exposure light R is projected to regions other than the region where the first pixel electrode 32B is disposed. In the irradiation of parts of the photosensitive resin pattern 62B with the exposure light R, the exposure light R may be projected to contact hole segments where the contact holes 21BC, 21GC, and 21RC are to be formed.

FIG. 7 is a flow chart representing a flow of the lift-off formation of the first light-emitting layer 34G in the display device 1 in accordance with Embodiment 1. FIGS. 9A to 9D are schematic cross-sectional views of an intermediate article for the display device 1 in accordance with Embodiment 1.

A method of forming the first light-emitting layer 34G includes steps S121 to S124 shown in FIG. 7.

Figure 9A:
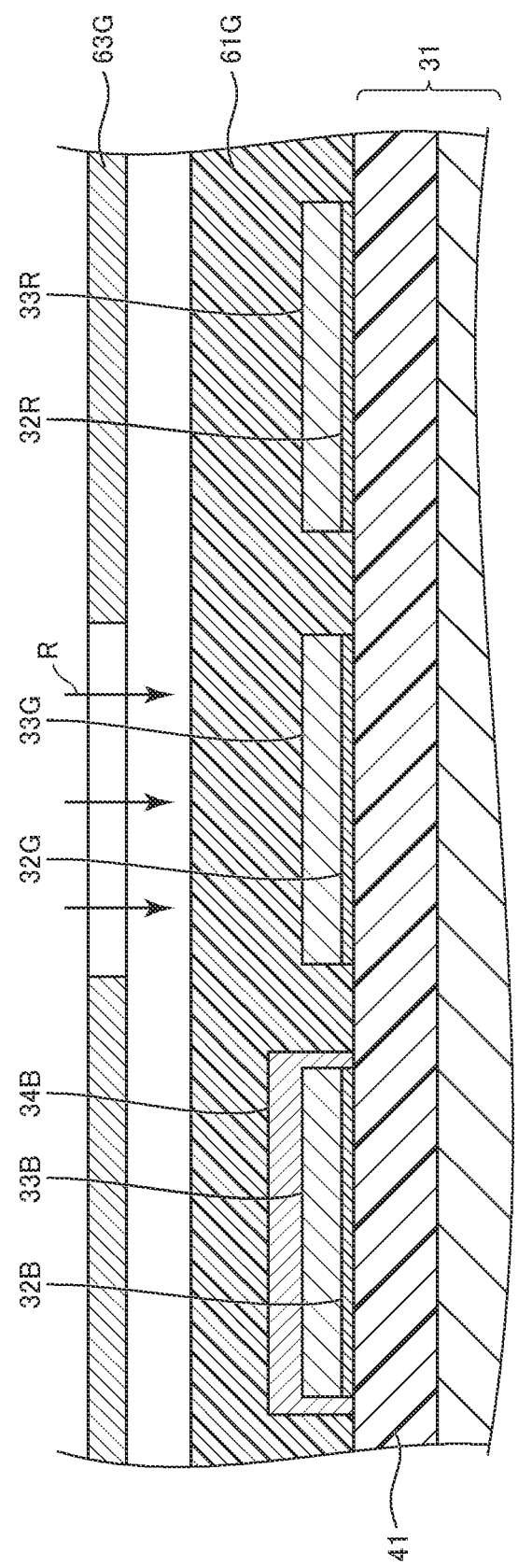
FIG. 9A is a schematic cross-sectional view of an intermediate article for the display device in accordance with Embodiment 1.

In step S121, a photosensitive resin layer 61G shown in FIG. 9A is formed on the first pixel electrodes 32B and 32G, the second pixel electrode 32R, the second charge transport layers 33B, 33G, and 33R, and the first light-emitting layer 34B. The photosensitive resin layer 61G contains a positive photosensitive resin that is similar to the positive photosensitive resin contained in the photosensitive resin layer 61R. The photosensitive resin layer 61G is formed by a method that is similar to the method of forming the photosensitive resin layer 61R.

Figure 9B:
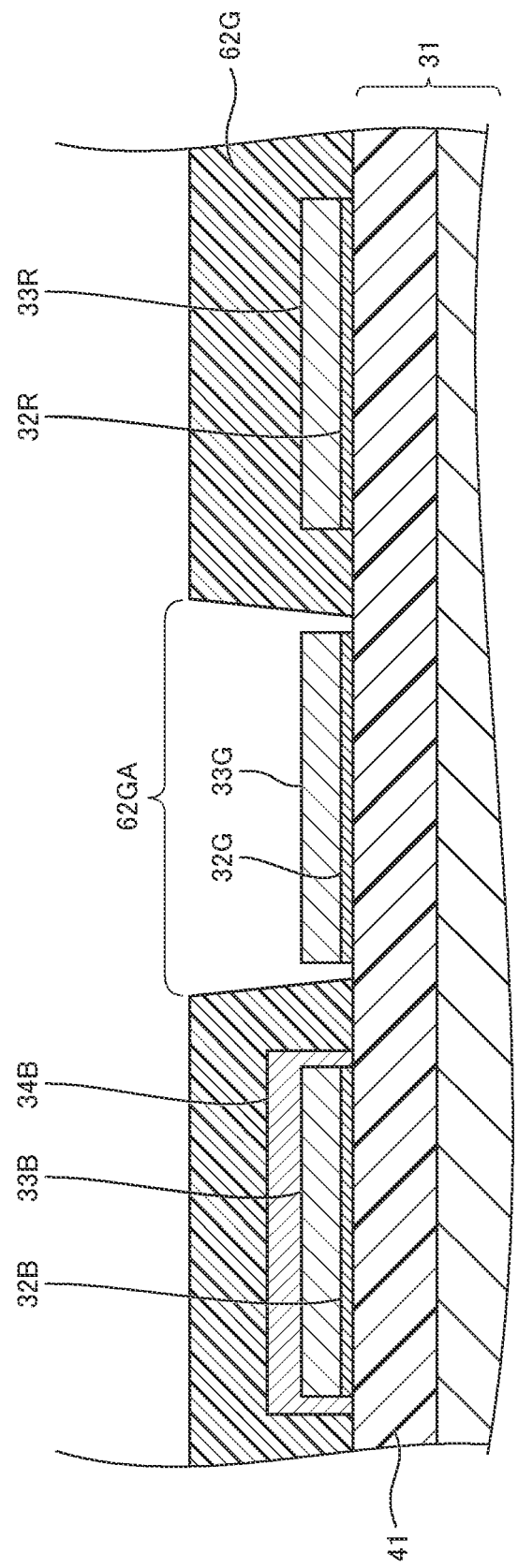
FIG. 9B is a schematic cross-sectional view of an intermediate article for the display device in accordance with Embodiment 1.

In subsequent step S122, the photosensitive resin layer 61G is patterned to form a photosensitive resin pattern 62G shown in FIG. 9B. Openings 62GA are formed in the photosensitive resin pattern 62G. Each opening 62GA is positioned over the first pixel electrode 32G. In a plan view, the opening 62GA is larger than the first pixel electrode 32G. Therefore, no photosensitive resin pattern 62G is formed on the perimeter of the first pixel electrode 32G. The photosensitive resin layer 61G is patterned by photolithography. The photosensitive resin layer 61G is patterned by projecting the exposure light R to parts of the photosensitive resin layer 61G via a patterning mask 63G shown in FIG. 9A and dissolving the parts irradiated with the exposure light R in a development solution.

Figure 9C:
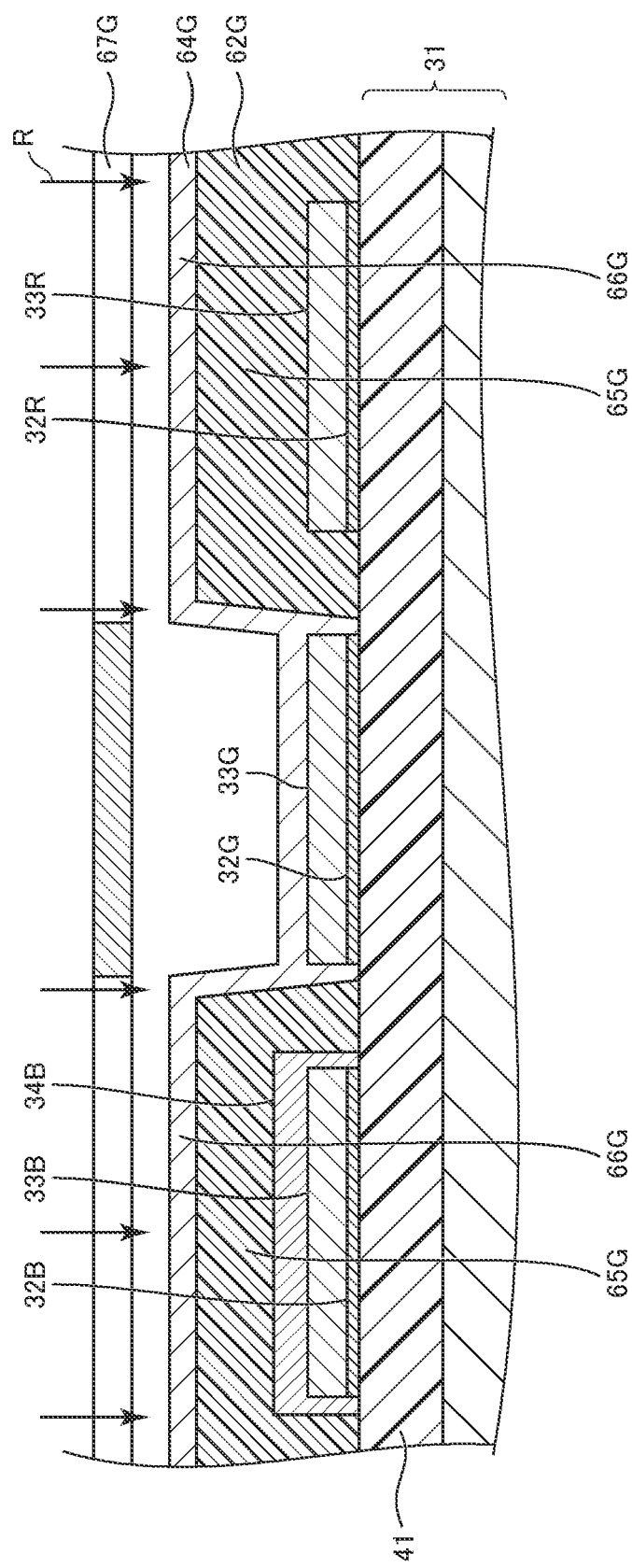
FIG. 9C is a schematic cross-sectional view of an intermediate article for the display device in accordance with Embodiment 1.

In subsequent step S123, a light-emitting material layer 64G shown in FIG. 9C is formed on the first pixel electrode 32G and the photosensitive resin pattern 62G. The light-emitting material layer 64G is formed covering the entire pixel electrode 32G and the entire photosensitive resin pattern 62G. The light-emitting material layer 64G is formed by a method that is similar to the method of forming the light-emitting material layer 64R.

Figure 9D:
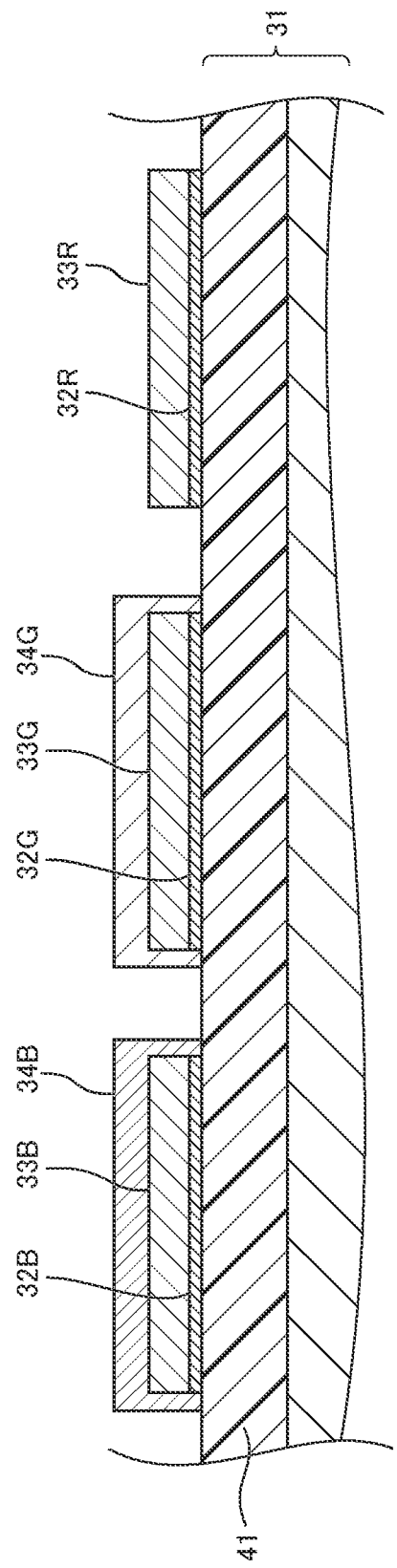
FIG. 9D is a schematic cross-sectional view of an intermediate article for the display device in accordance with Embodiment 1.

In subsequent step S124, a first lift-off portion 65G that is a part of the photosensitive resin pattern 62G shown in FIG. 9C is dissolved in a development solution, and a second lift-off portion 66G that is a part of the light-emitting material layer 64G is lifted off, to form the first light-emitting layer 34G shown in FIG. 9D from the light-emitting material layer 64G. The first lift-off portion 65G and the second lift-off portion 66G are lifted off by projecting the exposure light R to parts of the photosensitive resin pattern 62G via a lift-off mask 67G shown in FIG. 9C and dissolving the parts irradiated with the exposure light R in a development solution. The exposure light R is projected to regions other than the region where the first pixel electrode 32G is disposed. In the irradiation of parts of the photosensitive resin pattern 62G with the exposure light R, the exposure light R may be projected to contact hole segments where the contact holes 21BC, 21GC, and 21RC are to be formed.

1.10 Flatness of Perimeter of First Light-Emitting Layer

Figure 10A:
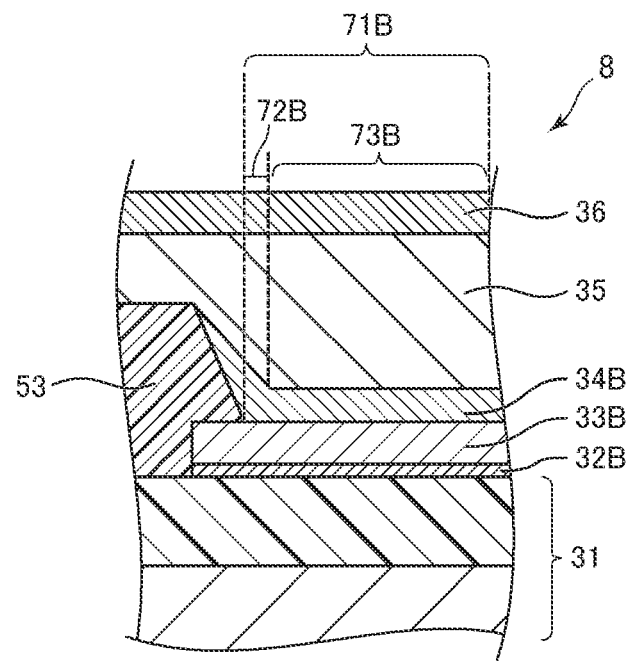
FIG. 10A is a schematic enlarged cross-sectional view of a vicinity of the perimeters of a first pixel electrode and a first light-emitting layer in a display device in accordance with a reference example.
Figure 10B:
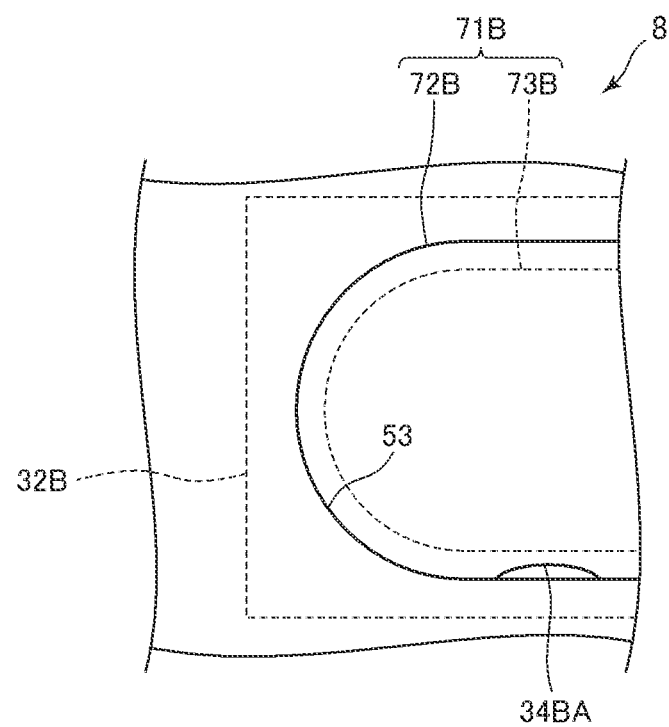
FIG. 10B is a schematic enlarged plan view of a vicinity of the perimeters of the first pixel electrode and the first light-emitting layer in the display device in accordance with the reference example.
Figure 11A:
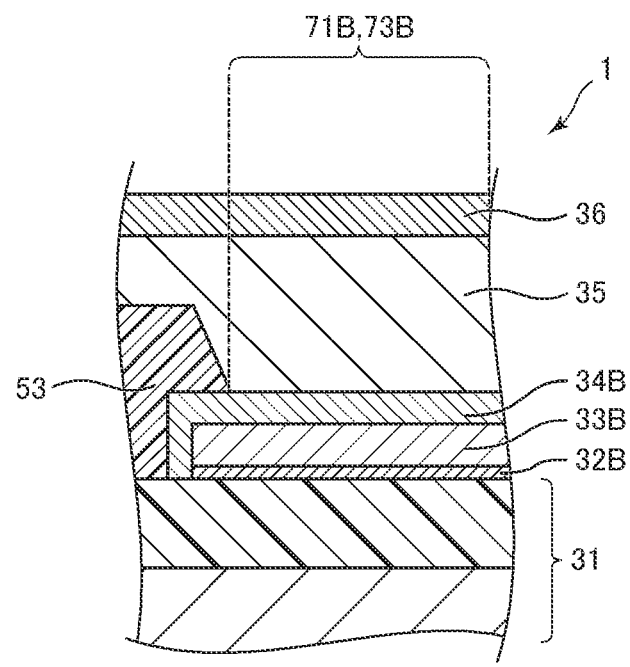
FIG. 11A is a schematic enlarged cross-sectional view of a vicinity of the perimeters of a first pixel electrode and the first light-emitting layer in the display device in accordance with Embodiment 1.
Figure 11B:
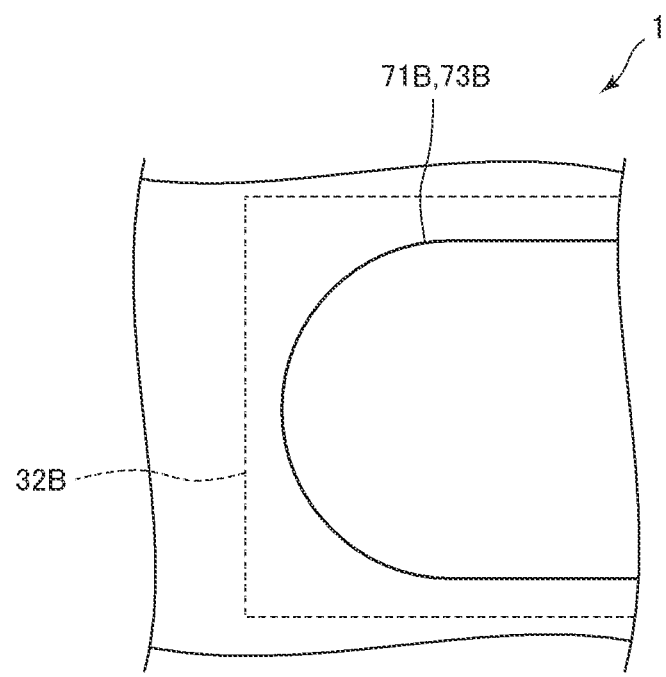
FIG. 11B is a schematic enlarged plan view of a vicinity of the perimeters of the first pixel electrode and the first light-emitting layer in the display device in accordance with Embodiment 1.

FIG. 10A is a schematic enlarged cross-sectional view of a vicinity of the perimeters of the first pixel electrode 32B and the first light-emitting layer 34B in a display device 8 in accordance with a reference example. FIG. 10B is a schematic enlarged plan view of a vicinity of the perimeters of the first pixel electrode 32B and the first light-emitting layer 34B in the display device 8 in accordance with the reference example. FIG. 11A is a schematic enlarged cross-sectional view of a vicinity of the perimeters of the first pixel electrode 32B and the first light-emitting layer 34B in the display device 1 in accordance with Embodiment 1. FIG. 11B is a schematic enlarged plan view of a vicinity of the perimeters of the first pixel electrode 32B and the first light-emitting layer 34B in the display device 1 in accordance with Embodiment 1.

In the display device 8 in accordance with the reference example shown in FIGS. 10A and 10B, the first light-emitting layer 34B is formed by a lift-off process in which the structural member 53 is formed before the first light-emitting layer 34 is formed. Therefore, the perimeter of the first light-emitting layer 34B is formed on an inclined face that is a part of the top face of the structural member 53. In the display device 8, a light-emission region 71B where the blue light emitted by the first light-emitting layer 34B is visually recognizable is formed inside the structural member 53. The light-emission region 71B includes a non-uniform-thickness region 72B extending along the structural member 53 and a uniform-thickness region 73B inside the non-uniform-thickness region 72B. In the non-uniform-thickness region 72B, the light-emitting layer 34B has a non-uniform thickness due to the influence of the perimeter of the light-emitting layer 34B being formed on an inclined face. Therefore, the non-uniform-thickness region 72B is a defective-light-emission region, and the light intensity is not uniform in the light-emission region 71B. The light-emitting layer 34B has a uniform thickness in the uniform-thickness region 73B. Therefore, the uniform-thickness region 73B is a uniform-light-emission region.

In the display device 1 in accordance with Embodiment 1 shown in FIGS. 11A and 11B, the first light-emitting layer 34B is formed by the above-described lift-off process. Therefore, the perimeter of the first light-emitting layer 34B is formed below the structural member 53. In the display device 1, the light-emission region 71B where the blue light emitted by the light-emitting layer 34B is visually recognizable is formed inside the structural member 53. The light-emission region 71B includes the uniform-thickness region 73B. In the uniform-thickness region 73B, the light-emitting layer 34B has a uniform thickness.

As shown in FIGS. 10A, 10B, 11A, and 11B, the uniform-thickness region (uniform-light-emission region) 73B is larger in the display device 1 than in the display device 8. Therefore, the subpixel 21B emits light with higher and less non-uniform intensity in the display device 1 than in the display device 8.

In addition, in the display device 8, since the perimeter of the first light-emitting layer 34B is not covered with the structural member 53, detachment 34BA is likely to occur in the first light-emitting layer 34B. In contrast, in the display device 1, since the perimeter of the first light-emitting layer 34B is covered with the structural member 53, detachment 34BA is unlikely to occur in the light-emitting layer 34B.

This description of the subpixel 21B is applicable also to the subpixel 21G.

Figure 12A:
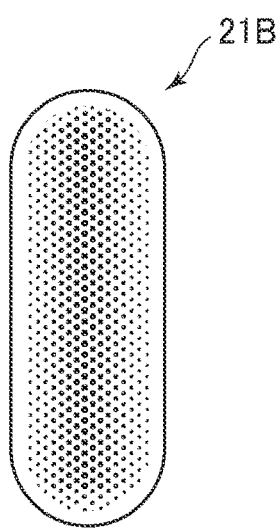
FIG. 12A is a schematic plan view of emission by a subpixel in a display device that includes no structural member.
Figure 12B:
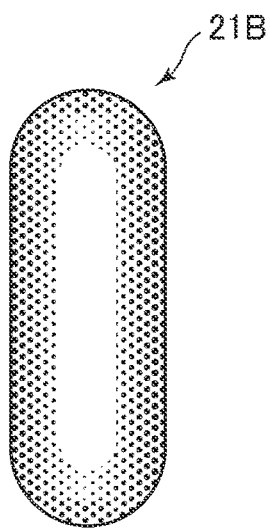
FIG. 12B is a schematic plan view of emission by a subpixel in a display device that includes a structural member on which the perimeter of the first light-emitting layer is disposed.
Figure 12C:
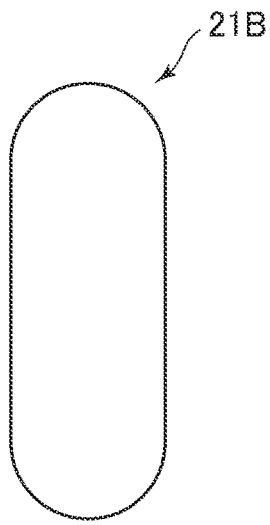
FIG. 12C is a schematic plan view of emission by a subpixel in a display device that includes a structural member below which the perimeter of the first light-emitting layer is disposed.

FIG. 12A is a schematic plan view of emission by the subpixel 21B in a display device that includes no structural member 53. FIG. 12B is a schematic plan view of emission by the subpixel 21B in a display device that includes the structural member 53 on which the perimeter of the first light-emitting layer 34B is disposed. FIG. 12C is a schematic plan view of emission by the subpixel 21B in a display device that includes the structural member 53 below which the perimeter of the first light-emitting layer 34B is disposed. FIGS. 12A, 12B, and 12C indicate falling light-emission intensity with increasingly dark shading.

In the display device that includes no structural member 53, as shown in FIG. 12A, the first light-emitting layer 34B does not uniformly emit light. The light emitted by the first light-emitting layer 34B is more intense in regions close to the perimeter of the first light-emitting layer 34B and less intense in regions far from the perimeter of the first light-emitting layer 34B. This phenomenon occurs because the electric field concentrates at the perimeter of the pixel electrode so that a large current flows at the perimeter of the pixel electrode.

For instance, in a display device that includes the structural member 53 on which the perimeter of the first light-emitting layer 34B is disposed as shown in FIG. 10A, the first light-emitting layer 34B does not uniformly emit light as shown in FIG. 12B. The light emitted by the first light-emitting layer 34B is less intense in regions close to the perimeter of the first light-emitting layer 34B and more intense in regions far from the perimeter of the first light-emitting layer 34B. This phenomenon occurs because the first light-emitting layer 34B has a larger thickness on the perimeter of the pixel electrode 32B so that a smaller current flows at the perimeter of the pixel electrode 32B.

In a display device that includes the structural member 53 below which the perimeters of the first light-emitting layer 34B and the pixel electrode 32B are disposed like in the display device 1 in accordance with Embodiment 1, the first light-emitting layer 34B uniformly emits light as shown in FIG. 12C. In other words, in the display device 1 where the perimeters of the first light-emitting layer 34B and the pixel electrode 32B are disposed below the structural member 53, by disposing the structural member 53 so that the structural member 53 can cover the perimeter of a pixel electrode 32B, the electric field can be prevented from concentrating at the perimeter of the pixel electrode 32B, and the first light-emitting layer 34B has a uniform thickness in the light-emission region. The display device 1 can hence restrain non-uniform emission shown in FIGS. 12A and 12B.

This description of the subpixel 21B is applicable also to the subpixel 21G.

1.11 Variation Examples

Figure 13A:
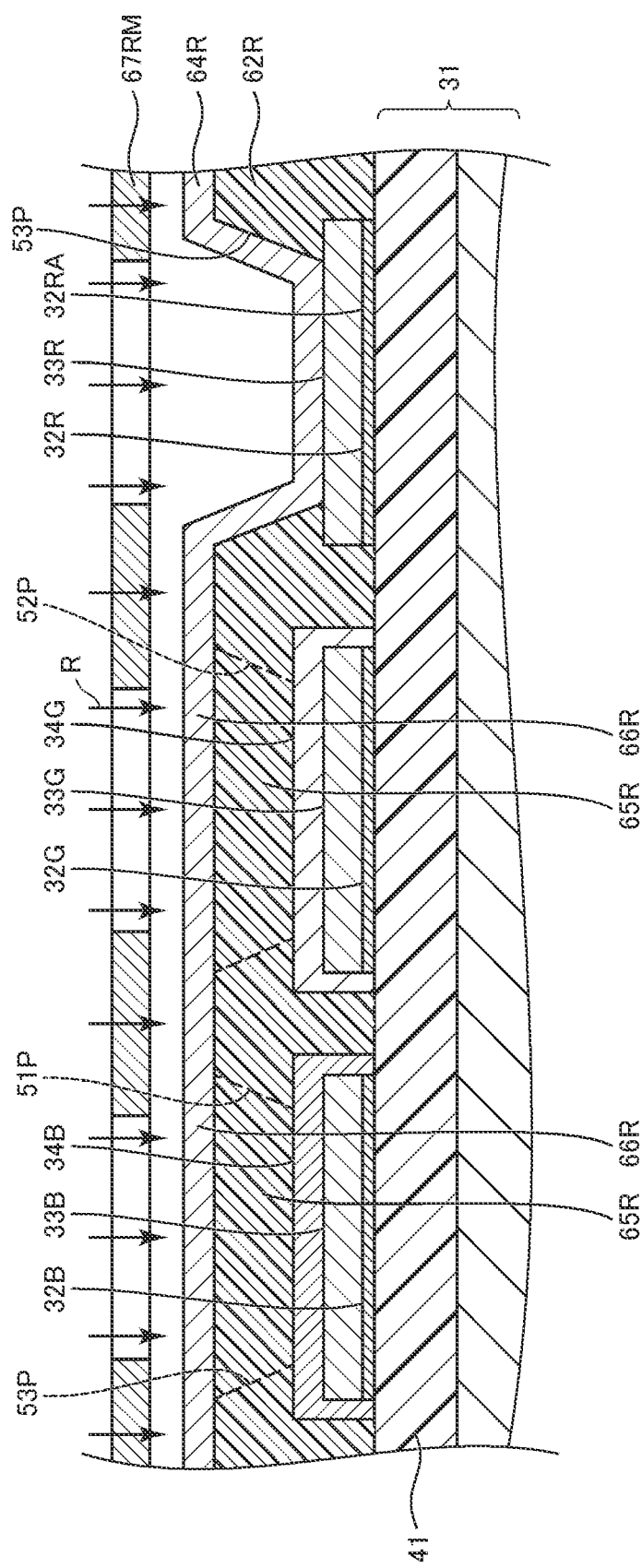
FIG. 13A is a schematic cross-sectional view of an intermediate article for a display device in accordance with a variation example of Embodiment 1.
Figure 13B:
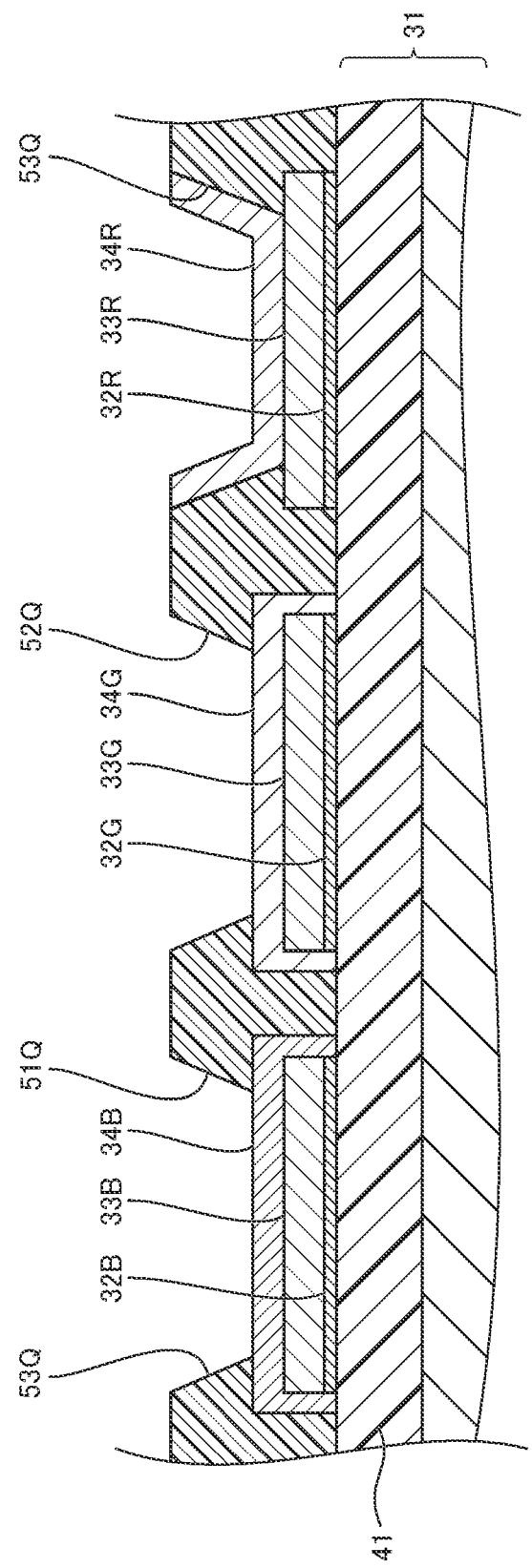
FIG. 13B is a schematic cross-sectional view of an intermediate article for the display device in accordance with the variation example of Embodiment 1.

FIGS. 13A and 13B are schematic cross-sectional views of an intermediate article for a display device in accordance with a variation example of Embodiment 1.

In the above-described method of manufacturing the display device 1, as shown in FIG. the exposure light R is projected to the first lift-off portion 65R, but not to the structural member portions 51P, 52P, and 53P, in the irradiation of parts of the photosensitive resin pattern 62R with the exposure light R.

However, as shown in FIG. 13A, the exposure light R may be projected to the first lift-off portion 65R and the structural member portions 51P, 52P, and 53P. In such a case, the exposure-light radiation dose is larger for the first lift-off portion 65R than for the structural member portions 51P, 52P, and 53P. The exposure light R is projected to the structural member portions 51P, 52P, and 53P via semi-light-transmitting segments of a lift-off mask 67RM. Hence, as shown in FIG. 13B, those portions which are parts of the light-emitting material layer 64R and which are provided on the structural member portions 51P, 52P, and 53P can be removed. Therefore, these portions and the second lift-off portion 66R can be simultaneously removed by a single lift-off process.

2 Embodiment 2

The following will focus on differences of Embodiment 2 from Embodiment 1. Embodiment 2 employs the same structure as Embodiment 1 unless specifically mentioned otherwise.

Figure 14:
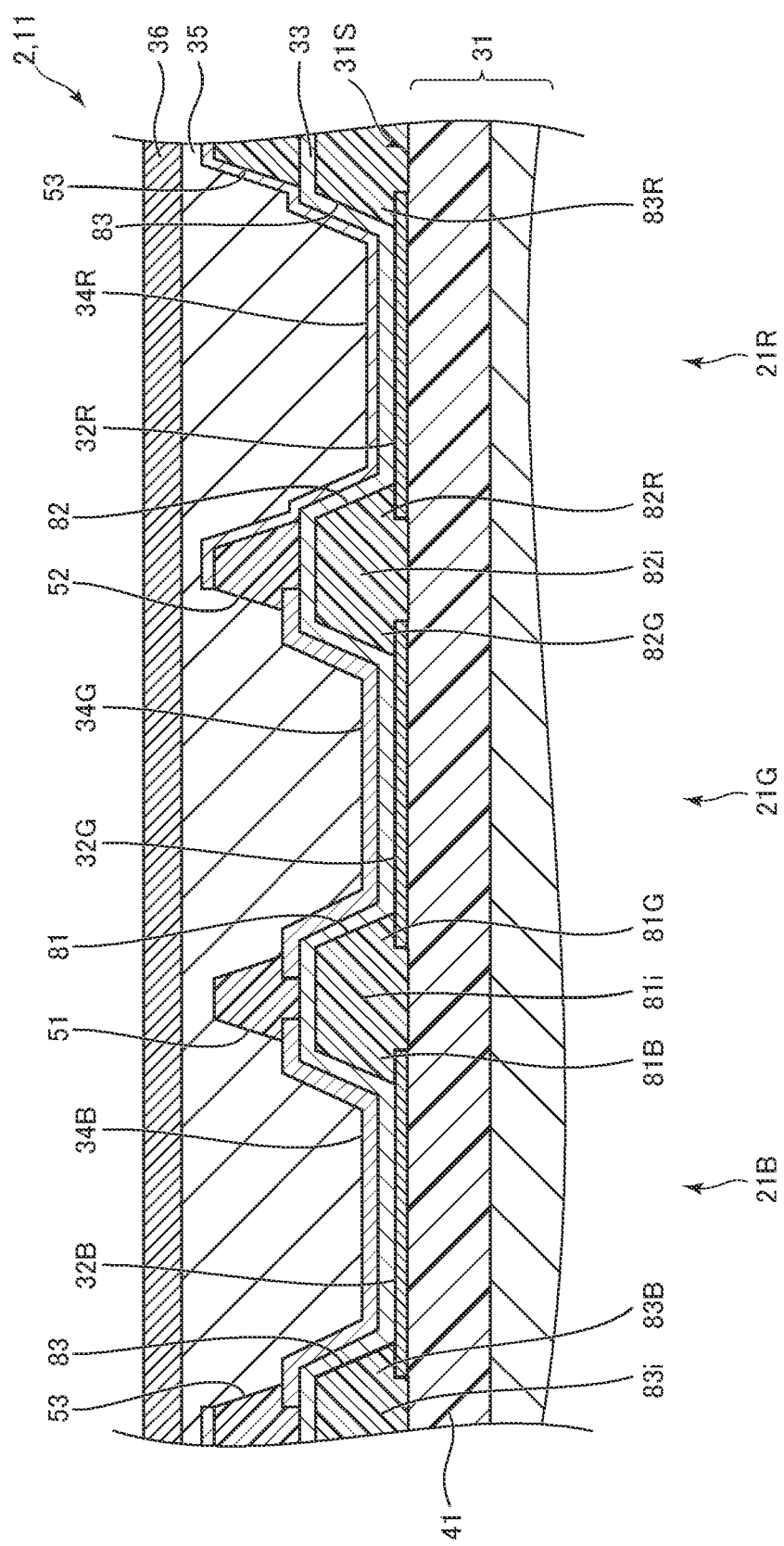
FIG. 14 is a schematic cross-sectional view of each pixel in a display device in accordance with Embodiment 2.

FIG. 14 is a schematic cross-sectional view of each pixel 11 in a display device 2 in accordance with Embodiment 2.

Referring to FIG. 14, the display device 2 further includes additional structural members 81, 82, and 83 and also includes a second charge transport layer 33 in place of the second charge transport layers 33B, 33G, and 33R.

The additional structural members 81, 82, and 83 are disposed respectively below the structural members 51, 52, and 53, in other words, on the same side of the substrate 31 as the main face 31S.

The additional structural member 81 is provided across: on the perimeter of the first pixel electrode 32B; between the first pixel electrode 32B and the first pixel electrode 32G; and on the perimeter of the first pixel electrode 32G. Therefore, the additional structural member 81 includes: an edge cover segment 81B on the perimeter of the first pixel electrode 32B; a pixel boundary segment 81i between the first pixel electrode 32B and the first pixel electrode 32G; and an edge cover segment 81G on the perimeter of the first pixel electrode 32G.

The additional structural member 82 is provided across: on the perimeter of the first pixel electrode 32G; between the first pixel electrode 32G and the second pixel electrode 32R; and on the perimeter of the second pixel electrode 32R. Therefore, the additional structural member 82 includes: an edge cover segment 82G on the perimeter of the first pixel electrode 32G; a pixel boundary segment 82i between the first pixel electrode 32G and the second pixel electrode 32R; an edge cover segment 82R on the perimeter of the second pixel electrode 32R. The additional structural member 83 is provided across: on the perimeter of the first pixel electrode 32B; between the first pixel electrode 32B and the second pixel electrode 32R; and on the perimeter of the second pixel electrode 32R. Therefore, the additional structural member 83 includes: an edge cover segment 83B on the perimeter of the first pixel electrode 32B; a pixel boundary segment 83i between the first pixel electrode 32B and the second pixel electrode 32R; and an edge cover segment 83R on the perimeter of the second pixel electrode 32R.

The second charge transport layer 33 is not patterned. Therefore, the second charge transport layer 33 is disposed across each entirety of the subpixels 21B, 21G, and 21R and continuously across the subpixels 21B, 21G, and 21R.

The second charge transport layer 33 is provided across: on the first pixel electrode 32B; on the additional structural member 81; on the first pixel electrode 32G; on the additional structural member 82; on the second pixel electrode 32R; and on the additional structural member 83.

The structural members 51, 52, and 53 are disposed respectively on the additional structural members 81, 82, and 83.

The perimeter of the first light-emitting layer 34B is disposed below the structural members 51 and 53. The perimeter of the first light-emitting layer 34G is disposed below the structural members 51 and 52. In contrast, the perimeter of the second light-emitting layer 34R is disposed on the structural members 52 and 53.

Those parts of the first charge transport layer 35 and the second charge transport layer 33 which belong to the subpixels 21B, 21G, and 21R are separated from each other because the pixel electrodes 32B, 32G, and 32R are separated from each other by a larger distance than the pixel electrodes 32B, 32G, and 32R are separated from the common electrode 36 such that there are no places where the first charge transport layer 35 and the second charge transport layer 33 are in direct contact with each other. This structure enables restraining crosstalk between the subpixels 21B, 21G, and 21R.

Figure 15:
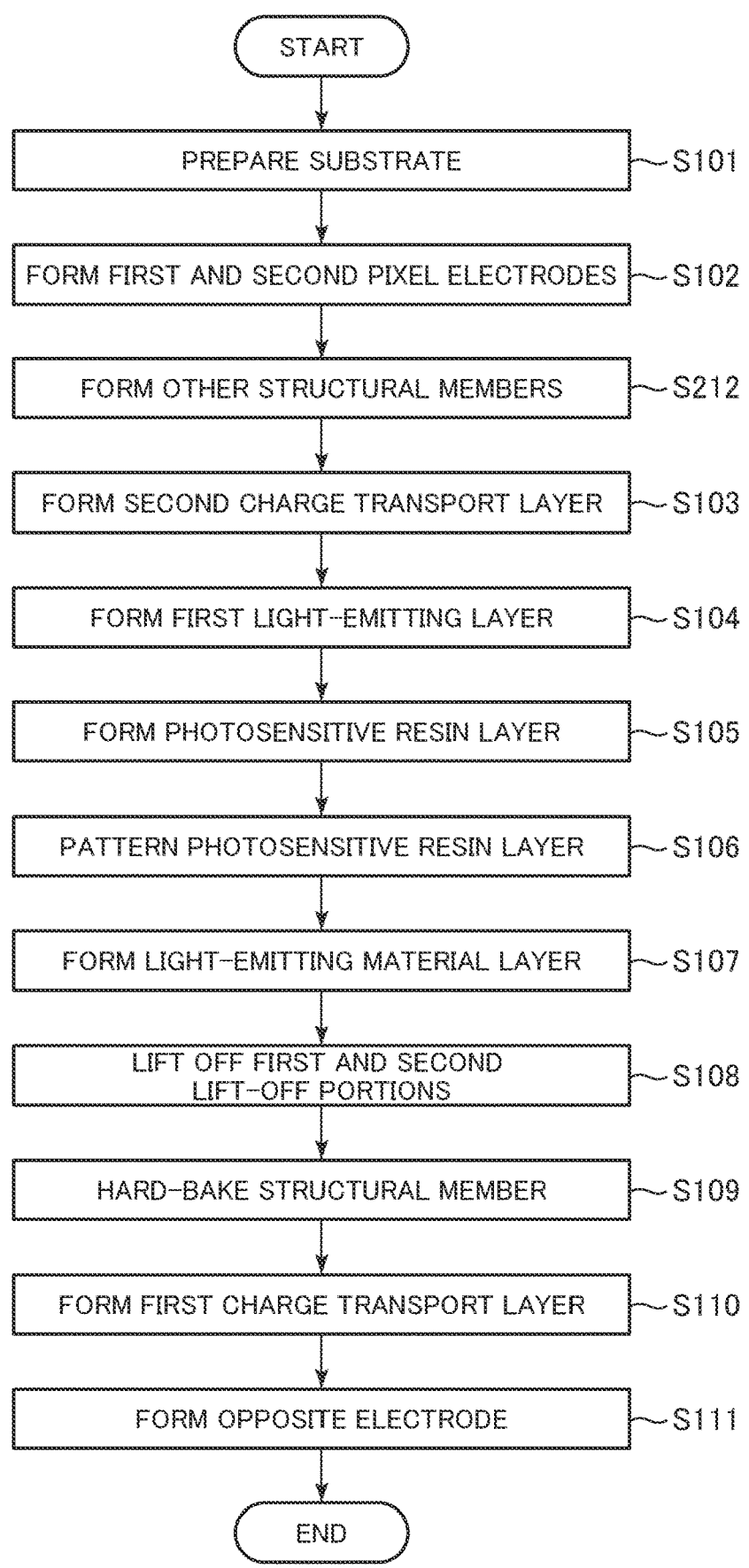
FIG. 15 is a flow chart representing a flow of the manufacture of the display device in accordance with Embodiment 2.

FIG. 15 is a flow chart representing a flow of the manufacture of the display device 2 in accordance with Embodiment 2.

A method of manufacturing the display device 2, as shown in FIG. 15, includes step S212 as well as steps S101 to S111.

Step S212 is performed after the first pixel electrodes 32B and 32G and the second pixel electrode 32R are formed in step S102, but before the second charge transport layer 33 is formed in step S103. In step S212, the additional structural members 81, 82, and 83 are formed. The additional structural members 81, 82, and 83 are formed by forming a photosensitive resin layer and patterning this photosensitive resin layer.

3 Embodiment 3

The following will focus on differences of Embodiment 3 from Embodiment 1. Embodiment 3 employs the same structure as Embodiment 1 unless specifically mentioned otherwise.

Figure 16:
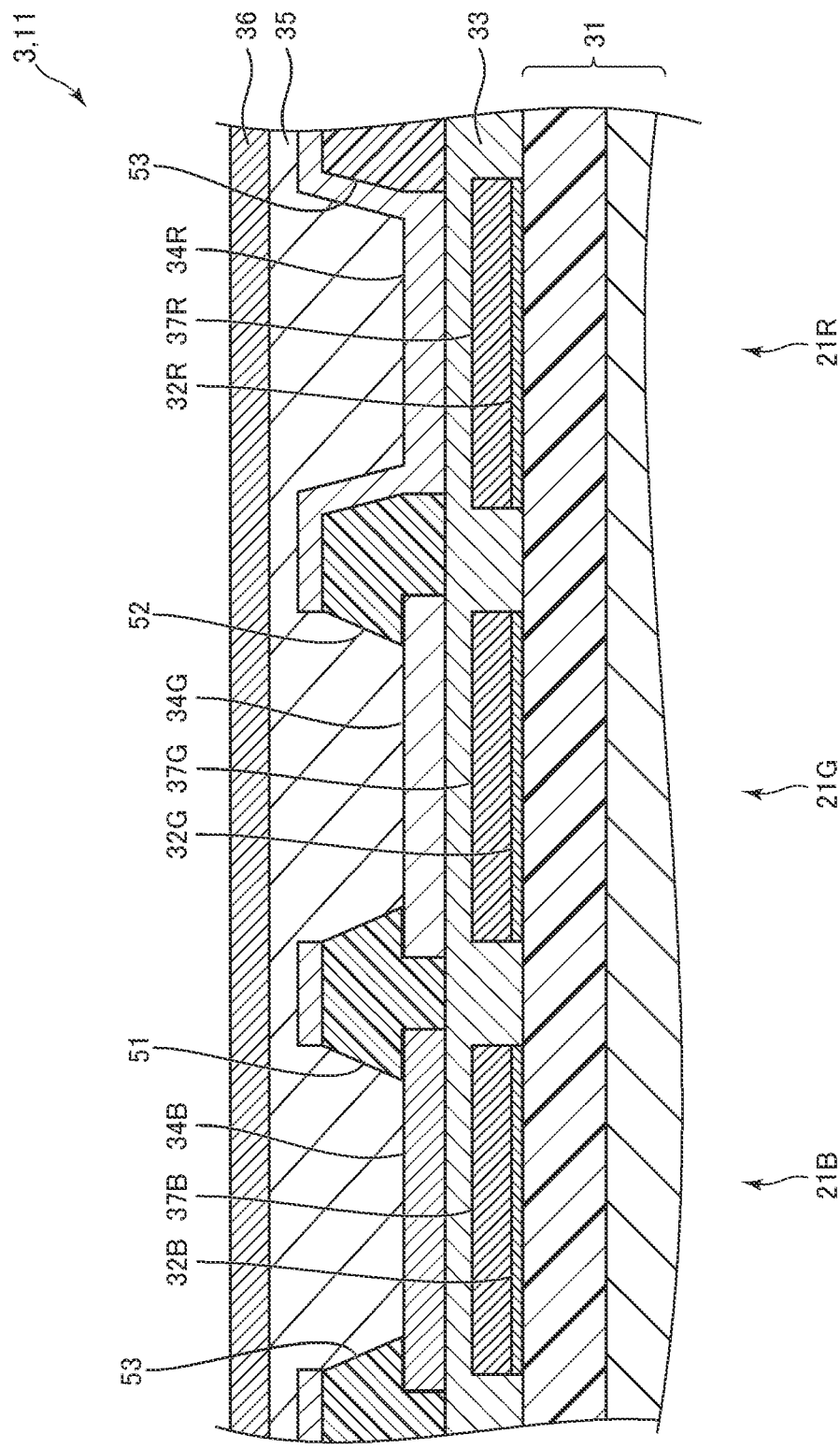
FIG. 16 is a schematic cross-sectional view of each pixel in a display device in accordance with Embodiment 3.

FIG. 16 is a schematic cross-sectional view of each pixel 11 in a display device 3 in accordance with Embodiment 3.

Referring to FIG. 16, the display device 3 further includes charge injection layers 37B, 37G, and 37R and includes the second charge transport layer 33 instead of the second charge transport layers 33B, 33G, and 33R.

The charge injection layers 37B, 37G, and 37R are disposed respectively on the first pixel electrode 32B, the first pixel electrode 32G, and the second pixel electrode 32R and disposed below the second charge transport layer 33. Therefore, the charge injection layer 37B is disposed between the first pixel electrode 32B and the second charge transport layer 33. In addition, the charge injection layer 37G is disposed between the first pixel electrode 32G and the second charge transport layer 33. In addition, the charge injection layer 37R is disposed between the second pixel electrode 32R and the second charge transport layer 33.

The charge injection layers 37B, 37G, and 37R have the same shape in a plan view as the first pixel electrode 32B, the first pixel electrode 32G, and the second pixel electrode 32R in a plan view.

The second charge transport layer 33 is not patterned. Therefore, the second charge transport layer 33 is disposed across each entirety of the subpixels 21B, 21G, and 21R and continuously across the subpixels 21B, 21G, and 21R. Hence, the second charge transport layer 33 can be restrained from, for example, detaching and being chipped along the perimeter, which enables the subpixels 21B, 21G, and 21R to uniformly emit light.

Figure 17:
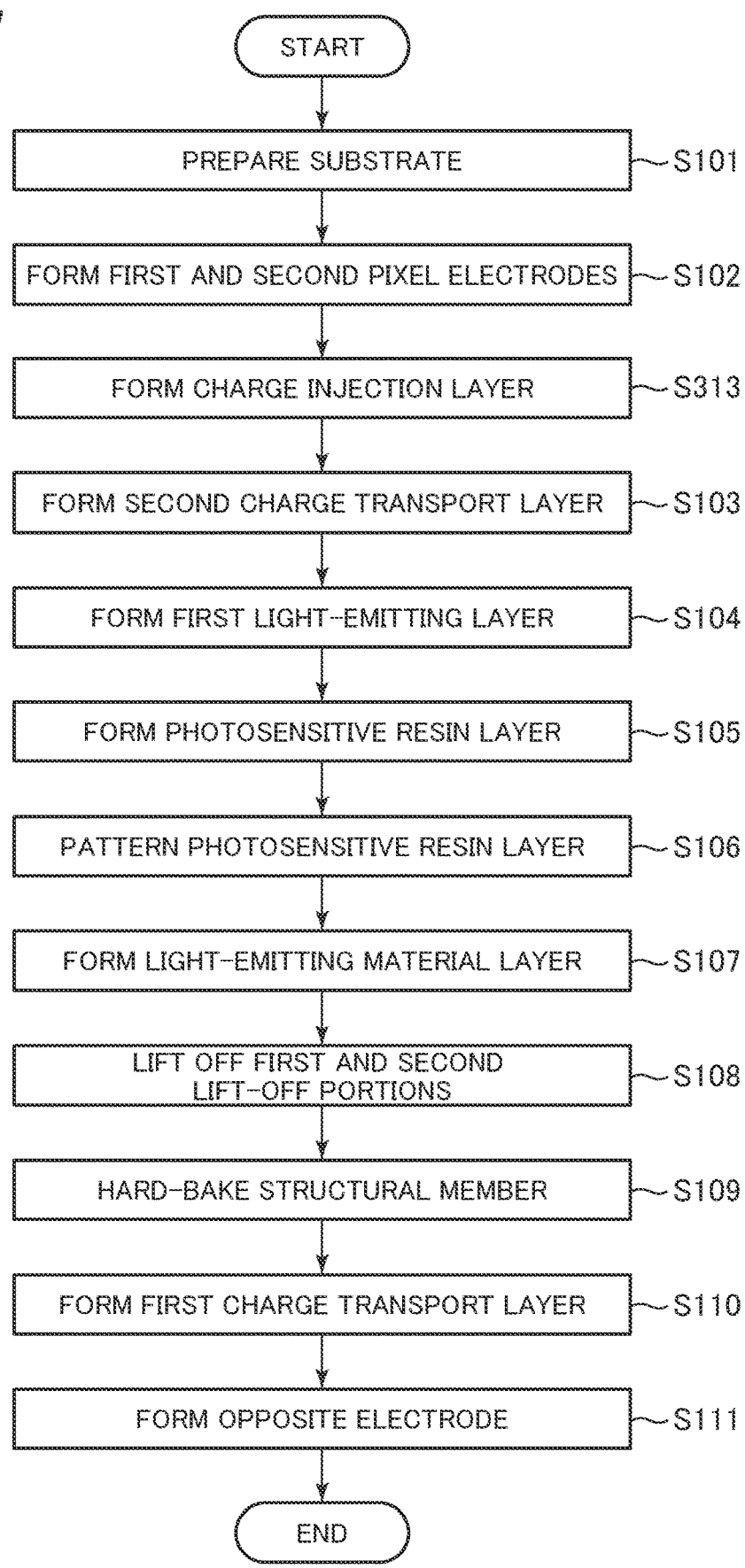
FIG. 17 is a flow chart representing a flow of the manufacture of the display device in accordance with Embodiment 3.

FIG. 17 is a flow chart representing a flow of the manufacture of the display device 3 in accordance with Embodiment 3.

A method of manufacturing the display device 3, as shown in FIG. 17, includes step S313 as well as steps S101 to S111.

Step S313 is performed after the first pixel electrodes 32B and 32G and the second pixel electrode 32R are formed in step S102, but before the second charge transport layer 33 is formed in step S103. In step S313, the charge injection layers 37B, 37G, and 37R are formed. In step S313, the charge injection layers 37B, 37G, and 37R are formed by patterning a layer of a charge injection material by vapor deposition using a mask or etching using photoresist as a mask.

4 Embodiment 4

The following will focus on differences of Embodiment 4 from Embodiment 1. Embodiment 4 employs the same structure as Embodiment 1 unless specifically mentioned otherwise.

Figure 18:
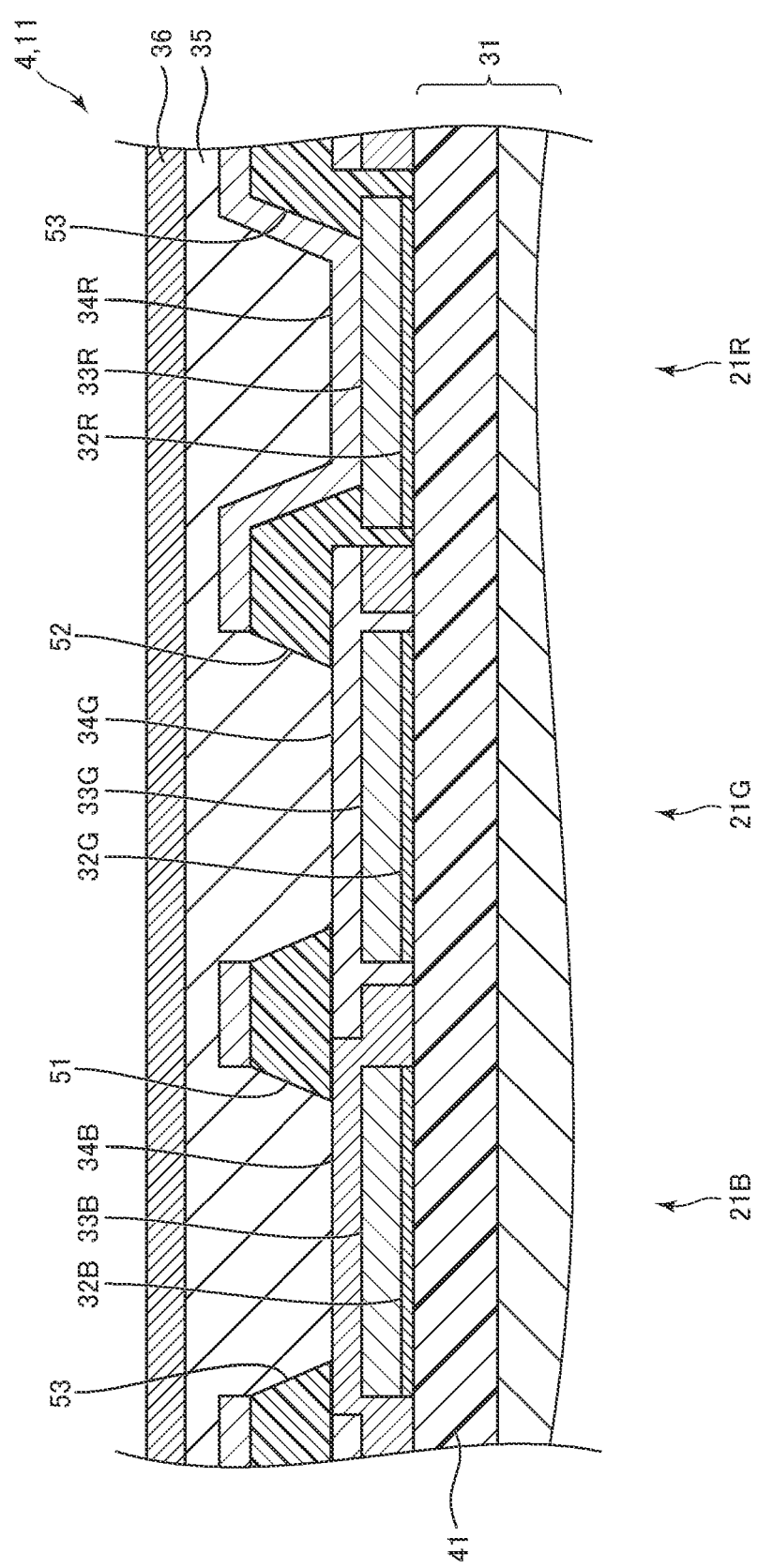
FIG. 18 is a schematic cross-sectional view of each pixel in a display device in accordance with Embodiment 4.

FIG. 18 is a schematic cross-sectional view of each pixel 11 in a display device 4 in accordance with Embodiment 4.

Referring to FIG. 18, the first light-emitting layer 34G is provided across on the charge transport layer 33G and on the perimeter of the first light-emitting layer 34B. Therefore, the first light-emitting layer 34G covers the perimeter of the first light-emitting layer 34B. The first light-emitting layer 34G covers the entire perimeter of the first light-emitting layer 34B. Hence, the perimeter of the first light-emitting layer 34B becomes less likely to detach. In addition, the first light-emitting layers 34B and 34G are continuous. Hence, the first light-emitting layers 34B and 34G become less likely to detach. The entire perimeter of the first light-emitting layer 34B also overlaps the structural members 51 and 53.

FIG. 4 is also a flow chart representing a flow of the manufacture of the display device 4 in accordance with Embodiment 4. FIGS. 19A to 19D are schematic cross-sectional views of an intermediate article for the display device 4 in accordance with Embodiment 4.

Figure 19A:
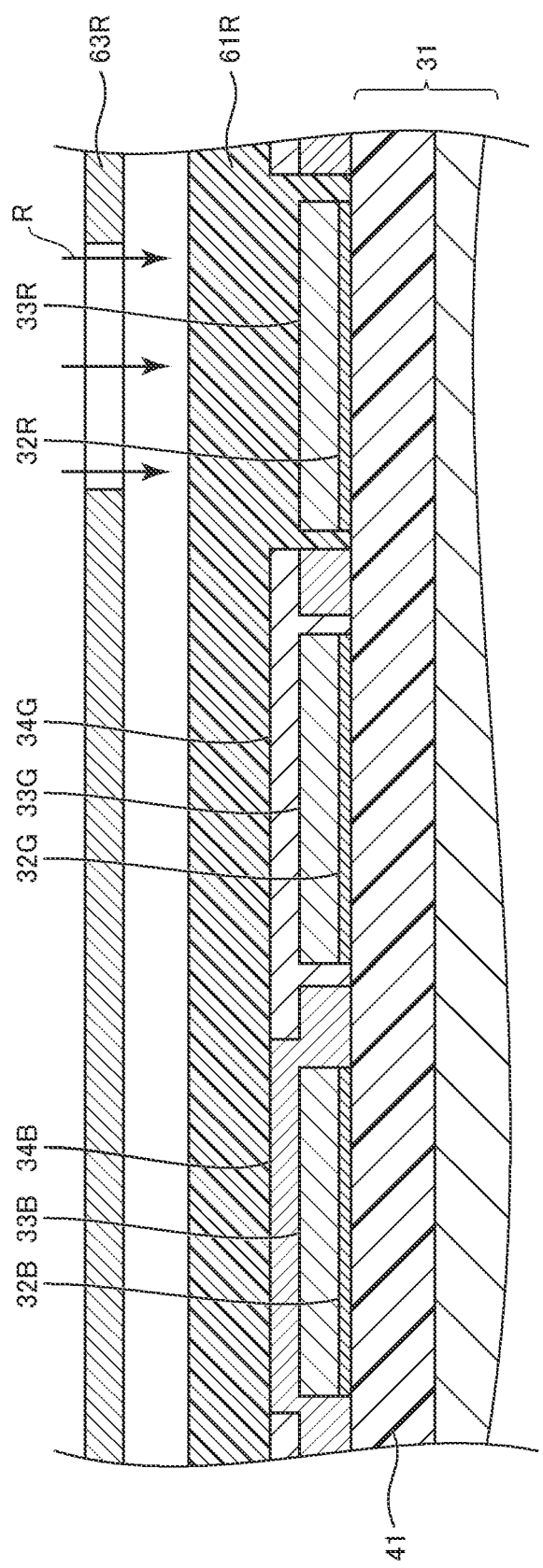
FIG. 19A is a schematic cross-sectional view of an intermediate article for the display device in accordance with Embodiment 4.

In step S101, the substrate 31 shown in FIG. 19A is prepared.

In subsequent step S102, the first pixel electrodes 32B and 32G and the second pixel electrode 32R shown in FIG. 19A are formed.

In subsequent step S103, the second charge transport layers 33B, 33G, and 33R shown in FIG. 19A are formed.

In subsequent step S104, the first light-emitting layers 34B and 34G shown in FIG. 19A are formed.

In subsequent step S105, the photosensitive resin layer 61R shown in FIG. 19A is formed.

Figure 19B:
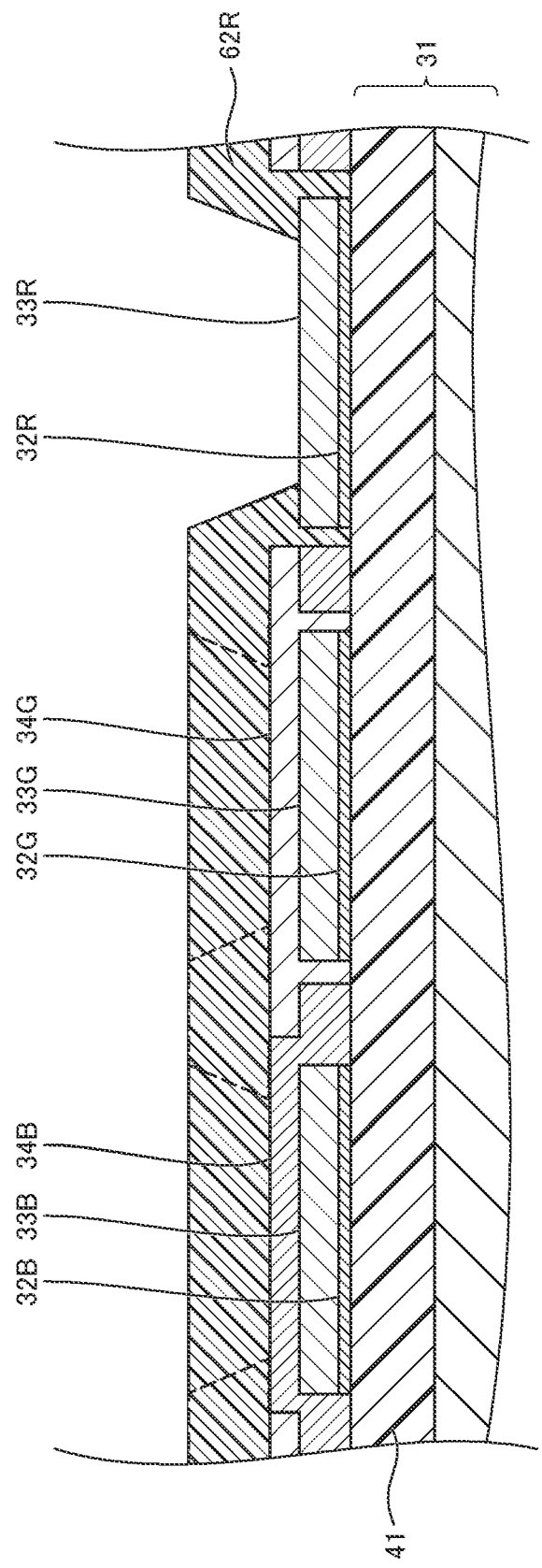
FIG. 19B is a schematic cross-sectional view of an intermediate article for the display device in accordance with Embodiment 4.

In subsequent step S106, the photosensitive resin layer 61R is patterned by development to form the photosensitive resin pattern 62R shown in FIG. 19B.

Figure 19C:
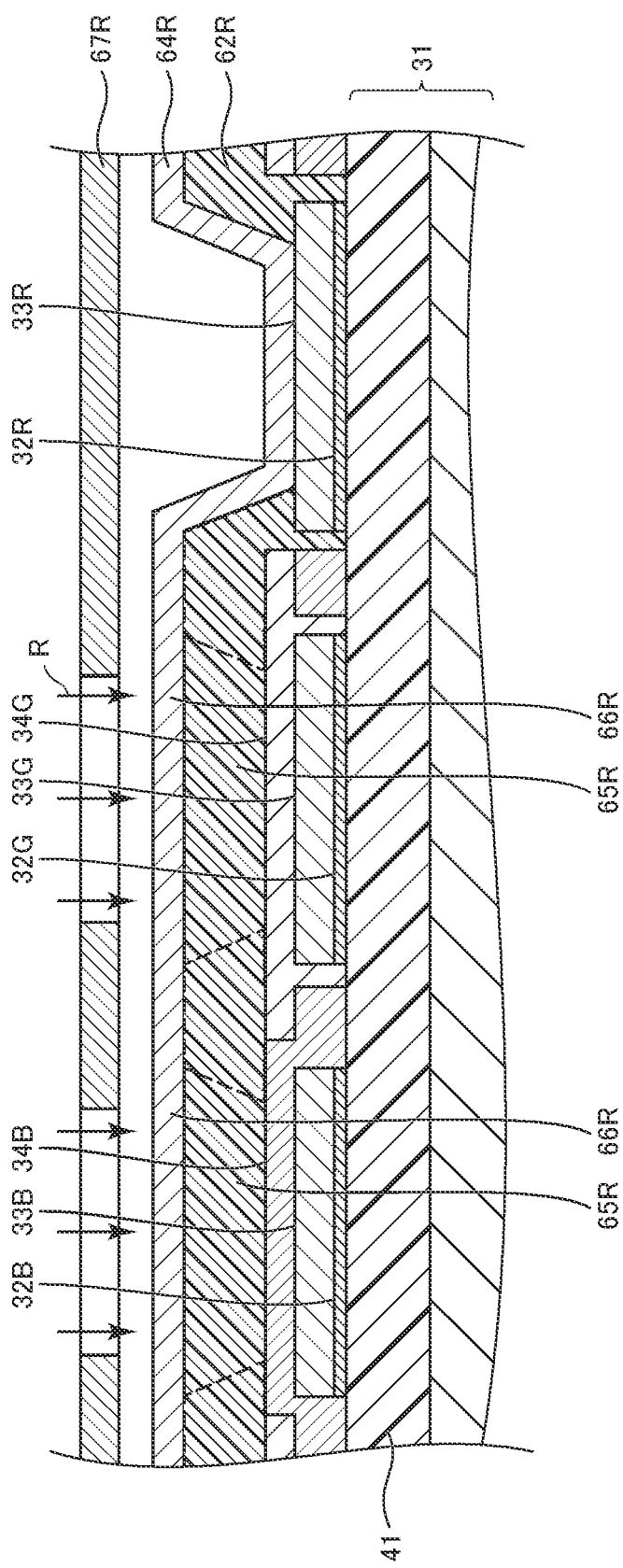
FIG. 19C is a schematic cross-sectional view of an intermediate article for the display device in accordance with Embodiment 4.

In subsequent step S107, the light-emitting material layer 64R shown in FIG. 19C is formed.

Figure 19D:
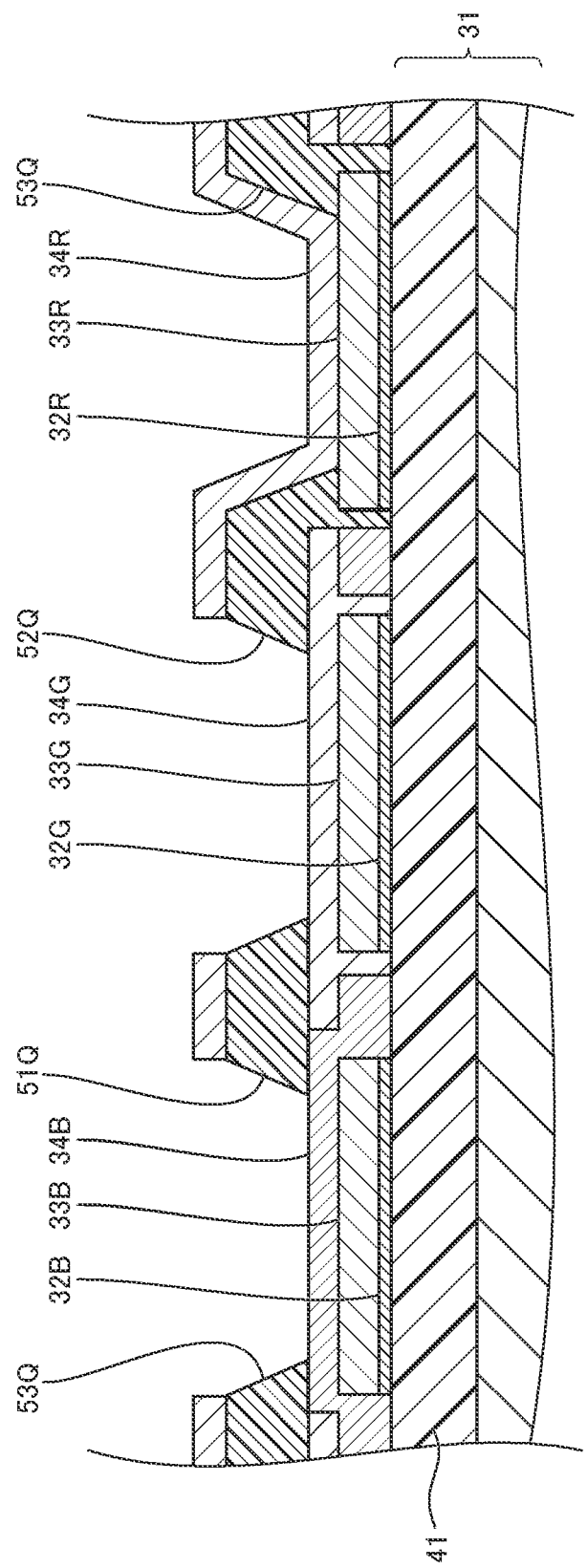
FIG. 19D is a schematic cross-sectional view of an intermediate article for the display device in accordance with Embodiment 4.

In subsequent step S108, the first lift-off portion 65R is dissolved in a development solution, and the second lift-off portion 66R is lifted off, to form the second light-emitting layer 34R shown in FIG. 19D from the light-emitting material layer 64R. The regions irradiated with the exposure light R are regions other than the region where the second pixel electrode 32R is disposed, the region between the first pixel electrode 32B and the first pixel electrode 32G, the region between the first pixel electrode 32G and the second pixel electrode 32R, and the region between the first pixel electrode 32B and the second pixel electrode 32R.

In step S108, when the first lift-off portion 65R is dissolved in a development solution, and the second lift-off portion 66R is lifted off, the entire perimeter of the first light-emitting layer 34B is covered with the first light-emitting layer 34G, and the first light-emitting layer 34B and the first light-emitting layer 34B are continuous. Therefore, the first light-emitting layers 34B and 34G are unlikely to detach.

FIG. 7 is also a flow chart representing a flow of the lift-off formation of the first light-emitting layer 34B in the display device 4 in accordance with Embodiment 4. FIGS. 20A to 20D are schematic cross-sectional views of an intermediate article for the display device 4 in accordance with Embodiment 4.

In step S121, the photosensitive resin layer 61B shown in FIG. 20A is formed.

Figure 20B:
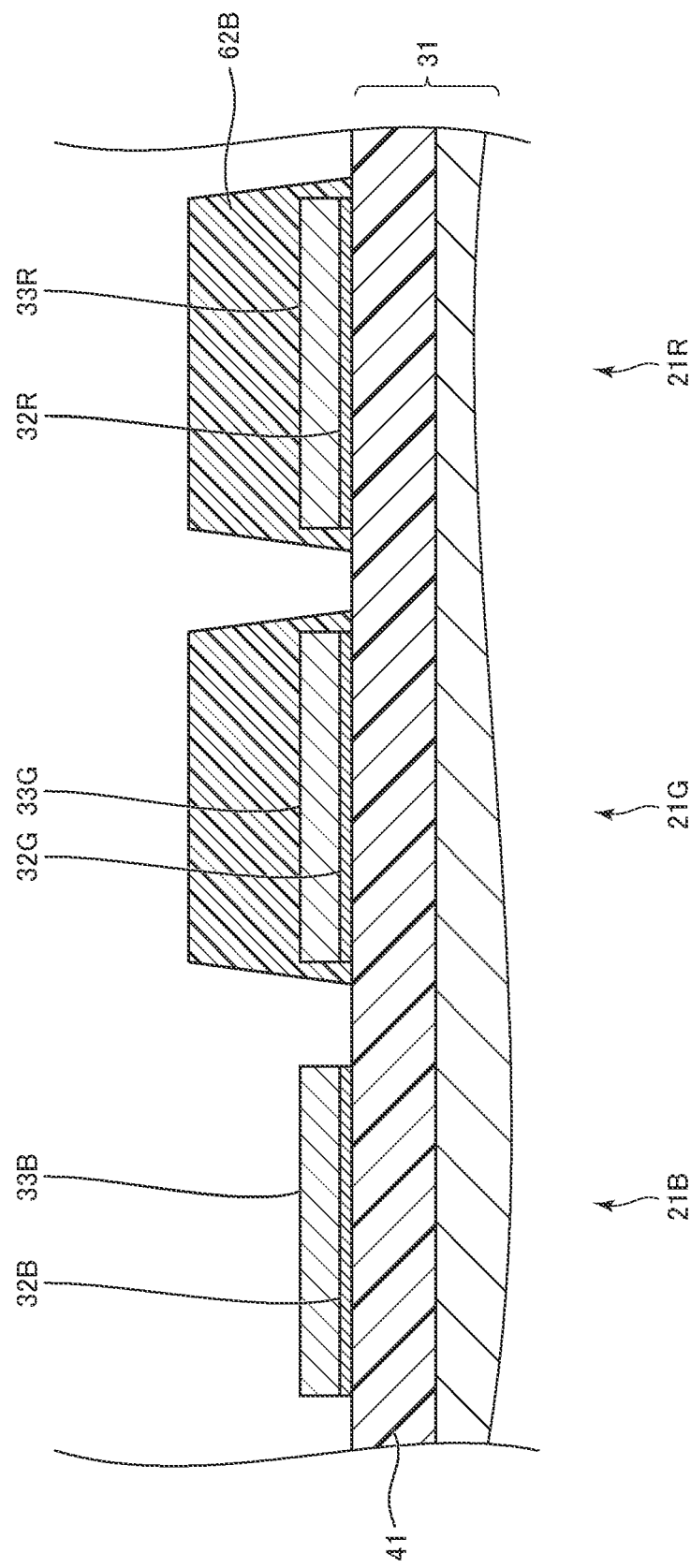
FIG. 20B is a schematic cross-sectional view of an intermediate article for the display device in accordance with Embodiment 4.

In subsequent step S122, the photosensitive resin layer 61B is patterned to form the photosensitive resin pattern 62B shown in FIG. 20B. In Embodiment 4, an opening between the subpixel 21G and the subpixel 21R is formed in the photosensitive resin pattern 62B.

Figure 20C:
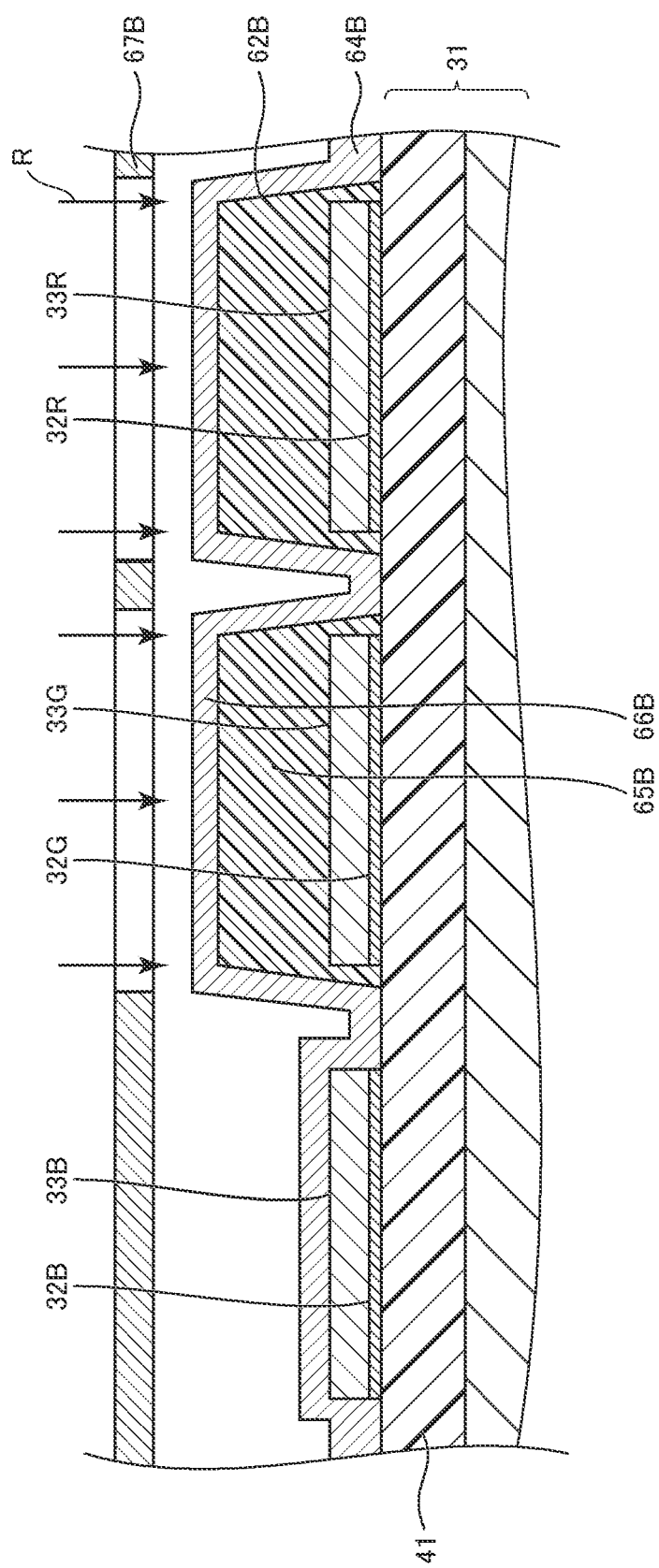
FIG. 20C is a schematic cross-sectional view of an intermediate article for the display device in accordance with Embodiment 4.

In subsequent step S123, the light-emitting material layer 64B shown in FIG. 20C is formed.

Figure 20D:
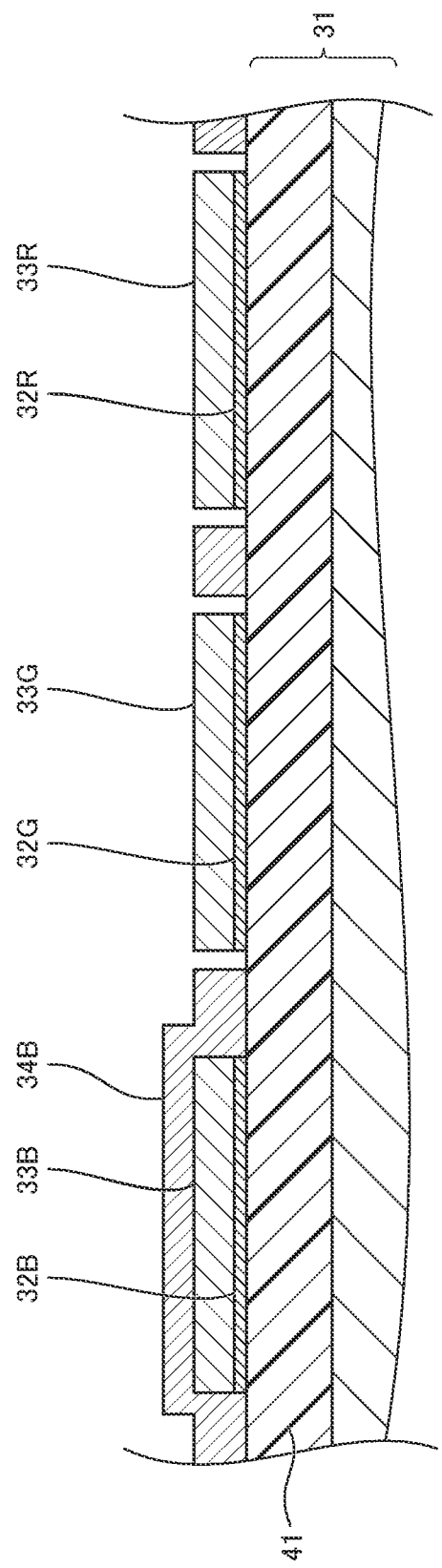
FIG. 20D is a schematic cross-sectional view of an intermediate article for the display device in accordance with Embodiment 4.

In subsequent step S124, the first lift-off portion 65B is dissolved in a development solution, and the second lift-off portion 66B is lifted off, to form the first light-emitting layer 34B shown in FIG. 20D from the light-emitting material layer 64B. In step S124, the regions irradiated with the exposure light R are regions other than the region where the first pixel electrode 32B is disposed.

FIG. 7 is also a flow chart representing a flow of the lift-off formation of the first light-emitting layer 34G in the display device 4 in accordance with Embodiment 4. FIGS. 21A to 21D are schematic cross-sectional views of an intermediate article for the display device 4 in accordance with Embodiment 4.

Figure 21A:
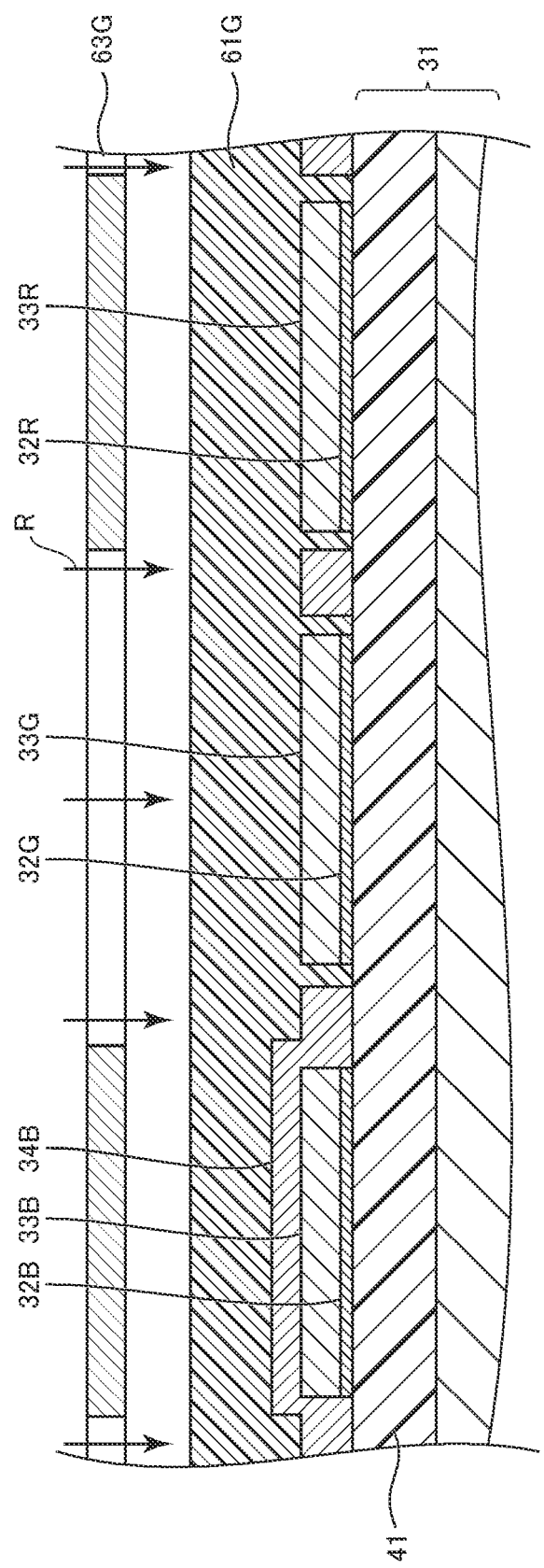
FIG. 21A is a schematic cross-sectional view of an intermediate article for the display device in accordance with Embodiment 4.

In step S121, the photosensitive resin layer 61G shown in FIG. 21A is formed.

Figure 21B:
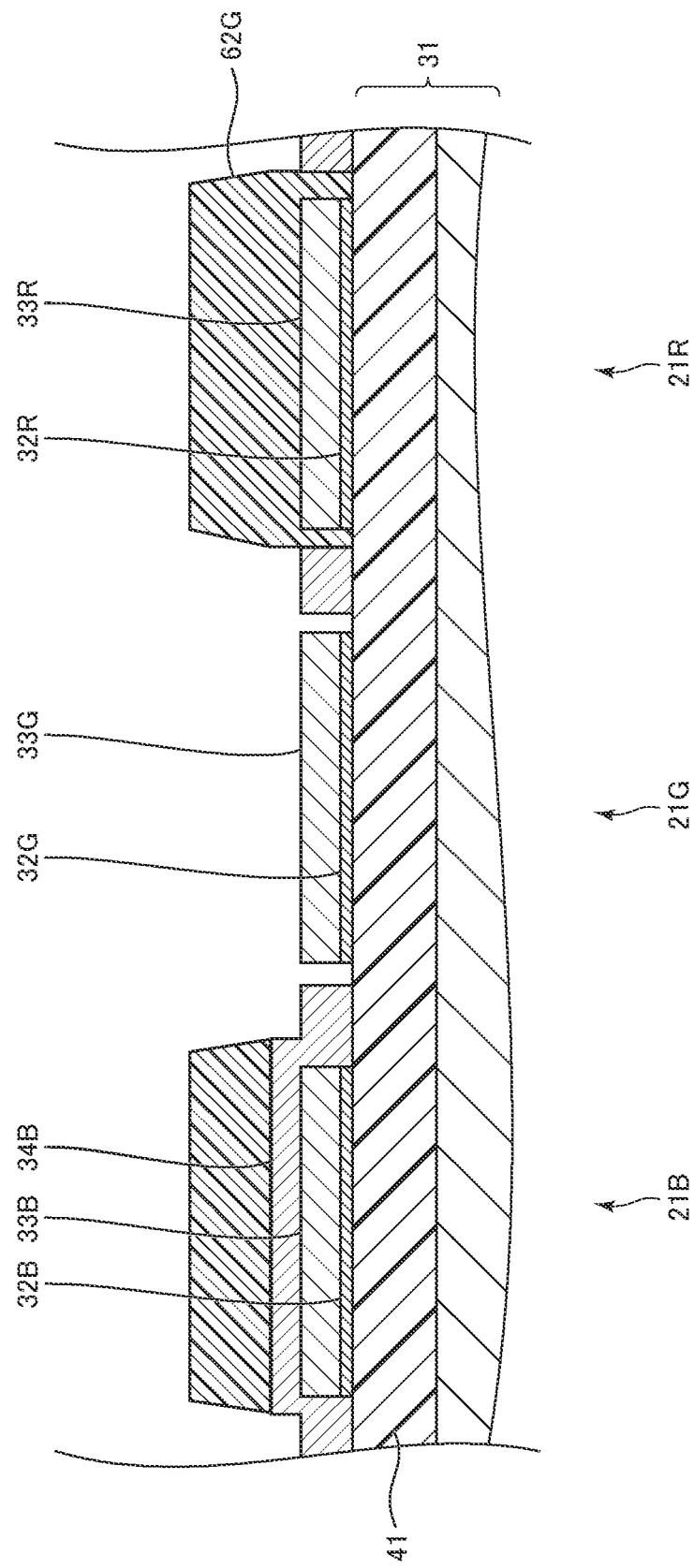
FIG. 21B is a schematic cross-sectional view of an intermediate article for the display device in accordance with Embodiment 4.

In subsequent step S122, the photosensitive resin layer 61G is patterned to form the photosensitive resin pattern 62G shown in FIG. 21B. In Embodiment 4, an opening between the subpixel 21B and the subpixel 21R is formed in the photosensitive resin pattern 62G.

Figure 21C:
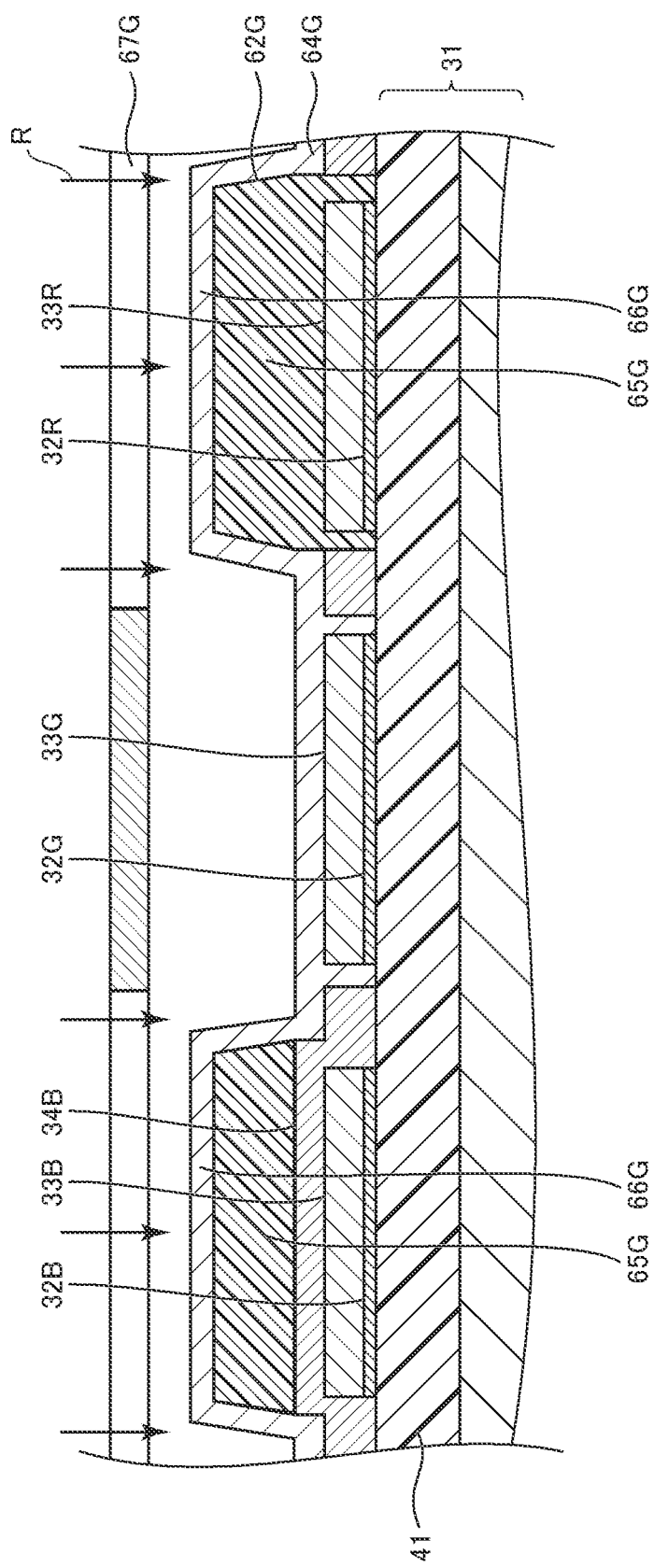
FIG. 21C is a schematic cross-sectional view of an intermediate article for the display device in accordance with Embodiment 4.

In subsequent step S123, the light-emitting material layer 64G shown in FIG. 21C is formed.

Figure 21D:
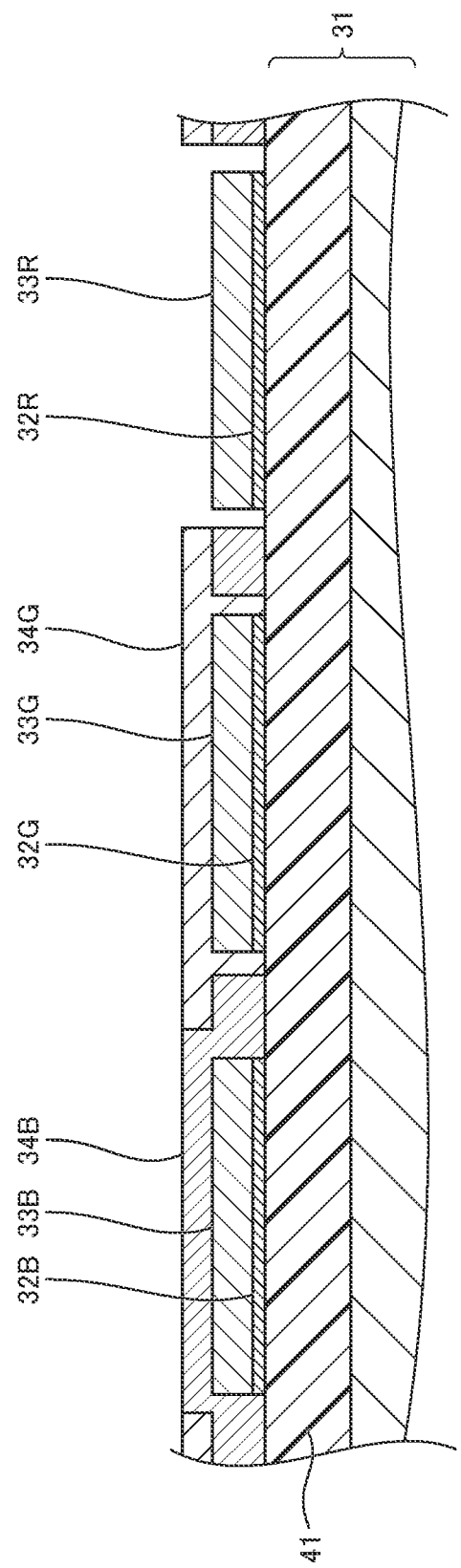
FIG. 21D is a schematic cross-sectional view of an intermediate article for the display device in accordance with Embodiment 4.

In subsequent step S124, the first lift-off portion 65G is dissolved in a development solution, and the second lift-off portion 66G is lifted off, to form the first light-emitting layer 34G shown in FIG. 21D from the light-emitting material layer 64G. The regions irradiated with the exposure light R in step S124 are regions other than the region where the first pixel electrode 32G is disposed.

Figure 22:
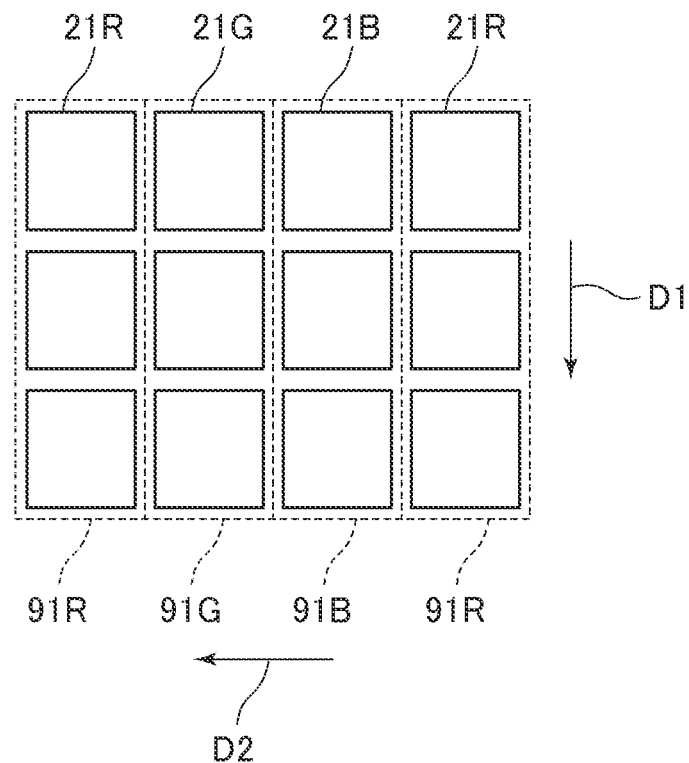
FIG. 22 is a schematic plan view of an arrangement of subpixels in the display device in accordance with Embodiment 4.
Figure 23A:
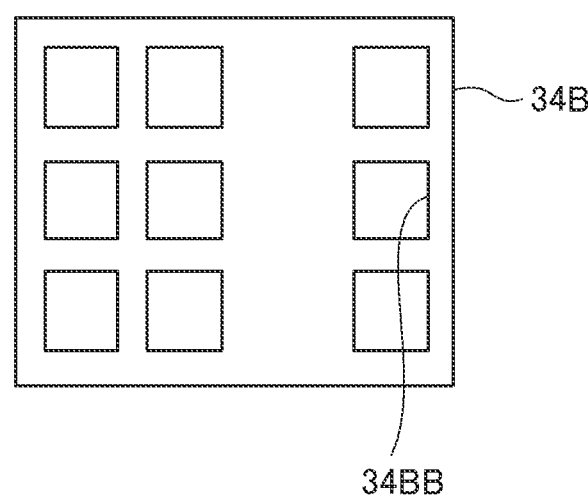
FIG. 23A is a schematic plan view of a shape of a first light-emitting layer in a plan view in the display device in accordance with Embodiment 4.
Figure 23B:
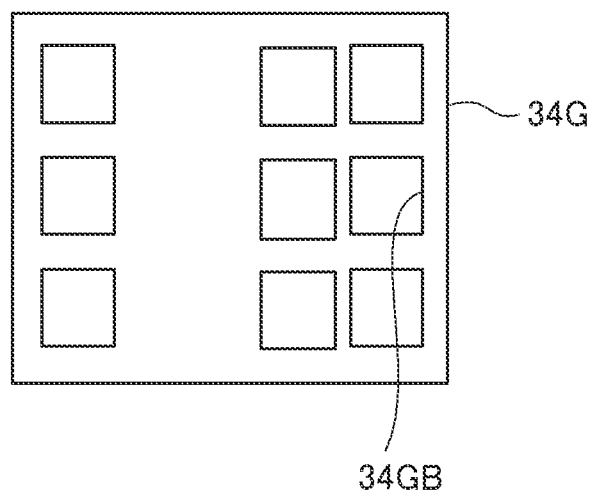
FIG. 23B is a schematic plan view of a shape of the first light-emitting layer in a plan view in the display device in accordance with Embodiment 4.
Figure 23C:
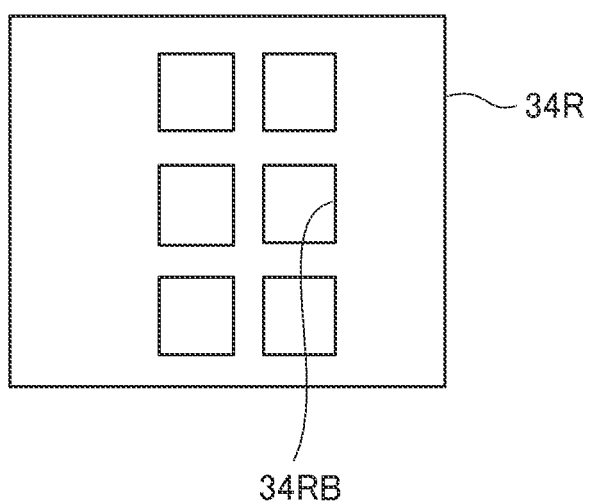
FIG. 23C is a schematic plan view of a shape of a second light-emitting layer in a plan view in the display device in accordance with Embodiment 4.

FIG. 22 is a schematic plan view of an arrangement of the subpixels 21B, 21G, and 21R in the display device 4 in accordance with Embodiment 4. FIG. 23A is a schematic plan view of a shape of the first light-emitting layer 34B in a plan view in the display device 4 in accordance with Embodiment 4. FIG. 23B is a schematic plan view of a shape of the first light-emitting layer 34G in a plan view in the display device 4 in accordance with Embodiment 4. FIG. 23C is a schematic plan view of a shape of the second light-emitting layer 34R in a plan view in the display device 4 in accordance with Embodiment 4.

In the display device 4, as shown in FIG. 22, the plurality of subpixels 21B are arranged linearly along first direction D1 to form a subpixel column 91B. In addition, the plurality of subpixels 21G are arranged linearly along first direction D1 to form a subpixel column 91G. In addition, the plurality of subpixels 21R are arranged linearly along first direction D1 to form a subpixel column 91R. The subpixel columns 91B, 91G, and 91R are arranged along second direction D2 that is perpendicular to first direction D1.

In the first light-emitting layer 34B, when the first lift-off portion 65B is dissolved in a development solution, and the second lift-off portion 66B is lifted off, both in step S124, a plurality of openings 34BB are formed. In the first light-emitting layer 34G, when the first lift-off portion 65G is dissolved in a development solution, and the second lift-off portion 66G is lifted off, both in step S124, a plurality of openings 34 GB are formed. In the second light-emitting layer 34R, when the first lift-off portion 65R is dissolved in a development solution, and the second lift-off portion 66R is lifted off, both in step S108, a plurality of openings 34RB are formed.

The plurality of openings 34BB are formed in a range where the first pixel electrode 32G and the second pixel electrode 32R are disposed. Therefore, the first light-emitting layer 34B does not cover the first pixel electrode 32G and the second pixel electrode 32R. The plurality of openings 34 GB are formed in a range where the first pixel electrode 32B and the second pixel electrode 32R are disposed. Therefore, the first light-emitting layer 34G does not cover the first pixel electrode 32B and the second pixel electrode 32R. The plurality of openings 34RB are formed in a range where the first pixel electrodes 32B and 32G are disposed. Therefore, the first light-emitting layer 34B does not cover the first pixel electrodes 32B and 32G.

Each opening 34BB is isolated. Therefore, the first lift-off portion 65B, which is dissolved in a development solution to form the openings 34BB, is also isolated. Therefore, it is easy to dissolve the first lift-off portion 65B in a development solution. Each opening 34 GB is isolated. Therefore, the first lift-off portion 65G, which is dissolved in a development solution to form the openings 34 GB, is also isolated. Therefore, it is easy to dissolve the first lift-off portion 65G in a development solution. Each opening 34RB is isolated. Therefore, the first lift-off portion which is dissolved in a development solution to form the openings 34RB, is also isolated. Therefore, it is easy to dissolve the first lift-off portion 65R in a development solution.

The first light-emitting layers 34B and 34G and the second light-emitting layer 34R have no protrusions that could likely cause chipping and detachment. Therefore, the first light-emitting layers 34B and 34G and the second light-emitting layer 34R have high resistance to chipping and detachment.

The first light-emitting layers 34B and 34G and the second light-emitting layer 34R are planar continuous patterns. Hence, the first light-emitting layers 34B and 34G and the second light-emitting layer 34R can have an increased contact area with the charge transport layer 35, which renders the charge transport layer 35 less likely to detach.

When the light-emitting layer has an insular isolated pattern that appears rectangular in a plan view, the light-emitting layer has each corner thereof subjected to a fabrication process throughout the external angle of 270° thereof. Therefore, in, for example, a rectangular isolated pattern with a corner in a plan view, each corner forms a protrusion with an internal angle smaller than 180°, and detachment may occur at the corners. However, since the first light-emitting layers 34B and 34G and the second light-emitting layer 34R are planar continuous patterns, the corners of the first light-emitting layers 34B and 34G and the second light-emitting layer 34R are subjected to a fabrication process throughout the internal angle of no more than 90°. Therefore, the first light-emitting layers 34B and 34G and the second light-emitting layer 34R have no protrusions and unlikely to detach at the corners.

Embodiment 5

The following will focus on differences of Embodiment 5 from Embodiment 1. Embodiment 5 employs the same structure as Embodiment 1 unless specifically mentioned otherwise.

Figure 24:
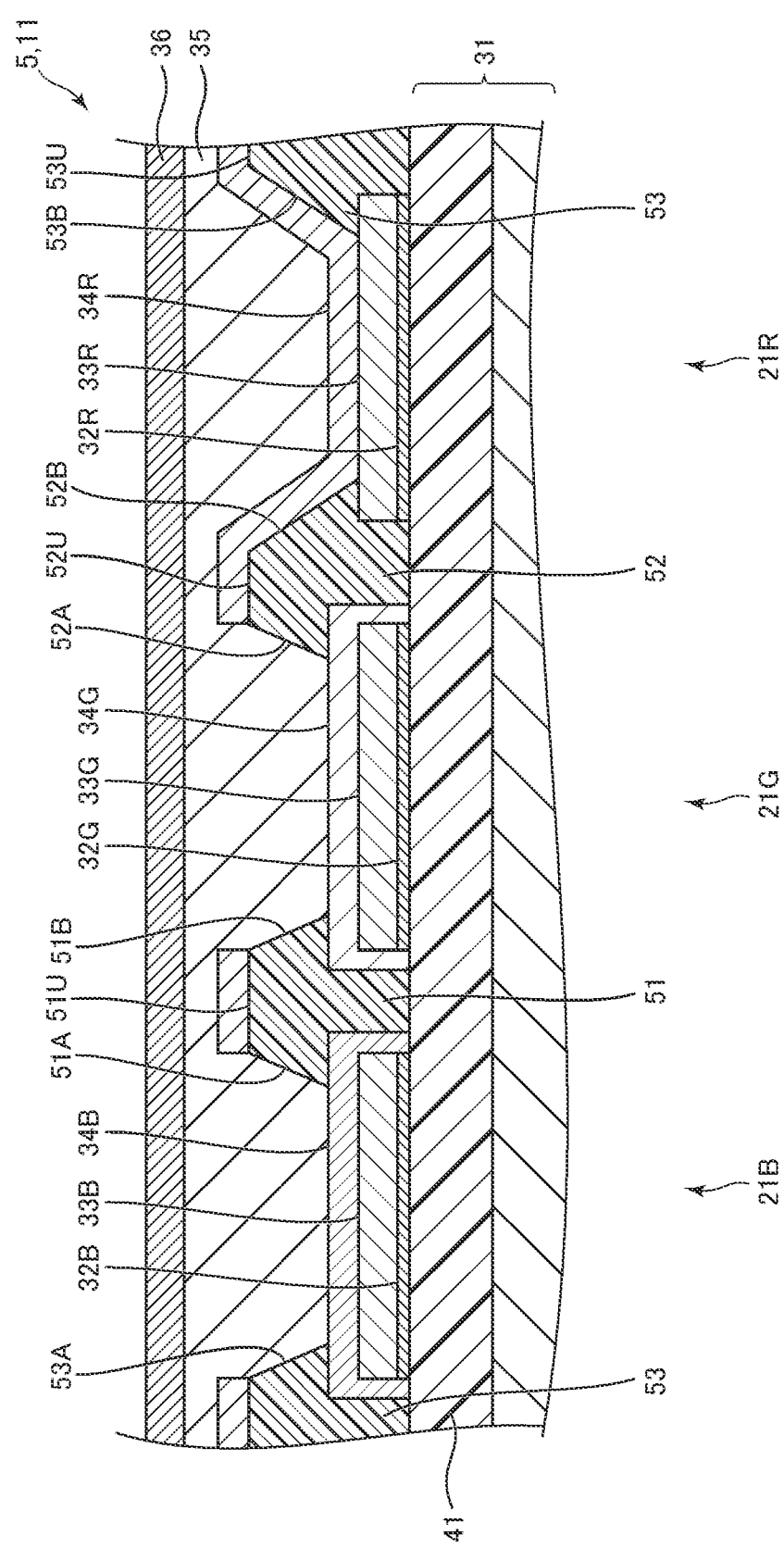
FIG. 24 is a schematic cross-sectional view of each pixel in the display device in accordance with Embodiment 5.

FIG. 24 is a schematic cross-sectional view of each pixel 11 in a display device 5 in accordance with Embodiment 5.

The structural member 51 has a top face 51U including a first inclined face 51A and a second inclined face 51B. The first inclined face 51A is disposed closer to the first pixel electrode 32B and has a first inclination. The second inclined face 51B is disposed closer to the first pixel electrode 32G and has the first inclination.

The structural member 52 has a top face 52U including a first inclined face 52A and a second inclined face 52B. The first inclined face 52A is disposed closer to the first pixel electrode 32G and has the first inclination. The second inclined face 52B is disposed closer to the second pixel electrode 32R and has a second inclination.

The structural member 53 has a top face 53U including a first inclined face 53A and a second inclined face 53B. The first inclined face 53A is disposed closer to the first pixel electrode 32B and has the first inclination. The second inclined face 53B is disposed closer to the second pixel electrode 32R and has the second inclination.

The second inclination is smaller than the first inclination.

The second light-emitting layer 34R has the perimeter thereof on the second inclined faces 52B and 53B that have the smaller, second inclination. Hence, the second light-emitting layer 34R can be formed so that the thickness of the second light-emitting layer 34R can be maintained uniformly to the edges of the structural members 52 and 53.

The openings in the photosensitive resin pattern of the subpixel 21B is sandwiched by the first inclined face 51A and the first inclined face 53A both of which have the larger, first inclination. Hence, the opening in the subpixel 21B can be increased in area, and the aperture ratio of the subpixel 21B can be increased, while the heights of the structural members 51 and 53 can be maintained so as to maintain electrical insulation along the perimeter of the subpixel 21B. The first inclination is, for example, from 20 to 30°. Hence, the range where the first inclined face 51A and the first inclined face 53A are present can be reduced to increase the aperture ratio of the subpixel 21B, while the heights of the structural members 51 and 53 can be maintained at 100 nm or greater so as to secure the electrical insulation of the structural members 51 and 53.

The opening in the subpixel 21G is sandwiched by the second inclined face 51B and the first inclined face 52A both of which have the larger, first inclination. Hence, the opening in the subpixel 21G can be increased in area, and the aperture ratio of the subpixel 21G can be increased, while the heights of the structural members 51 and 52 can be maintained so as to maintain electrical insulation along the perimeter of the subpixel 21G. The first inclination is, for example, from 20 to 40°. Hence, the range where the second inclined face 51B and the first inclined face 52A are present can be reduced to increase the aperture ratio of the subpixel 21G, while the heights of the structural members 51 and 52 can be maintained at 100 nm or greater so as to secure the electrical insulation of the structural members 51 and 52.

FIG. 4 is also a flow chart representing a flow of the manufacture of the display device in accordance with Embodiment 5. FIGS. 25A to 25D are schematic cross-sectional views of an intermediate article for the display device 5 in accordance with Embodiment 5.

In steps S101 to S105, similarly to Embodiment 1, the substrate 31 shown in FIG. 25A is prepared, and the first pixel electrodes 32B and 32G, the second pixel electrode 32R, the second charge transport layers 33B, 33G, and 33R, the first light-emitting layers 34B and 34G, and the photosensitive resin layer 61R shown in FIG. 25A are formed.

Figure 25B:
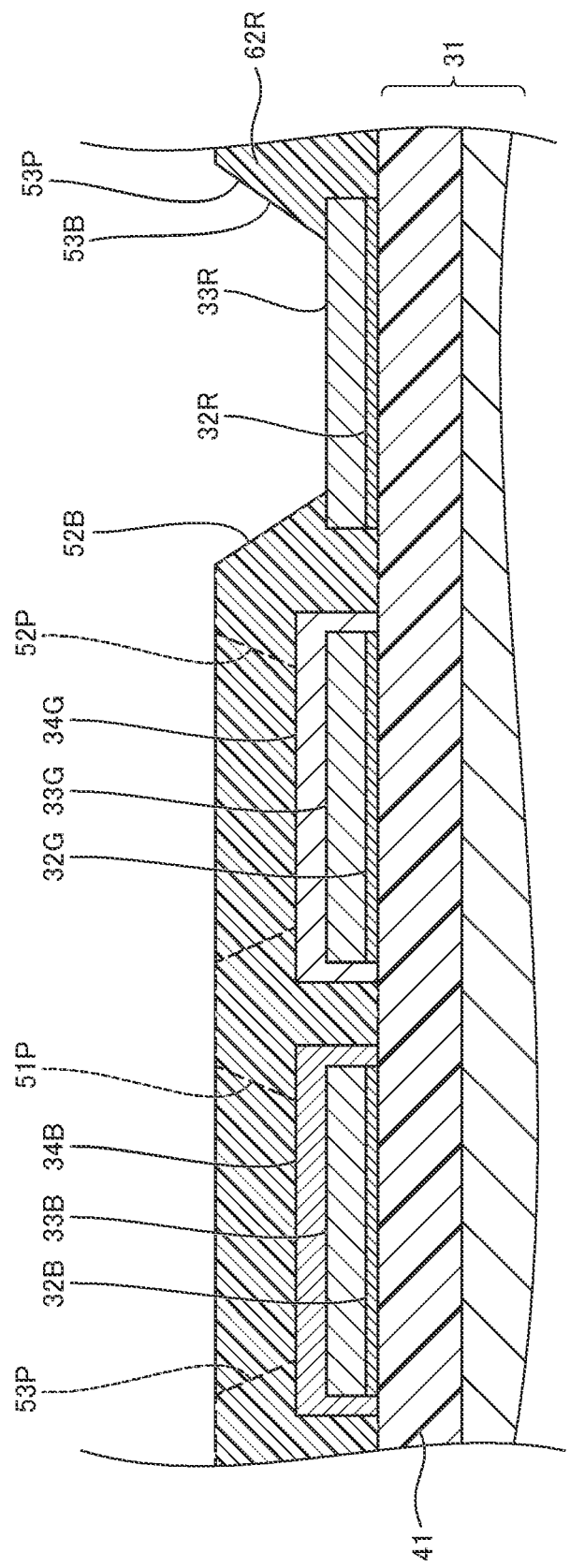
FIG. 25B is a schematic cross-sectional view of an intermediate article for the display device in accordance with Embodiment 5.

In subsequent step S106, the photosensitive resin layer 61R is patterned by development to form the photosensitive resin pattern 62R shown in FIG. 25B. In doing so, the exposure light R that has low parallelity and that has diffusibility is projected to the photosensitive resin layer 61R to form an opening sandwiched between the second inclined face 52B and the second inclined face 53B that have the smaller, second inclination. When the exposure light R that has low parallelity and that has diffusibility is projected to the photosensitive resin layer 61R, part of the exposure light R reaches a light-blocking section surrounding the opening of a light-exposure mask so that the photosensitive resin layer 61R, which is below the light-blocking section surrounding the opening of the light-exposure mask, is also slightly exposed to light, thereby forming the second inclined face 52B and the second inclined face 53B that have the smaller, second inclination. Exposure dose for the photosensitive resin layer 61R may be larger than a typical exposure dose. When the exposure dose is increased, part of the exposure light R reaches a light-blocking section surrounding the opening of a light-exposure mask so that the photosensitive resin layer 61R, which is below the light-blocking section surrounding the opening of the light-exposure mask, is also slightly exposed to light, thereby forming the second inclined face 52B and the second inclined face 53B that have the smaller, second inclination. The second inclination is, for example, 5 to 30°.

Figure 25C:
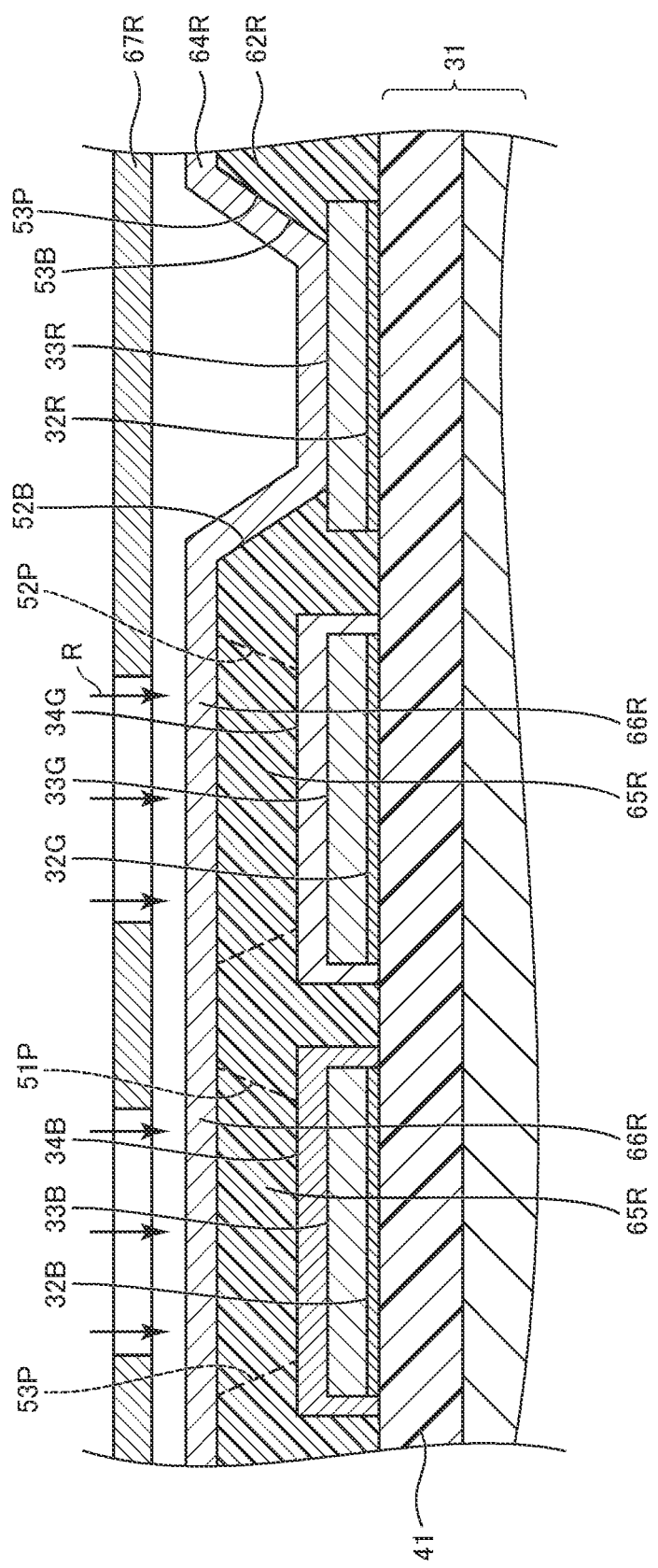
FIG. 25C is a schematic cross-sectional view of an intermediate article for the display device in accordance with Embodiment 5.

In subsequent step S107, the light-emitting material layer 64R shown in FIG. 25C is formed. The light-emitting material layer 64R is formed on the second charge transport layer 33R and on the second inclined faces 52B and 53B that have the smaller, second inclination. When the structural member portion has an inclined face with a large inclination, the light-emitting material applied onto the inclined face flows into the light-emission region, rendering it more likely to form a light-emitting material layer with a non-uniform thickness in the light-emission region. Meanwhile, when the light-emitting material is applied onto the second inclined faces 52B and 53B that have the smaller, second inclination, the light-emitting material is less likely to flow into the light-emission region, so that the thickness of the light-emitting material layer 64R can be maintained uniformly to the edges of the structural member portions 52P and 53P. In other words, non-uniformity in thickness of the light-emitting material layer 64R can be restrained near the structural member portions 52P and 53P.

Figure 25D:
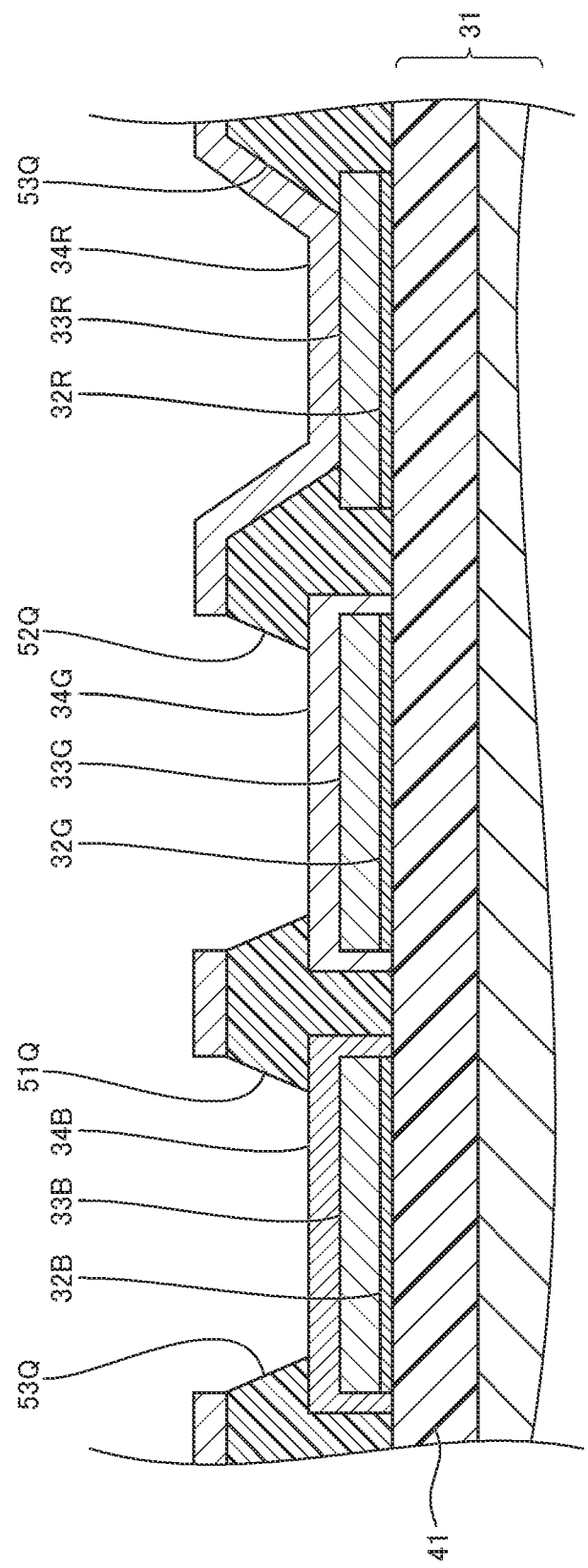
FIG. 25D is a schematic cross-sectional view of an intermediate article for the display device in accordance with Embodiment 5.

In subsequent step S108, the first lift-off portion 65R and the second lift-off portion 66R are lifted off by development to form the second light-emitting layer 34R shown in FIG. 25D from the light-emitting material layer 64R. In doing so, the exposure light R that has high parallelity is projected to the photosensitive resin pattern 62R. The regions irradiated with the exposure light R are regions other than the region where the second pixel electrode 32R is disposed, the region between the first pixel electrode 32B and the first pixel electrode 32G, the region between the first pixel electrode 32G and the second pixel electrode 32R, and the region between the second pixel electrode 32R and the first pixel electrode 32B.

In subsequent steps S109 to S111, similarly to Embodiment 1, the structural members 51Q, 52Q, and 53Q are hard-baked, and the first charge transport layer 35 and the opposite electrode 36 shown in FIG. 24 are formed.

Figure 26A:
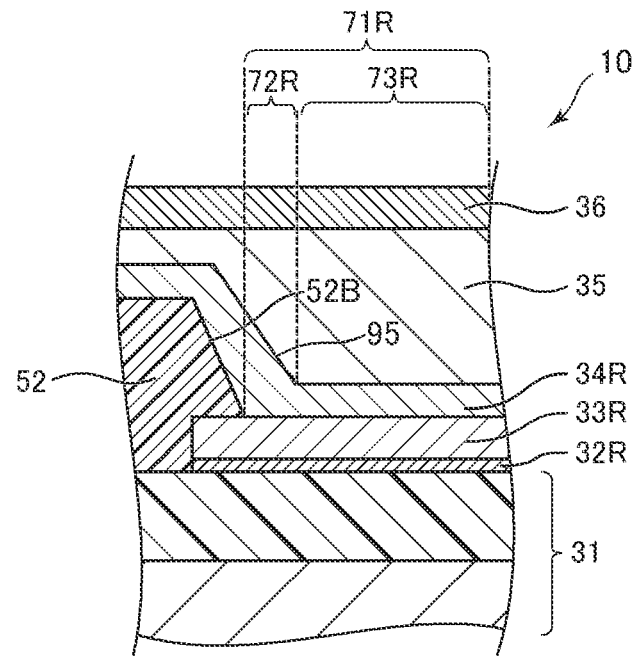
FIG. 26A is a schematic enlarged cross-sectional view of a vicinity of the perimeter of a second pixel electrode in a display device in accordance with a reference example.
Figure 26B:
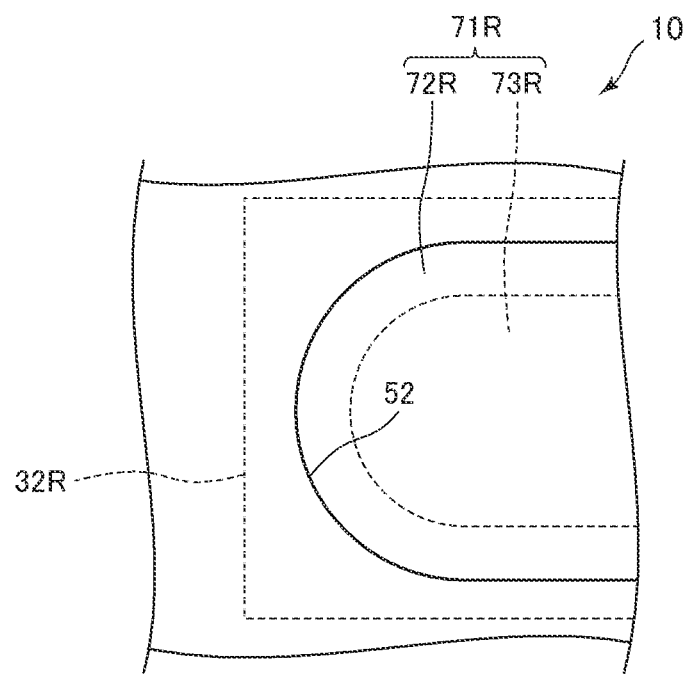
FIG. 26B is a schematic enlarged plan view of a vicinity of the perimeter of the second pixel electrode in the display device in accordance with the reference example.
Figure 27A:
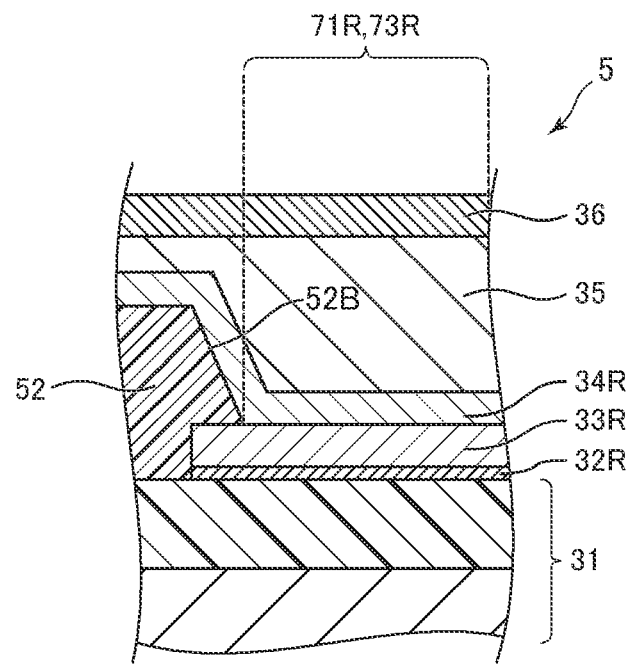
FIG. 27A is a schematic enlarged cross-sectional view of a vicinity of the perimeter of the second pixel electrode in the display device in accordance with Embodiment 5.
Figure 27B:
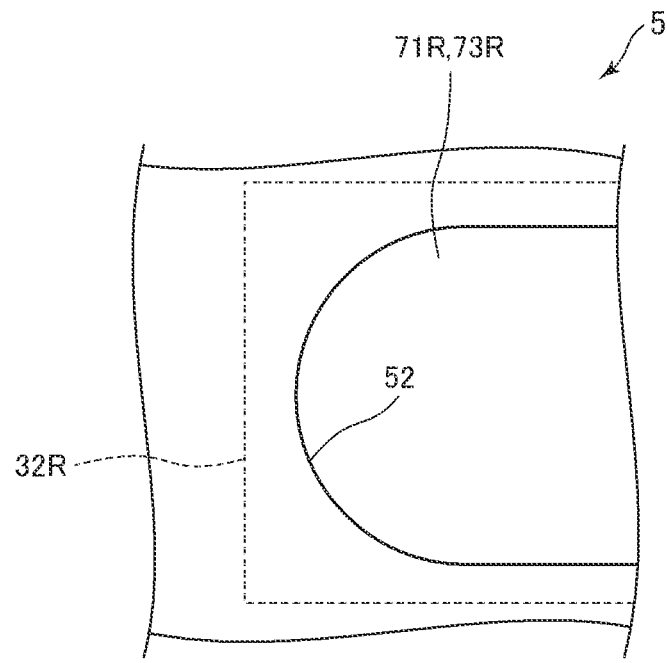
FIG. 27B is a schematic enlarged plan view of a vicinity of the perimeter of the second pixel electrode in the display device in accordance with Embodiment 5.

FIG. 26A is a schematic enlarged cross-sectional view of a vicinity of the perimeter of the second pixel electrode 32R in a display device 10 in accordance with a reference example. FIG. 26B is a schematic enlarged plan view of a vicinity of the perimeter of the second pixel electrode 32R in the display device 10 in accordance with the reference example. FIG. 27A is a schematic enlarged cross-sectional view of a vicinity of the perimeter of the second pixel electrode 32R in the display device 5 in accordance with Embodiment 5. FIG. 27B is a schematic enlarged plan view of a vicinity of the perimeter of the second pixel electrode 32R in the display device 5 in accordance with Embodiment 5.

In the display device 10 in accordance with the reference example shown in FIGS. 26A and 26B, the second inclined face 52B makes a steep inclined face. Therefore, a pool of solution that extends along the structural member 52 is formed on the second light-emitting layer 34R. In the display device 10, a light-emission region 71R where the red light emitted by the second light-emitting layer 34R is visually recognizable is formed inside the structural member 52. The light-emission region 71R includes: a non-uniform-thickness region 72R that extends along the structural member 52; and a uniform-thickness region 73R inside the non-uniform-thickness region 72R. In the non-uniform-thickness region 72R, the light-emitting layer 34R, affected by the formation of the pool of solution 95 on the second light-emitting layer 34R, has a non-uniform thickness. Therefore, the non-uniform-thickness region 72R is a defective-light-emission region. In the uniform-thickness region 73R, the light-emitting layer 34R has a uniform thickness. Therefore, the uniform-thickness region 73R is a uniform-light-emission region.

In the display device 5 in accordance with Embodiment 5 shown in FIGS. 27A and 27B, the second inclined face 52B makes a gentle inclined face. Therefore, the pool of solution 95 that extends along the structural member 52 on the second light-emitting layer 34R can reduce the area and thickness of an increased-thickness region of the second light-emitting layer 34R. The "pool of solution 95" here refers to a region near the base of the structural member 52 where the second light-emitting layer 34R has an increased thickness. In the display device 5, the light-emission region 71R where the red light emitted by the second light-emitting layer 34R is visually recognizable is formed inside the structural member 52. The light-emission region 71R includes the uniform-thickness region 73R. In the uniform-thickness region 73R, the light-emitting layer 34R has a uniform thickness. Therefore, the uniform-thickness region 73R is a uniform-light-emission region.

As shown in FIGS. 26A, 26B, 27A, and 27B, the uniform-thickness region (uniform-light-emission region) 73R is larger in the display device 5 than in the display device 10.

Therefore, the red light emitted by the subpixel 21R is more intense and less non-uniform in the display device 5 than in the display device 10.

6 Arrangement of Subpixels

FIGS. 28A to 28D are schematic plan views of other exemplary feasible arrangements of the subpixels 21B, 21G, and 21R in accordance with Embodiments 1 to 5.

Figure 28A:
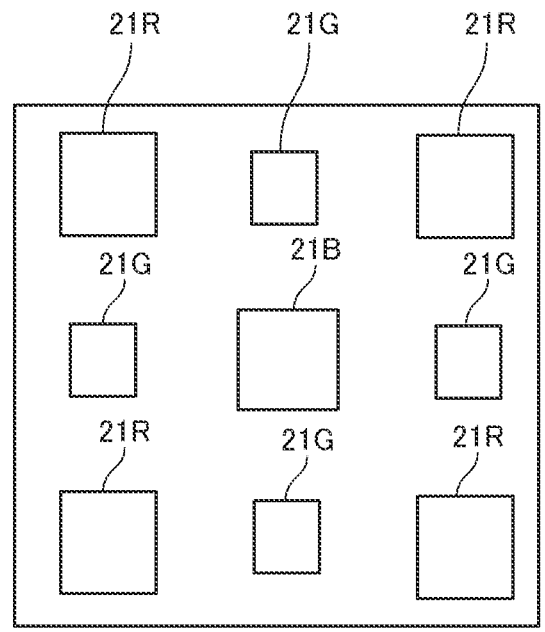
FIG. 28A is a schematic plan view of another exemplary feasible arrangement of subpixels in accordance with Embodiments 1 to 5.

In the arrangement shown in FIG. 28A, the subpixels are arranged in a 3-row by 3-column matrix. The subpixels 21R, 21G, and 21R are arranged in the described order in the first and third columns. The subpixels 21G, 21B, and 21G are arranged in the described order in the second row.

Figure 28B:
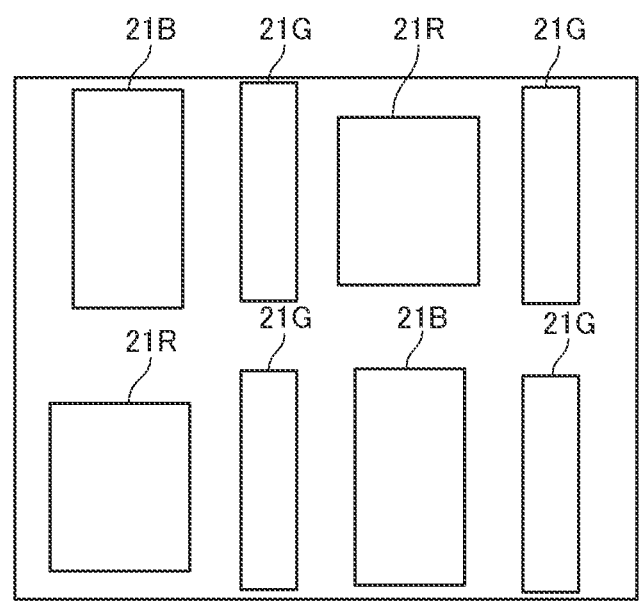
FIG. 28B is a schematic plan view of another exemplary feasible arrangement of subpixels in accordance with Embodiments 1 to 5.

In the arrangement shown in FIG. 28B, the subpixels are arranged in a 2-row by 4-column matrix. The subpixels 21B, 21G, 21R, and 21G are arranged in the described order in the first row. The subpixels 21R, 21G, 21B, and 21G are arranged in the described order in the second row.

Figure 28C:
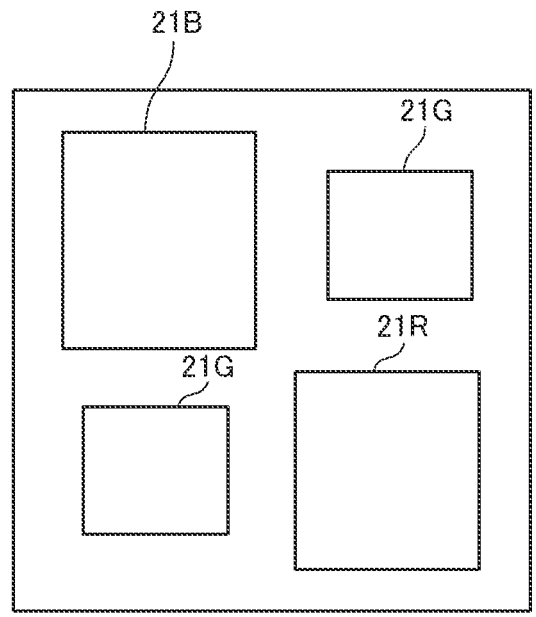
FIG. 28C is a schematic plan view of another exemplary feasible arrangement of subpixels in accordance with Embodiments 1 to 5.

In the arrangement shown in FIG. 28C, the subpixels are arranged in a 2-row by 2-column matrix. The subpixels 21B and 21G are arranged in the described order in the first column. The subpixel 21G and 21R are arranged in the described order in the second row.

Figure 28D:
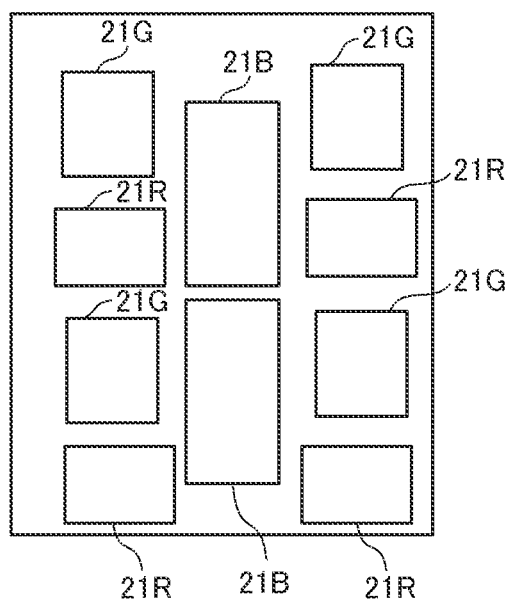
FIG. 28D is a schematic plan view of another exemplary feasible arrangement of subpixels in accordance with Embodiments 1 to 5.

In the arrangement shown in FIG. 28D, the subpixels are arranged in three columns. The subpixels 21G, 21R, 21G, and 21R are arranged in the described order in the first and third columns. The subpixels 21B and 21B are arranged in the described order in the second column.

The present disclosure is not limited to the description of the embodiments and examples above. Any structure detailed in the embodiments and examples may be replaced by a practically identical structure, a structure that achieves the same effect and function, or a structure that achieves the same purpose.

The invention claimed is:

1. A method of manufacturing a display device, the method comprising:
   a) a step of forming a first pixel electrode and a second pixel electrode;
   b) a step of forming a first light-emitting layer on the first pixel electrode;
   c) a step of forming a photosensitive resin layer on the second pixel electrode and on the first light-emitting layer;
   d) a step of forming a photosensitive resin pattern by patterning the photosensitive resin layer, the photosensitive resin pattern having an opening on the second pixel electrode and including a structural member portion that is to be a structural member including either one or both of an edge cover segment on a perimeter of the first light-emitting layer and a pixel boundary segment between the first pixel electrode and the second pixel electrode;
   e) a step of forming a light-emitting material layer on the photosensitive resin pattern and on an opening bottom portion that is at least a part of the second pixel electrode and that is provided below the opening; and
   f) a step of forming a second light-emitting layer on the second pixel electrode from the light-emitting material layer by dissolving, in a development solution, a first lift-off portion that is a part of the photosensitive resin pattern and that is provided on the first light-emitting layer, and lifting off a second lift-off portion that is a part of the light-emitting material layer and that is provided on the first lift-off portion, with the structural member being left intact.

2. The method according to claim 1, wherein step e) forms the light-emitting material layer in such a manner that the light-emitting material layer covers the entire opening bottom portion and the entire photosensitive resin pattern.

3. The method according to claim 1, wherein the structural member includes the edge cover segment.

4. The method according to claim 1, wherein step f) lifts off the first lift-off portion and the second lift-off portion in such a manner that the structural member remains as an edge cover on a perimeter of the second pixel electrode.

5. The method according to claim 1 further comprising g) a step of forming a charge transport layer on the second pixel electrode, wherein step f) lifts off the first lift-off portion and the second lift-off portion in such a manner that the structural member remains as an edge cover on a perimeter of the charge transport layer.

6. The method according to claim 1, wherein step b) forms the first light-emitting layer in such a manner that the first light-emitting layer covers the entire first pixel electrode.

7. The method according to claim 1, wherein the photosensitive resin layer contains a positive photosensitive resin.

8. The method according to claim 1, wherein the first light-emitting layer contains first quantum dots, and the second light-emitting layer contains second quantum dots.

9. The method according to claim 8, wherein the first quantum dots have a larger particle diameter than do the second quantum dots.

10. The method according to claim 1, further comprising h) a step of forming an opposite electrode opposite the first pixel electrode across the first light-emitting layer and opposite the second pixel electrode across the second light-emitting layer.

11. A display device comprising:
a substrate having a main face;
a first pixel electrode on the main face;
a second pixel electrode adjacent to the first pixel electrode on the main face;
a first light-emitting layer on an opposite side of the first pixel electrode from a side on which the main face is disposed;
a second light-emitting layer on an opposite side of the second pixel electrode from a side on which the main face is disposed; and
a structural member provided across on a perimeter of the first light-emitting layer and outside the perimeter of the first light-emitting layer, the structural member including a first edge cover segment on a side of a perimeter of the second light-emitting layer on which the main face is disposed.

12. The display device according to claim 11, wherein the structural member includes a second edge cover segment on a perimeter of the second pixel electrode.

13. The display device according to claim 11, further comprising a charge transport layer on the second pixel electrode, wherein the structural member further includes a third edge cover segment on a perimeter of the charge transport layer.

14. The display device according claim 11, wherein the structural member is made of a cured positive photosensitive resin.

15. The display device according to claim 11, further comprising another structural member on a side of the structural member on which the main face is disposed, the other structural member being provided across on a perimeter of the first pixel electrode, between the first pixel electrode and the second pixel electrode, and on a perimeter of the second pixel electrode.

16. The display device according to claim 11, wherein the first light-emitting layer contains first quantum dots, and the second light-emitting layer contains second quantum dots.

17. The display device according to claim 16, wherein the first quantum dots have a larger particle diameter than do the second quantum dots.

18. The display device according to claim 16, wherein the first quantum dots have a shorter fluorescence life than do the second quantum dots.

19. The display device according to claim 16, wherein the first quantum dots have a green emission wavelength.

20. The display device according to claim 16, wherein the first quantum dots have a green emission wavelength, and the second quantum dots have a red or blue emission wavelength.

* * * * *